United States Patent
Koga et al.

(10) Patent No.: US 7,209,355 B2
(45) Date of Patent: Apr. 24, 2007

(54) COOLING DEVICE AND AN ELECTRONIC APPARATUS INCLUDING THE SAME

(75) Inventors: Shinya Koga, Fukuoka (JP); Toshihiko Matsuda, Fukuoka (JP); Kyo Niwatsukino, Fukuoka (JP); Toshisuke Sakai, Fukuoka (JP); Toshiyuki Kubota, Fukuoka (JP); Masashi Hirose, Fukuoka (JP); Shigeru Narakino, Fukuoka (JP); Yoshimitsu Aizono, Fukuoka (JP); Kazuyuki Kasahara, Kanagawa (JP)

(73) Assignee: Matsushita Electric Industrial Co., Ltd., Okasa (JP)

( * ) Notice: Subject to any disclaimer, the term of this patent is extended or adjusted under 35 U.S.C. 154(b) by 271 days.

(21) Appl. No.: 10/976,324

(22) Filed: Oct. 29, 2004

(65) Prior Publication Data

US 2005/0117298 A1 Jun. 2, 2005

Related U.S. Application Data

(63) Continuation-in-part of application No. 10/446,152, filed on May 28, 2003, now Pat. No. 6,839,234, which is a continuation-in-part of application No. 10/264,265, filed on Oct. 4, 2002, now abandoned.

(30) Foreign Application Priority Data

May 15, 2002 (JP) ............................. 2002-139598
Jan. 15, 2003 (JP) ............................. 2003-007168

(51) Int. Cl.
*H05K 7/20* (2006.01)
*F04B 35/04* (2006.01)

(52) U.S. Cl. ..................... 361/699; 257/714; 165/80.4; 417/353

(58) Field of Classification Search ............... None
See application file for complete search history.

(56) References Cited

U.S. PATENT DOCUMENTS 4,128,364 A    12/1978   Papst et al.

(Continued)

FOREIGN PATENT DOCUMENTS

JP    61-69492    5/1986

(Continued)

*Primary Examiner*—Boris Chérvinsky
(74) *Attorney, Agent, or Firm*—McDermott Will & Emery LLP

(57) ABSTRACT

A cooling device for cooling a heat-generating component includes a circulating passage arranged to have coolant circulate therein, a centrifugal pump including a first case made of metallic material, a second case made of resin material, and an impeller accommodated in the pump chamber, and a radiator provided at the circulating passage and being operable to release heat from the coolant. The first case has a surface arranged to contact the heat-generating component. The second case forms a pump chamber between the first case and the second case. The pump chamber stores the coolant therein. The impeller includes open-type vanes arranged to pressurize the coolant as to have the coolant flow through the circulating passage. The cooling device has a high cooling efficiency as well as a high operating efficiency of the motor while having a simple construction and a small overall size and a small thickness.

10 Claims, 36 Drawing Sheets

U.S. PATENT DOCUMENTS

| | | | |
|---|---|---|---|
| 5,316,077 A | 5/1994 | Reichard | |
| 5,441,102 A | 8/1995 | Burward-Hoy | |
| 5,731,954 A * | 3/1998 | Cheon | 361/699 |
| 5,910,694 A * | 6/1999 | Yokozawa et al. | 310/89 |
| 6,019,165 A | 2/2000 | Batchelder | |
| 6,029,742 A * | 2/2000 | Burward-Hoy | 165/80.4 |
| 6,118,658 A | 9/2000 | Nakase | |
| 6,244,331 B1 | 6/2001 | Budelman | |
| 6,327,145 B1 | 12/2001 | Lian et al. | |
| 6,368,081 B1 | 4/2002 | Matsumoto | |
| 6,408,937 B1 | 6/2002 | Roy | |
| 6,457,955 B1 * | 10/2002 | Cheng | 417/423.8 |
| 6,462,441 B1 | 10/2002 | Horng et al. | |
| 6,529,376 B2 | 3/2003 | Hamman | |
| 6,619,385 B2 * | 9/2003 | Watanabe et al. | 165/121 |
| 6,668,911 B2 * | 12/2003 | Bingler | 165/80.4 |
| 2003/0188858 A1 | 10/2003 | Miyazaki et al. | |

FOREIGN PATENT DOCUMENTS

| | | |
|---|---|---|
| JP | 02-147900 U | 12/1990 |
| JP | 05-264139 | 10/1993 |
| JP | 07-142886 | 6/1995 |
| JP | 08-032263 | 2/1996 |
| JP | 3038538 | 4/1997 |
| JP | 2001-24372 | 1/2001 |
| JP | 2001-77256 | 3/2001 |
| JP | P2001-132699 | 5/2001 |
| JP | 2002-232174 | 8/2002 |
| JP | 2004-047921 | 2/2004 |
| JP | 2004-218941 | 8/2004 |
| WO | WO 02/03770 A2 | 1/2002 |

* cited by examiner (a)

| Outlet Pressure (kPa) | Inlet Pressure (kPa) | Outlet Flow Rate (mL/min) | $\theta$ (deg) |
|---|---|---|---|
| 2.0 | -0.64 | 213 | 18 |
| 4.0 | -0.36 | 158 | 15 |
| 6.0 | -0.15 | 104 | 12 |
| 8.0 | -0.02 | 39 | 10 |

(b)

COOLING DEVICE AND AN ELECTRONIC APPARATUS INCLUDING THE SAME

RELATED APPLICATIONS

This application is a continuation-in part of the U.S. patent application Ser. No. 10/446,152 filed May 28, 2003 now U.S. Pat. No. 6,839,234, which is a continuation-in part of the U.S. patent application Ser. No. 10/264,265 filed Oct. 4, 2002 now abandoned, entitled A COOLING DEVICE AND AN ELECTRONIC APPARATUS INCLUDING THE SAME, which relates to and claims priority from Japanese Patent Application No. 2002-139598 filed May 15, 2002, and Japanese Patent Application No. 2003-007168, filed Jan. 15, 2003, the disclosure of both which are hereby incorporated in their entirety by reference.

BACKGROUND OF THE INVENTION

1. Field of the Invention

The present invention relates to a cooling device of an electronic apparatus for cooling a heat-generating electronic component, such as a microprocessor or a CPU, mounted in a case with coolant circulated.

2. Description of the Related Art

The recent years have seen a dramatic progress in the speed-up of computers while CPUs have much greater clock frequencies than before. As a result, heat generation of the CPU is increased so much that the conventional air cooling method solely dependent upon a heat-sink has become inadequate. In this context, a high-efficiency, high-power cooling device is absolutely required. Known as such a cooling device are those disclosed in Japanese Unexamined Patent Publication Nos. 264139/1993 and 32263/1996 wherein a coolant is circulated on a substrate for cooling the substrate with a heat generating electronic component mounted thereon.

The conventional cooling device for cooling the electronic apparatus by means of coolant circulation will be described as below. It is noted that the term "electronic apparatus" essentially means herein an apparatus adapted to perform processings based on a program loaded in the CPU or the like, or more particularly a portable compact apparatus such as a notebook computer. However, the term also includes other apparatuses equipped with a heat generating electronic component which generates heat when energized. A first conventional cooling device is schematically shown in FIG. 10. Referring to FIG. 10, a reference numeral 100 represents a housing; a numeral 101 representing a heat generating electronic component; a numeral 102 representing a substrate with the heat generating component 101 mounted thereon; a numeral 103 representing a cooler performing heat exchange between the heat generating component 101 and the coolant for cooling the heat generating component 101. A reference numeral 104 represents a radiator for removing heat from the coolant; a numeral 105 representing a pump for circulating the coolant; a numeral 106 representing a pipe interconnecting these elements; a numeral 107 representing a fan for air cooling the radiator 104.

Now, description is made on the operations of the first conventional cooling device. Discharged from the pump 105, the coolant flows through the pipe 106 to reach the cooler 103, where the coolant is raised in temperature by absorbing the heat of the heat generating electronic component 101. Then, the coolant is delivered to the radiator 104, where the coolant is lowered in temperature as air cooled by the fan 107. Thus, the cooled coolant is returned to the pump 105. The movement of the coolant is repeated in cycles. The cooling device is designed to cool the heat generating electronic component 101 by circulating the coolant in this manner.

Next, a second conventional cooling device for electronic apparatus is exemplified by that disclosed in Japanese Unexamined Patent Publication No. 142886/1995. FIG. 11 is a general view of the apparatus with the cooling device.

The second cooling device is designed to cool a heat generating member mounted in a narrow housing by efficiently transferring heat from the heat generating member to a wall of a metal housing which serves as a radiator portion. Referring to FIG. 11, a reference numeral 108 represents a wiring board of an electronic apparatus; a numeral 109 representing a key board; a numeral 110 representing a semiconductor heat generating device; a numeral 111 representing a disc unit; a numeral 112 representing a display unit; a numeral 113 representing a heat absorber header involved in heat exchange with the semiconductor heat generating device 110; a numeral 114 representing a radiator header for heat dissipation; a numeral 115 representing a flexible tube; a numeral 116 representing a metal housing of the electronic apparatus.

The second cooling device is adapted for thermal connection between the semiconductor heat generating device 110 as the heat generating member and the metal housing 116 by means of a thermal transfer device of a flexible structure. The thermal transfer device includes the flat heat absorber header 113 attached to the semiconductor heat generating device 110 and having a fluid passage; the radiator header 114 having a fluid passage and disposed in contact with a wall of the metal housing 116; and the flexible tube 115 interconnecting the headers. The thermal transfer device is designed to drive or circulate a fluid sealed within the device between the heat absorber header 113 and the radiator header 114 by means of a fluid driving mechanism incorporated in the radiator header 114. Thus, an easy connection between the semiconductor heat generating device 110 and the metal housing 116 is provided irrespective of component layout. Furthermore, a highly efficient heat transfer is accomplished by driving the fluid. Since the radiator header 114 is thermally connected with the metal housing 116, the heat from the radiator header is diffused widely on the body of the metal housing 116 having a high heat conductivity.

On the other hand, there is known a pump with a heat exchange function for internal heat exchange, as disclosed in Japanese Unexamined Utility Model Publication No. 147900/1990. The pump with the heat exchange function is shown in a partially cut-away perspective view of FIG. 12. Referring to FIG. 12, a reference numeral 120 represents a motor; a numeral 121 representing a heat exchanger; a numeral 122 representing a cooling water passage; a numeral 122a representing an outlet port; a numeral 122b representing an inlet port; a numeral 123 representing a centrifugal pump; a numeral 124 representing a housing; a numeral 125 representing an impeller.

The centrifugal pump 123 is provided with an inlet port 124b centrally of the housing 124 of a volute type, and with an outlet port 124a tangentially of the housing. Disposed within the housing 124 is the impeller 125, a shaft of which is coupled with the motor 120. The cooling water passage 122 of the heat exchanger 121 is accommodated in the housing, as arranged on the whole outer periphery of the impeller 125 in a zigzag fashion.

Now, description is made on the operations of the conventional pump with the heat exchange function. When the impeller 125 is rotated by the motor 120, a heated coolant A from the apparatus is introduced into the housing 124 via the inlet port 122b to be whirled in the housing 124 and then discharged from the outlet port 122a on the external side. In this process, turbulent flow is formed at an outer area of the interior of the housing 124 because of high pressure, thus violently bringing the coolant A into contact with the cooling water passage 122 so that the coolant A is cooled by a cooling water B flowing through the cooling water passage 122. In this manner, the device delivers the coolant A to the apparatus under pressure while cooling the coolant A in the centrifugal pump 123.

However, the first conventional cooling device described above requires the cooler 103 for cooling the heat generating electronic component 101 by way of heat exchange between the heat generating component 101 and the coolant, the radiator 104 for removing the heat from the coolant, and the pump 105 for circulating the coolant. Since the cooling device comprises the combination of these elements, the device has a large and complicated structure which cannot be downsized and also involves cost increase. In other words, the first conventional cooling device is basically suited for cooling large electronic apparatuses but is not adapted for the current high-performance portable notebook computers featuring a compact, lightweight and slim design and various modes of carriage and use.

Although the aforementioned second conventional cooling device can be adapted for use in the notebook computers, the flat heat absorber header 113 attached to the semiconductor heat generating device 110 and the radiator header 114 in contact with the wall of the metal housing 116 are both shaped like a box, having substantial thickness. That is, the headers are an impediment to a thinner design of the notebook computer. Specifically, the second conventional cooling device is arranged such that the radiator header 114 contains therein a reciprocating pump as the fluid driving machine which is smaller in transverse width than other pumps. Unfortunately, the thickness of the reciprocating pump defines a great thickness of the radiator header 114 as a whole, making the notebook computer of slim design impracticable.

Further, the slim notebook computer does not permit the heat absorber header 113 to accommodate the reciprocating pump of the second cooling device. That is, the thickness of the pump would add to that of the semiconductor heat generating device 110, resulting in an increased thickness of the notebook computer. This is against the movement toward the thin design of the notebook computers. In addition, vibrations and noises produced by the reciprocating pump adversely affect the semiconductor heat generating device 110 on which the pump would be mounted. In some cases, the noises may grate on ear. On these accounts, it is difficult for the second cooling device to contribute the slim design.

The second conventional cooling device encounters a limited cooling capability because the radiator header 114 in contact with the wall of the metal housing 116 has a low heat transferability resulting from a small heat radiating area. It may be contemplated to increase the heat radiating area for enhancing the cooling capability. However, the further increase of the heat radiating area leads to the following contradiction. That is, the increased heat radiating area means an increased length of the flow passage and amount of circulation, thus requiring an increased output of the incorporated reciprocating pump, which results in an increased thickness of the radiator header 114. If an arrangement is made such that the reciprocating pump is independently accommodated in the metal housing 116, another space for the pump must be spared in the body of the notebook computer with dead space reduced to the limit. Furthermore, assembly work for the cooling device is complicated. Thus, the second conventional cooling device has limitations in the reduction of size and thickness of the notebook computers. The second conventional cooling device with such drawbacks falls short of meeting a demand for further increase of the cooling capability in conjunction with the recent progress of the CPUs.

On the other hand, the conventional pump with the heat exchange function has a large, complicated structure requiring the cooling water passage disposed therein because the coolant is cooled by the independent cooling water. The pump further requires a second pump for circulating the cooling water and a second heat exchanger for absorbing heat from the cooling water. Hence, the pump is a complicated system difficult to be downsized and also suffers a large number of components and low assembly efficiencies. Consequently, a good thermal efficiency or cost reduction cannot be expected from this pump.

In view of the foregoing, it is an object of the invention to provide a cooling device accomplishing both the improved cooling efficiency and the reduced size and thickness thereof, and featuring a simple construction.

It is another object of the invention to provide an electronic apparatus featuring a compact, slim design and a simplified construction.

SUMMARY OF THE INVENTION

A cooling device for cooling a heat-generating component includes a circulating passage arranged to have coolant circulate therein, a centrifugal pump including a first case made of metallic material, a second case made of resin material, and an impeller accommodated in the pump chamber, and a radiator provided at the circulating passage and being operable to release heat from the coolant. The first case has a surface arranged to contact the heat-generating component. The second case forms a pump chamber between the first case and the second case. The pump chamber stores the coolant therein. The impeller includes open-type vanes arranged to pressurize the coolant as to have the coolant flow through the circulating passage.

The cooling device has a high cooling efficiency as well as a high operating efficiency of the motor while having a simple construction and a small overall size and a small thickness.

DESCRIPTION OF THE PREFERRED EMBODIMENTS

Figure 1:
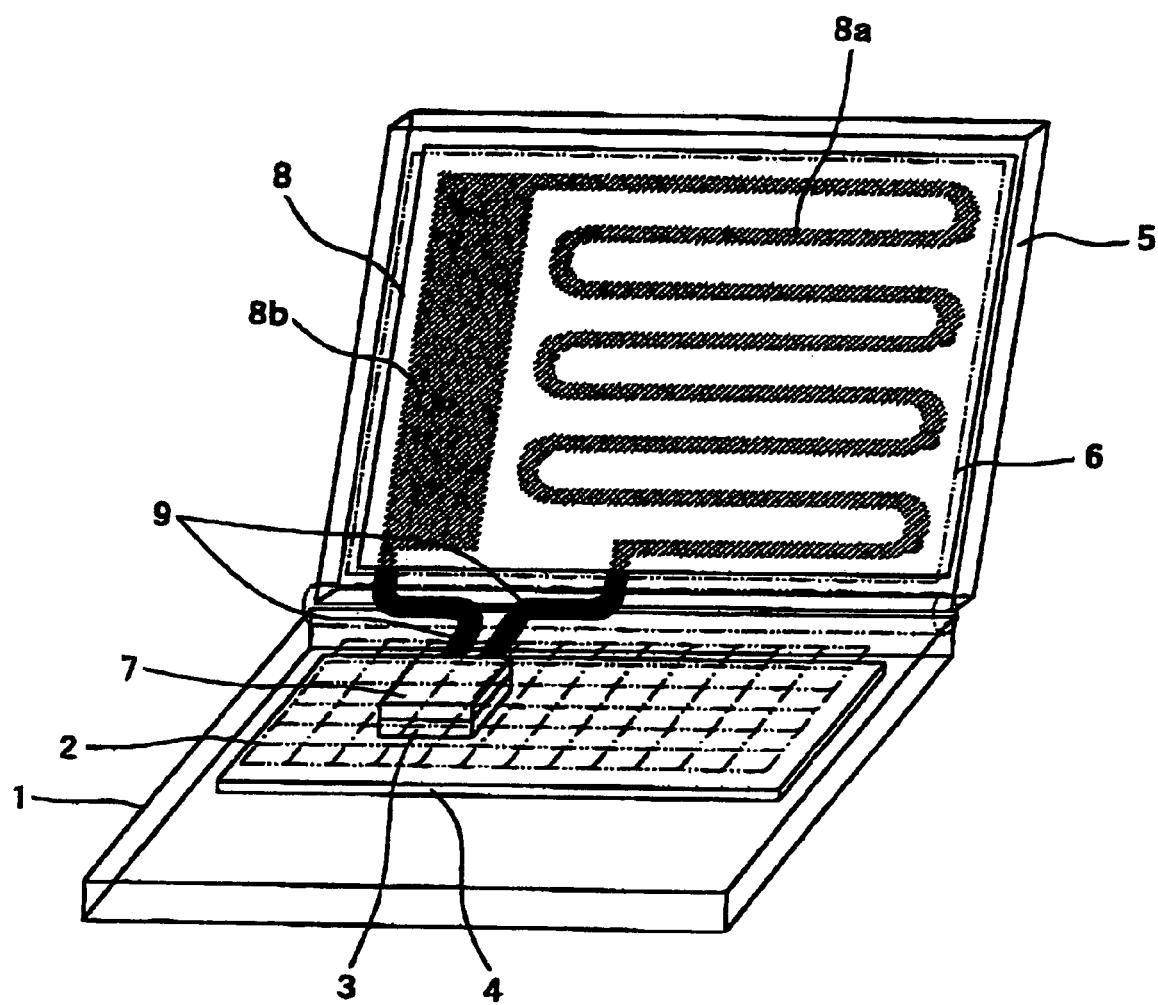
FIG. 1 is a diagram showing a general construction of an electronic apparatus incorporating a cooling device according to a first embodiment of the invention.

Preferred embodiments of the invention will be described in detail with reference to the accompanying drawings. In the following description of the embodiments, each of the parts represented by the same reference numerals in the drawings is substantially constructed the same way and hence, the explanation of like parts is omitted.

First Embodiment

Figure 2:
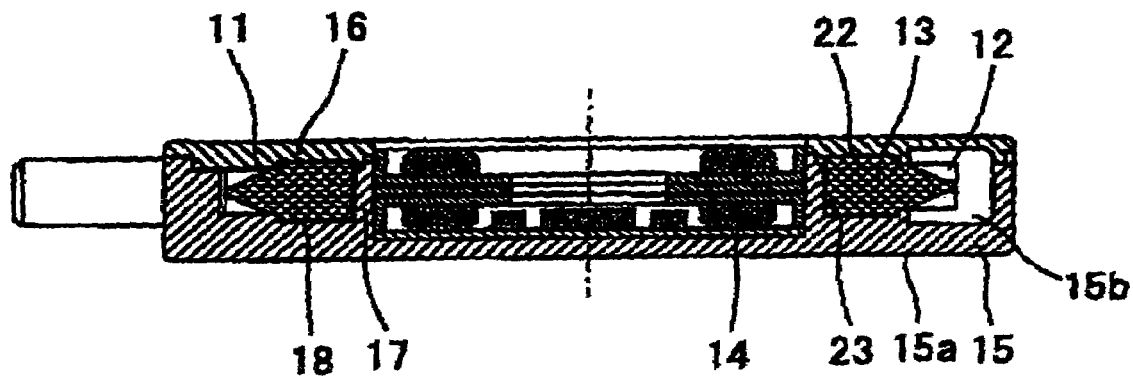
FIG. 2 is a sectional view showing a pump of contact heat exchanger type according to the first embodiment of the invention.
Figure 3:
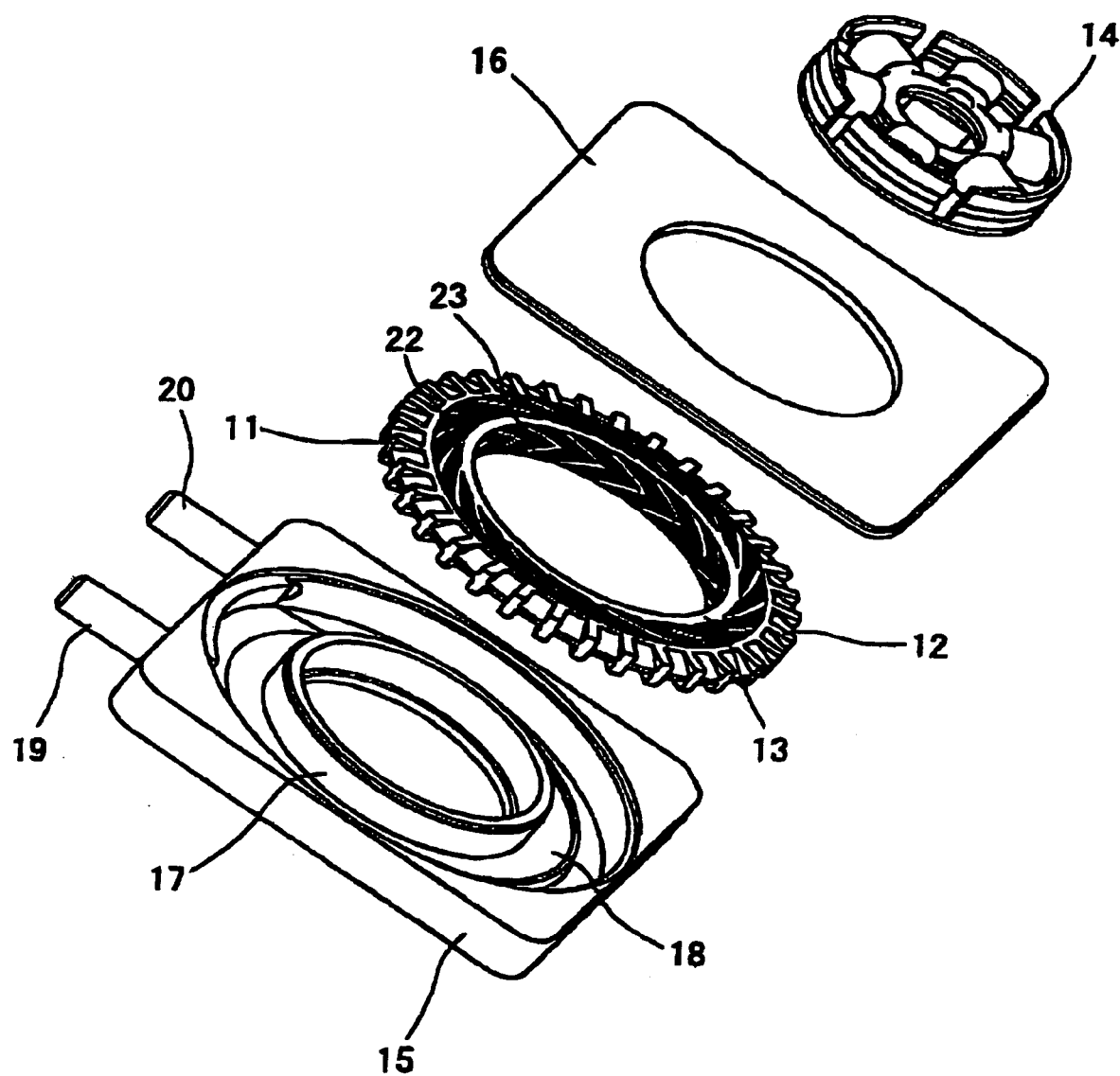
FIG. 3 is a disassembled perspective view showing the pump of contact heat exchanger type according to the first embodiment of the invention.
Figure 4:
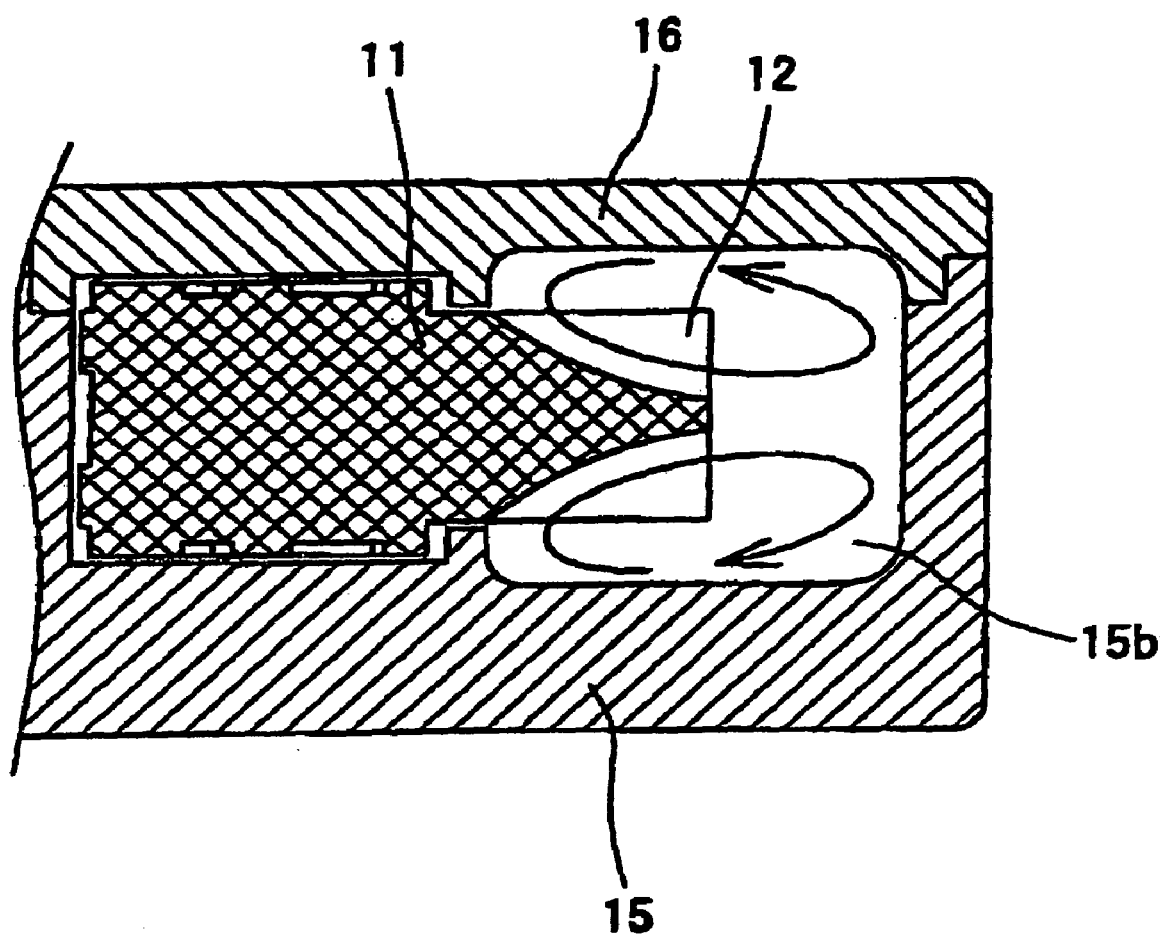
FIG. 4 is a sectional view of a principal part for illustrating the flow of a coolant in the pump of contact heat exchanger type according to the first embodiment of the invention.

A cooling device of a first embodiment and an electronic apparatus including the same is designed to interconnect a pump of contact heat exchanger type and a radiator by means of a flexible pipe permitting a second housing to rotate relative to a first housing. The electronic apparatus is a foldable apparatus such as a notebook computer. FIG. 1 is a diagram showing a general construction of the electronic apparatus incorporating the cooling device of the first embodiment, whereas FIG. 2 is a sectional view showing the pump of contact heat exchanger type according to the first embodiment. FIG. 3 is a disassembled perspective view showing the pump of contact heat exchanger type according to the first embodiment whereas FIG. 4 is a sectional view of a principal part showing a flow of a coolant in the pump according to the first embodiment.

Referring to FIG. 1, a reference numeral 1 represents a first housing such as of a notebook computer; a numeral 2 representing a key board disposed on a top surface of the first housing 1; a numeral 3 representing a heat generating electronic component such as a CPU accommodated in the first housing 1; a numeral 4 representing a substrate with the heat generating electronic component 3 mounted thereon; a numeral 5 representing a second housing serving as a cover of the first housing 1; a numeral 6 representing a display unit disposed on an inside surface of the second housing 5 for displaying operation results given by the CPU; a numeral 7 representing a pump of contact heat exchanger type disposed in intimate contact with the heat generating component 3 for heat exchange between the heat generating component 3 and a coolant X thereby cooling the heat generating component 3 and also serving to circulate the coolant X; a numeral 8 representing a radiator disposed on a back side of the display unit 6 for removing the heat from the coolant X; a numeral 8a representing a coolant passage arranged in a zigzag fashion; a numeral 8b representing a reserve tank for replenishing the coolant X; a numeral 9 representing a pipe for interconnecting these elements. Suitably used as the coolant X is an aqueous solution of propylene glycol which is safely used as a food additive or the like. In a case where aluminum or copper is used as a housing material as will be described herein later, the coolant may preferably be added with an anti-corrosive additive for improving the coolant in anti-corrosion characteristic with respect to such materials.

The radiator 8 comprises a sheet member of a material having a high heat conductivity and heat releasability, such as copper, aluminum, stainless steel or the like, because of the need for removing heat from the coolant X in a large space of a narrow width on the back side of the display unit 6. As shown in FIG. 1, the radiator includes therein the coolant passage 8a and the reserve tank 8b. A suitable radiator for use in the present invention is disclosed in a commonly owned and concurrently filed U.S. Patent application Ser. No. 10/976,324, which application is hereby incorporated by reference. In order to increase the cooling effect, the radiator 8 may be further provided a fan for forcibly cooling the coolant by blowing air against the radiator 8. The pipe 9 comprises a rubber tube of a flexible, low gas-permeable rubber such as butyl rubber such that the freedom of pipe layout may be secured. The low gas-permeable rubber serves the purpose of preventing the invasion of air bubbles into the tube.

Next, the structure of the pump of contact heat exchanger type 7 is described. The pump of contact heat exchanger type 7 according to the first embodiment employs a vortex pump (also referred to as Wesco pump, regenerative pump or friction pump). Referring to FIGS. 2 and 3, a reference numeral 11 represents a ring-like impeller of the vortex pump; a numeral 12 representing a plurality of grooved vanes formed on an outer periphery of the ring-like impeller 11; a numeral 13 representing a rotor magnet disposed in an inside circumference of the ring-like impeller 11. A reference numeral 14 represents a motor stator disposed in an inside circumference of the rotor magnet 13; a numeral 15 representing a pump housing accommodating the ring-like impeller 11 and guiding the fluid to an outlet port as allowing the restoration of the pressure of kinetic energy applied to the fluid by the impeller 11; a numeral 15a representing a heat absorbing surface contacting the heat generating electronic component 3 for absorbing the heat therefrom; a numeral 15b representing a pump chamber guiding the fluid to the outlet port as allowing the restoration of the pressure of the kinetic energy applied to the fluid by the vanes 12; a numeral 16 representing a housing cover constituting a part of the pump housing 15 and accommodating the ring-like impeller 11 followed by sealing the pump chamber 15b; a numeral 17 representing a cylinder portion disposed in the pump housing 15 and rotatably supporting the ring-like impeller 11. The pump 7 of the first embodiment has a thickness of 5–10 mm with respect to a direction of rotary axis; a characteristic radial length of 40–50 mm; a speed of rotation of 1200 rpm; a flow rate of 0.08–0.12 L/min.; and a head of the order of 0.35–0.45 m. Thus, the data of the pump according to the invention, including the values of the first embodiment, are defined as 3–15 mm in thickness; 10–70 mm in characteristic radial length; 0.01–0.5 L/min. in flow rate; and 0.1–2 m in head. That is, the pump is a slim, compact type having a specific rate of 24–28 (unit: m, m$^3$/min., rpm) and much smaller than the conventional pumps.

Because of the difficulty of forming a flat side surface of the pump, the application of a slim pump having thin and flat heat absorbing surface has been thought to be impracticable. However, the inventors focused attention on the vortex pump and found that the object of the invention can be achieved by making the following improvements to the pump. That is, an adequate heat exchange function can be attained by subjecting the heat from the heat generating electronic component 3 to turbulent heat exchange by way of turbulent flow formed at an outer periphery of the vortex pump. The flat heat absorbing surface can be realized by unifying a part of a driving portion with the impeller to form a flat plate-like arrangement as a whole. In terms of the area of the heat absorbing surface relative to the flow rate and the quantity of heat transfer relative to the flow rate, this compact, slim pump can achieve an adequate cooling capacity in contrast to the pump of a normal size.

Specifically, the fluid in the pump housing 15 of the pump of contact heat exchanger type 7 is agitated by the vanes 12 to form a spiral flow. In a macroscopic view, the fluid flows along the ring-like pump chamber 15b. The heat externally transferred from the heat source is absorbed by the fluid flow at the outer periphery of the ring-like impeller 11 (in a microscopic view as shown in FIG. 4, the fluid flow partly counter-flows against the heat transfer direction). As a result, the pump can function as a heat exchanger without the provision of another cooling device. However, the pump may include an auxiliary cooling device for enhancing the cooling capacity. The rotor magnet 13 is unified with the ring-like impeller 11 to form a ring body which is rotatably supported by the cylinder portion 17. Accordingly, the ring-like impeller 11 is decreased in inertial mass, so that heat generation by the driving portion is decreased while the pump of contact heat exchanger type 7 can be reduced in size, thickness and weight. In order to expedite the heat transfer, a material of high heat conductivity, such as copper, aluminum, stainless steel and the like, must be selected for forming the pump housing 15 and the housing cover 16. In principle, it is proper to use a metal material of high heat conductivity including copper, aluminum and the like. Otherwise, as a material less susceptible to variations in heat conductivity, a resin or the like having a high heat conductivity may also be used. In a case where aluminum is selected as a material for forming the pump housing 15 in the light of weight reduction, a copper sheet having a greater heat conductivity than aluminum may preferably be attached to a lower surface of the pump housing 15. Additionally, a heat pipe may be attached to the lower surface of the pump housing 15 (on the heat absorbing surface 15a side) or may be embedded in a part thereof so that the absorbed heat may be more effectively transferred to the outer periphery of the ring-like impeller 11 in the pump housing 15. The copper sheet and heat pipe are equivalent to an auxiliary heat conductive member of the invention. In addition to the attached sheet member, the auxiliary heat conductive member may be formed by friction bonding a copper bar and cutting off an unrequired portion. It is also preferred that the pump housing 15 and housing cover 16 are formed with fin-like projections and depressions on outer surfaces thereof for active heat exchange with outside air.

In addition, the pump of contact heat exchanger type 7 can be designed to have the heat absorbing surface 15a of the pump housing 15 totally defined by a flat plane. Specifically, a side surface of the pump housing 15 is formed in correspondence with side surfaces of the pump chamber 15b and motor stator 14, while the motor stator 14 is received in a cavity in the cylinder portion 17, whereby the heat absorbing surface 15a of the pump 7 is formed flat. Thus, the heat absorbing surface 15a may come into tight contact with the heat generating electronic component 3 (a top surface thereof is normally formed flat). In a case where the top of the heat generating component 3 is formed uneven, the pump housing may be so varied in thickness as to conform with the top configuration of the heat generating component, thereby establishing the tight contact therewith. Similarly to the aforementioned copper sheet, a bonding resin or rubber having a high heat conductivity may preferably be interposed between the heat absorbing surface 15a and the top configuration of the heat generating electronic component 3 such that the pump housing may be secured to place with the minimum possible decrease of the heat conductivity. It is noted that to conform the heat absorbing surface 15a with the top configuration of the heat generating electronic component 3 is to impart the heat absorbing surface 15a with a complementary configuration to the three-dimensional configuration of the top surface of the heat generating component 3. That is, the curvature of the heat absorbing surface matches that of the heat generating component 3, so that the pump housing per se is mountable on the component. Further, such a conformity means that the curvatures of these elements match with each other at least at their fixing portions (contact portions), although the size and configuration of the heat generating electronic component 3 such as CPU often differ from those of the heat absorbing surface 15a (the pump of contact heat exchanger type 7 according to the invention is quite small whereas the heat generating component 3 normally has a greater size, and the pump 7 according to the invention can take various forms whereas the heat generating component normally has a square shape). For effective heat transfer, it is necessary to eliminate the formation of an air layer between the heat absorbing surface 15a and the heat generating electronic component 3. Hence, the concept of conformity may include a case, for instance, where a minor depression is formed in either one of the heat absorbing surface and the heat generating component, although this approach is never recommended.

In the first embodiment, the motor stator 14 is received in the central cavity defined by the cylinder portion 17 of the pump housing 15 and transferred, one side of the motor stator transferring heat while the other side thereof dissipating the heat as exposed the outside air. Thus, the driving portion basically produces a small quantity of heat, which is dissipated in the atmosphere. Therefore, the pump of contact heat exchanger type 7 can be dedicated to the cooling of the heat generating electronic component 3. In the light of the effective cooling of the heat generating electronic component 3, however, it is recommendable not to locate the heat generating component 3 such as CPU near the motor stator 14 which also produces heat. Although varied depending upon the sizes of the heat generating component 3 and heat absorbing surface 15a, the rate of heat transfer depends upon the location of the heat generating component 3. Because of the heat generation by the motor, areas of the heat absorbing surface 15a that correspond to lateral sides of the housing sandwiching the wall of the pump chamber 15b and an area near an inlet port 19 and an outlet port 20 present higher rate of heat absorption. In particular, the greatest heat dissipation effect may be obtained by positioning the center of the heat generating component 3 at the area of the heat absorbing surface 15a that is surrounded by the inlet port 19, outlet port 20 and pump chamber 15b.

The cavity receiving the motor stator 14 may be molded of a silicone or urethane resin having a high heat conductivity such that the heat produced by the motor stator 14 may be transferred to the pump chamber 15b via this molded portion. Furthermore, the molded portion is effective to transfer the heat from the heat generating component 3, absorbed by the heat absorbing surface 15a, to the coolant X in the pump chamber 15b. This results in a further increase in the heat transfer rate. If the motor stator 14 including winding is molded of a molding material, the molded stator not only expedites the dissipation of heat from the heat generating component 3 but also completely seals the electrically conductive winding portion against water. Thus, the motor stator 14 can be perfectly protected against fluid leakage.

The pump of contact heat exchanger type 7 according to the first embodiment is adapted for non-contact rotation while reducing hydrodynamically produced axial and radial thrusts in order to maintain smooth operation for a long period of time. Referring to FIGS. 2 and 3, a reference numeral 18 represents a thrust plate; the 19 numeral representing the inlet port; the numeral 20 representing the outlet port. A reference numeral 22 represents a thrust dynamic pressure generating groove formed on opposite side surfaces of the ring-like impeller 11 and having a spiral groove pattern, whereas a numeral 23 represents a radial dynamic pressure generating groove formed on an inside circumference of the ring-like impeller 11 and having a herringbone groove pattern.

In the vortex pump, thrust balance is lost because a pressure at an area near the outlet port 20 is greater than a pressure at an area near the inlet port 19. Hence, the spiral groove pattern of the thrust dynamic pressure generating groove 22 is so formed as to provide a pumping action for thrusting the fluid toward the inside circumference of the groove in conjunction with the rotation of the ring-like impeller 11, thereby forming fluid films on the opposite sides of the impeller 11 for dynamically supporting an axial thrust. On the other hand, the herringbone groove pattern of the radial dynamic pressure generating groove 23 is so formed as to provide a pumping action for thrusting the fluid toward the axial center of the groove in conjunction with the rotation of the impeller 11, thereby forming a fluid film for dynamically supporting a radial thrust on the ring-like impeller 11. The thrust dynamic pressure generating groove 22 may be formed on the thrust plate 18 of the pump housing 15 or the housing cover rather than on the ring-like impeller 11. On the other hand, the radial dynamic pressure generating groove 23 may be formed on the cylinder portion 17 of the pump housing 15.

Figure 5:
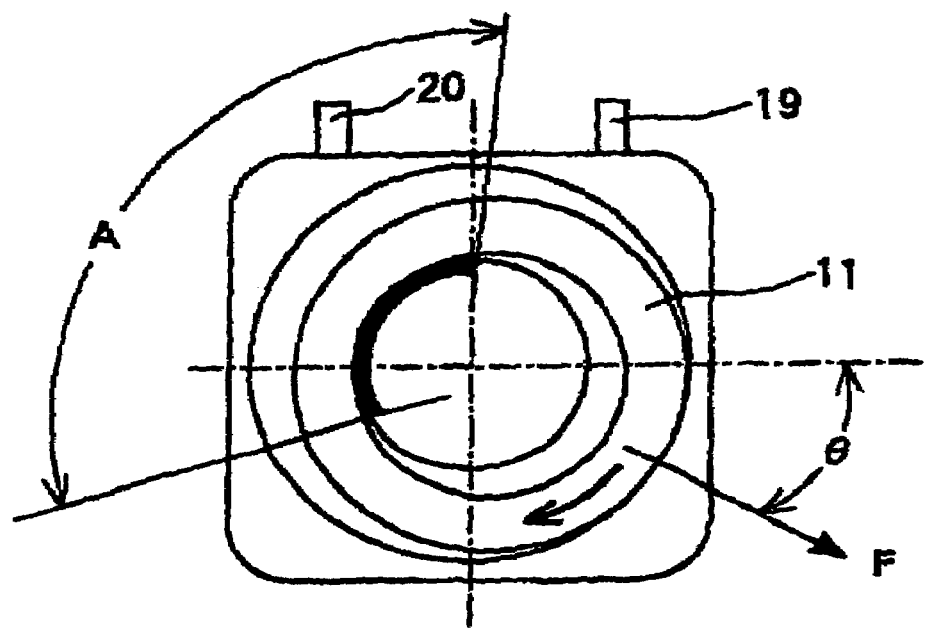
FIG. 5A is a table representing radial thrusts on a ring-like impeller according to the first embodiment of the invention.
FIG. 5B is a diagram explaining of the radial thrust on the ring-like impeller according to the first embodiment of the invention.

FIG. 5A is a table listing radial thrusts on the ring-like impeller 11 according to the first embodiment of the invention, whereas FIG. 5B is an explanatory diagram of the radial thrust on the ring-like impeller according to the first embodiment of the invention. In FIG. 5B, the arrow F represents the direction of force acting on the ring-like impeller 11. As shown in FIG. 5B, the vortex pump has the higher pressure at the area near the outlet port 20 than the pressure at the area near the inlet port 19 and hence, the radial thrust acts in a θ-direction or a direction away from the outlet port 20. Therefore, the radial thrust can be prevented from bringing the ring-like impeller 11 into contact with the cylinder portion 17 if the thrusting force of the fluid is intensified by forming the radial dynamic pressure generating groove 23 at an A-region (a portion of the cylinder portion 17 of the pump housing 15 that is represented by a thick line in the figure) in such a depth as to provide an increased dynamic pressure. In this case, the radial dynamic pressure generating groove 23 may be formed only on the A-region of the cylinder portion 17 near the outlet port 20 or on the overall circumference. In this manner, a stable operation of the pump is ensured. As apparent from the data listed in FIG. 5A, the direction of the force on the ring-like impeller 11 varies depending upon the pressure difference between the outlet port 20 and the inlet port 19. Hence, the range of the A-region may be defined based on the area used.

The pump of contact heat exchanger type 7 has the following advantages. Firstly, the driving portion of the vortex pump includes rotor magnet 13 and motor stator 14 which are separated. The rotor magnet 13 is unified with the ring-like impeller 11, so that the unified body may be combined with the motor stator 14 to form a flat general structure of the pump. This permits the formation of a flat and wide heat absorbing surface 15a on the side surface of the pump. Secondly, the pump of contact heat exchanger type 7 can adequately function as the cooling device because the heat from the heat generating electronic component 3 is transferred to the heat absorbing surface 15a where the heat is subjected to turbulent heat exchange at the outer periphery of the pump by way of a spiral flow of the fluid including a local counter flow against the heat transfer direction. Thirdly, the ring-like impeller 11 is perfectly sealed in the fluid by providing the cylinder portion 17 and is maintained afloat within the pump housing 15 in a non-contact fashion thereby minimizing load thereupon. The minimum load leads to a reduced heat generation by the driving portion and an increased cooling capability. Fourthly, the pump of contact heat exchanger type 7 also serves as the cooling device, thus negating the need for the conventional cooling device or for the assembly work for the cooling device. In addition, the mounting of the pump 7 onto the heat generating component 3 does not require an additional cumbersome assembly work or a special structure. The pump 7 only need be securely seated on the heat generating component with its heat absorbing surface contacting the component. This is quite advantageous in terms of the assembly work for the cooling device and costs.

Next, description will be made on the operations of the cooling device of the first embodiment and of the electronic apparatus including the same. When power is supplied from an external power source, current controlled by a semiconductor switching circuit in the pump of contact heat exchanger type 7 flows through a coil of the motor stator 14, so as to generate a rotating magnetic field. The rotating magnetic field acts on the rotor magnet 13 to produce a physical force therein. Since the rotor magnet 13 is unified with the ring-like impeller 11 rotatably supported by the cylinder portion 17 of the pump housing 15, the ring-like impeller 11 is subjected to a torque, which causes the impeller 11 to rotate. In conjunction with the rotation of the impeller 11, the vanes 12 on the outer periphery of the impeller 11 imparts a kinetic energy to the fluid thus introduced from the inlet port 19. The kinetic energy progressively increases the fluid pressure in the pump housing 15, so as to discharge the fluid from the outlet port 20.

In this process, the pumping action of the thrust dynamic pressure generating groove 22 due to the rotation of the impeller 11 thrusts the fluid toward the inside circumference of the thrust dynamic pressure generating groove 22 thereby to produce a thrust dynamic pressure between the opposite sides of the impeller 11 and the thrust plates 18. This permits the impeller 11 to rotate smoothly as prevented by the fluid film from contacting the thrust plates 18. On the other hand, the pumping action of the radial dynamic pressure generating groove 23 due to the rotation of the impeller 11 thrusts the fluid toward the axial center of the radial dynamic pressure generating groove 23 thereby to produce a radial dynamic pressure between the inside circumference of the impeller 11 and the cylinder portion 17. Therefore, the ring-like impeller 11 rotates smoothly as maintained afloat and out of contact with the cylinder portion 17. The ring-like impeller 11 presents a small rotational inertia and quite favorable response. In addition, the pump itself is notably decreased in weight.

Figure 6:
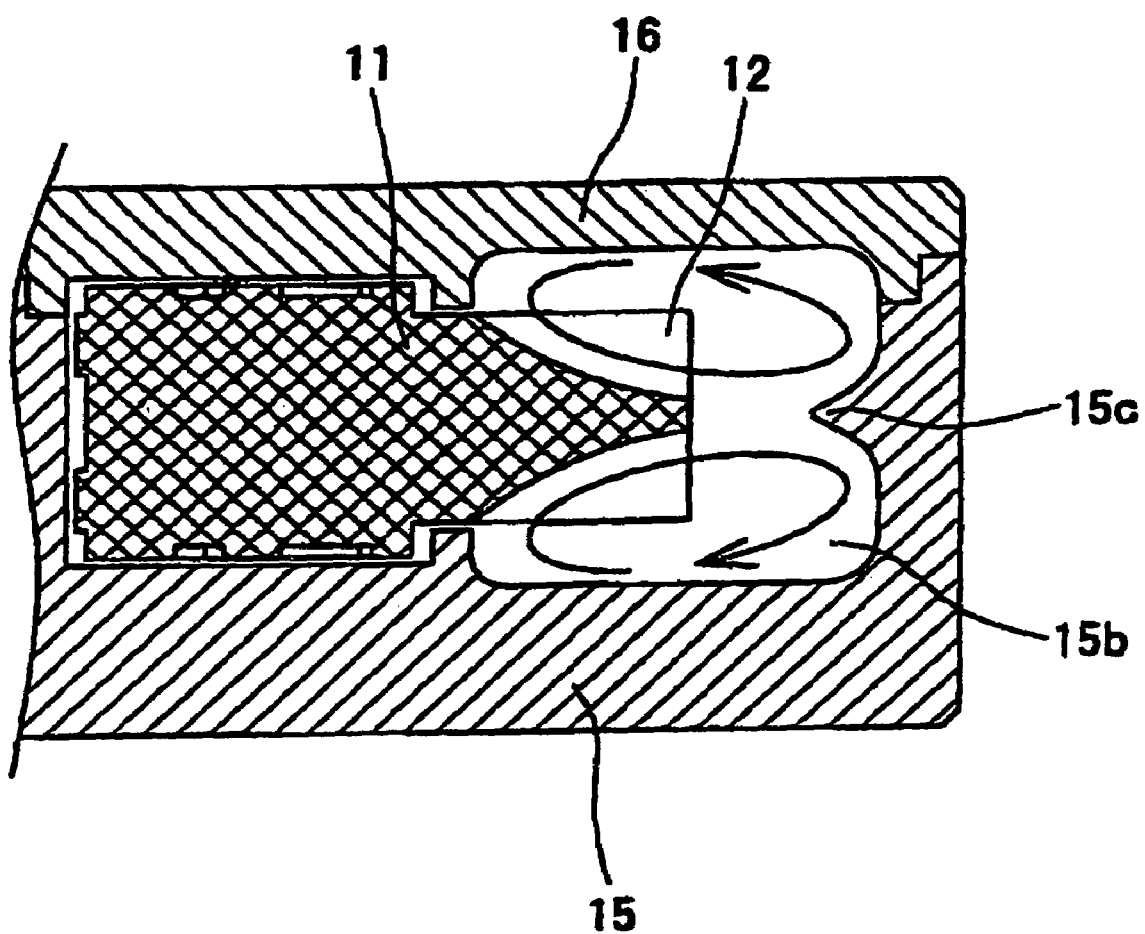
FIG. 6 is a sectional view of a principal part for illustrating the flow of the coolant in the pump of contact heat exchanger type provided with a fin according to the first embodiment of the invention.

In this state, the pump of contact heat exchanger type 7 smoothly suck in the coolant X. The sucked coolant X is agitated by the impeller 11 in a space enclosed by the pump housing 15 and the housing cover 16, as shown in FIG. 4, thereby to form a flow typical of the vortex pump in the pump chamber 15b and then discharged as progressively increased in pressure. In this process, the coolant X is involved in a violent turbulent heat exchange with the pump housing 15 and housing cover 16 which are raised in temperature by the heat transferred from the heat generating electronic component 3. The turbulent heat exchange may be promoted by increasing the surface roughness of an inside wall of the pump chamber 15 by shot blasting, shot peening or the like. This is because the heat transfer area is increased by increasing the surface roughness and because the heat transfer is enhanced by the more violent turbulent flow. For the same reasons, the quantity of heat exchange may be increased by providing a fin 15c projecting from the inside wall of the pump chamber 15b toward the impeller 11, as shown in FIG. 6. The fin 15c contributes to the smooth fluid flow in the pump chamber 15b as well as to the increased area of heat transfer from the pump housing 15 to the coolant X. FIG. 6 is a sectional view of a principal part for illustrating the flow of coolant in the pump of contact heat exchanger type provided with the fin according to the first embodiment of the invention.

Thus raised in temperature as absorbing the heat from the heat generating component 3 during the turbulent heat exchange, the coolant X is transported to the radiator 8 via the pipe 9, and cooled by the radiator 8. After lowered in temperature, the coolant X is returned to the pump 7 via the pipe 9, repeating these movements in cycles.

The heat released from the radiator 8 is discharged from the second housing 5 whereas the temperature of the interior of the first housing 1 is kept at a constant level. Therefore, there is no fear that the surface temperature of the first housing 1 most frequently touched by a user is raised to cause user discomfort. In this manner, the pump of contact heat exchanger type 7 is capable of maintaining the temperature of the heat generating electronic component 3 within an allowable range by absorbing the heat from the heat generating component 3 by way of circulation of the coolant X.

By virtue of the pump of contact heat exchanger type 7 serving the dual purposes of pump and cooling device, the cooling device of the first embodiment and the electronic apparatus including the same do not require separate provisions of the pump and cooling device, or the pipe for interconnecting the pump and the cooling device, thus accomplishing the reduction of the size and cost of the cooling device. The assembly work for the cooling device is also obviated. Furthermore, the additional cumbersome assembly work or the specific structure is not required for mounting the pump 7 on the heat generating component 3. The pump 7 can be adequately mounted to place simply by placing it on the component 3 in contacting relation. This is quite advantageous in terms of the assembly of the cooling device and costs.

The pump of contact heat exchanger type 7 is constructed as a ultra-thin vortex pump wherein the vanes 12, the rotor magnet 13 and a rotary shaft are unified to form the ring-like impeller 11 which receives therein the motor stator 14. The pump 7 is adapted to subject the coolant to the violent turbulent heat exchange therein, thus achieving the increased cooling efficiency of the cooling device and contributing to the further reduction of thickness and cost of the cooling device.

The pipe 9 is comprised of a tube of a low gas-permeable rubber, thereby maintaining the freedom of pipe layout and providing a long term prevention of the evaporation of the coolant X in the cooling device which will lead to the invasion of a large quantity of gas into the cooling device. In addition, the main body such as a notebook computer can be further downsized by providing the pump of contact heat exchanger type 7 in the first housing 1 and the radiator 8 in the second housing 5.

Second Embodiment

Figure 7:
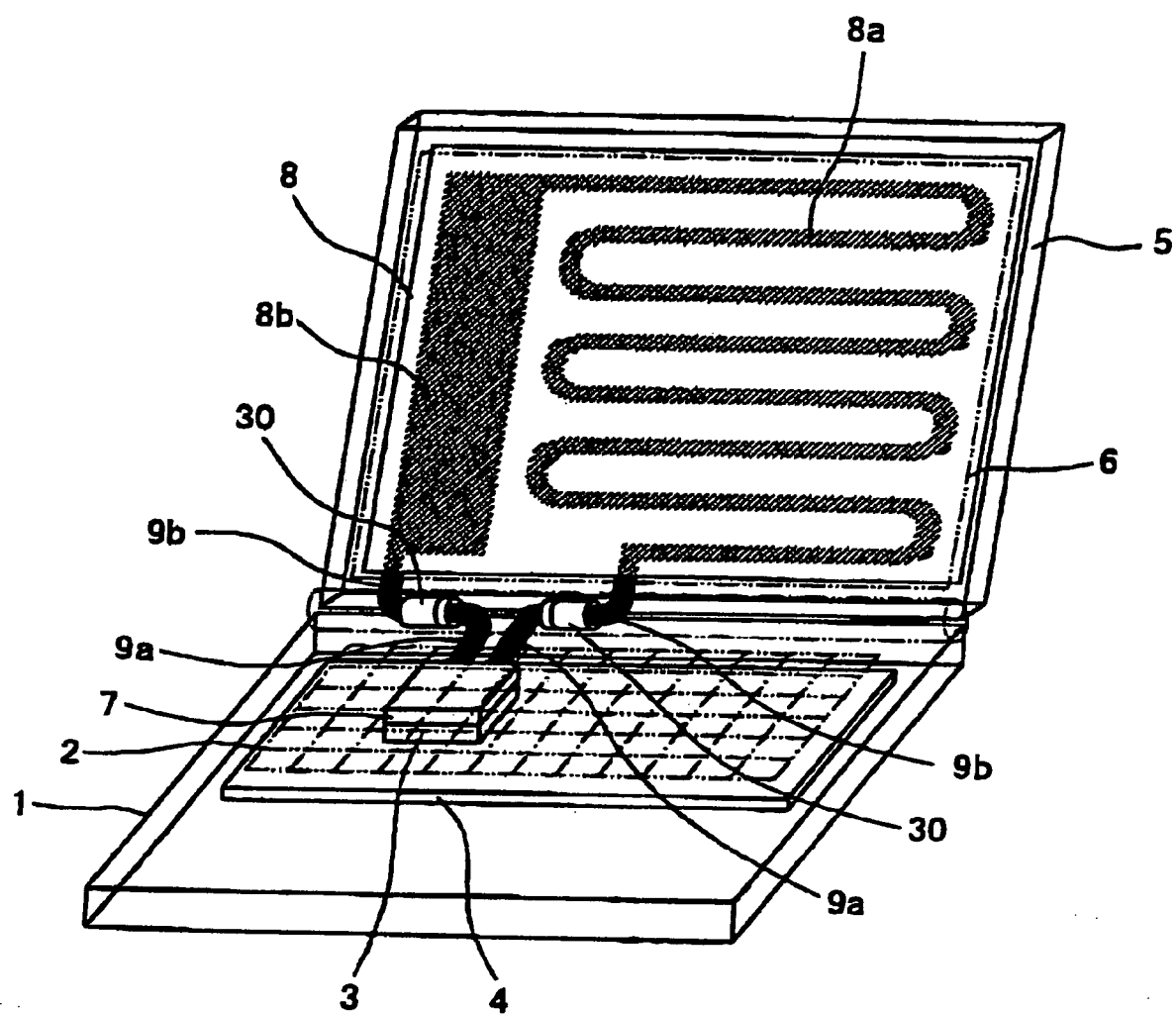
FIG. 7 is a diagram showing a general construction of an electronic apparatus incorporating a cooling device according to a second embodiment of the invention.
Figure 8:
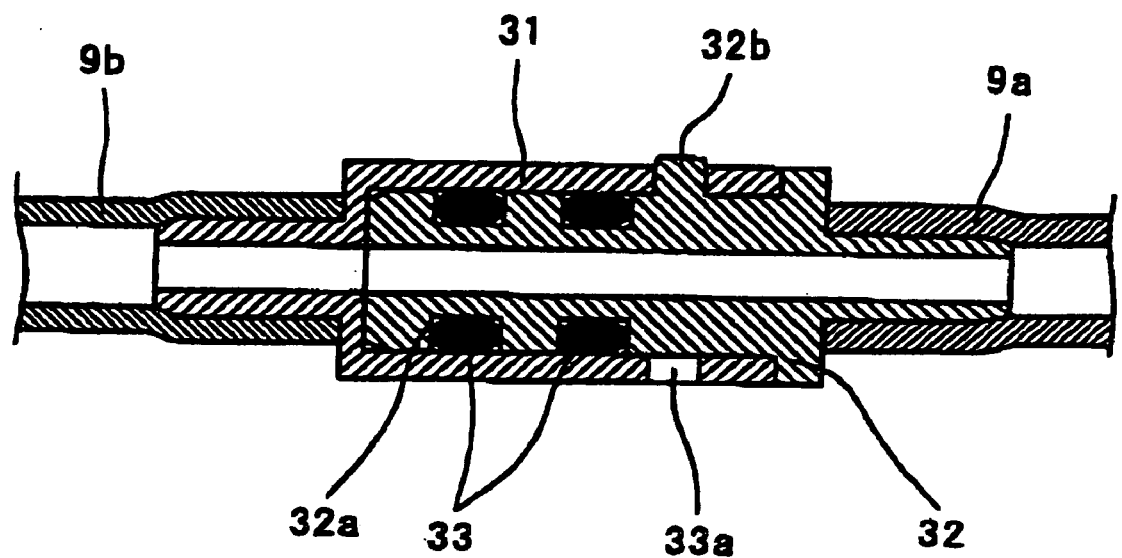
FIG. 8 is a sectional view showing a pivotal member according to the second embodiment of the invention.
Figure 9:
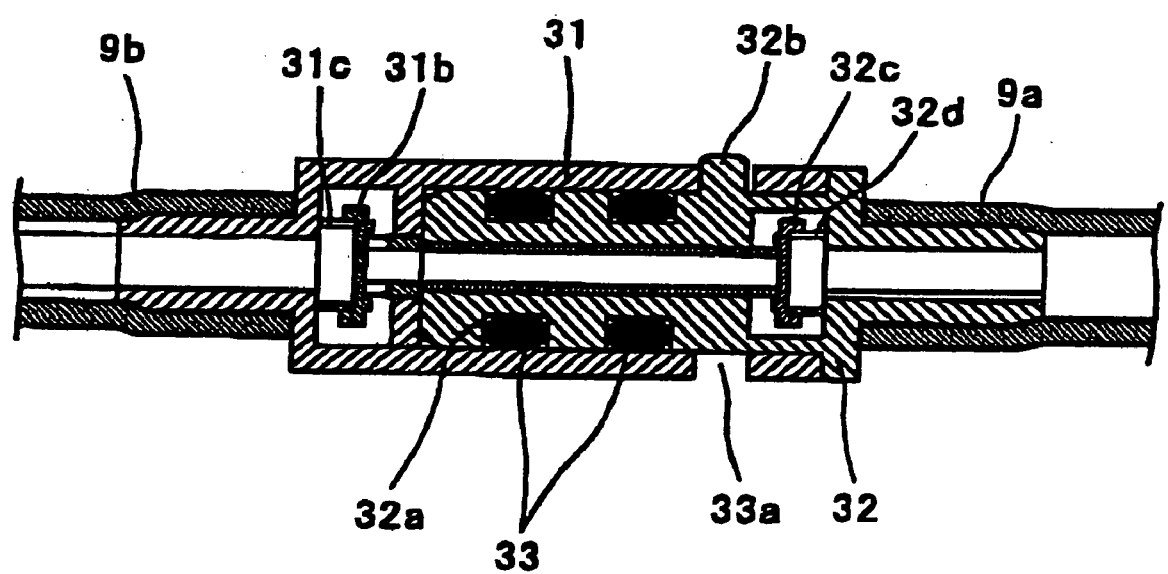
FIG. 9 is a sectional view showing the pivotal member of the second embodiment of the invention integrated with a removable snap-in type connector.
Figure 10:
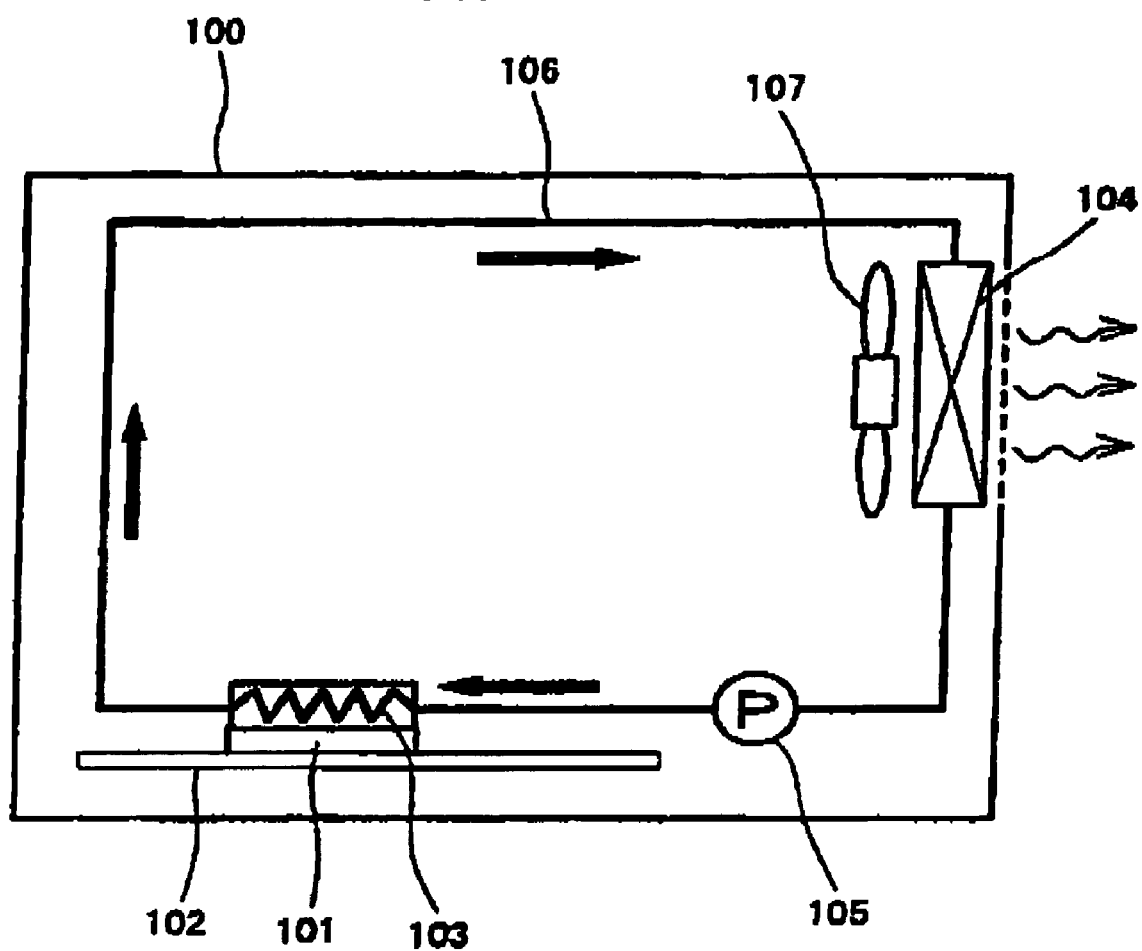
FIG. 10 is a diagram showing a construction of a first conventional cooling device for electronic apparatus.
Figure 11:
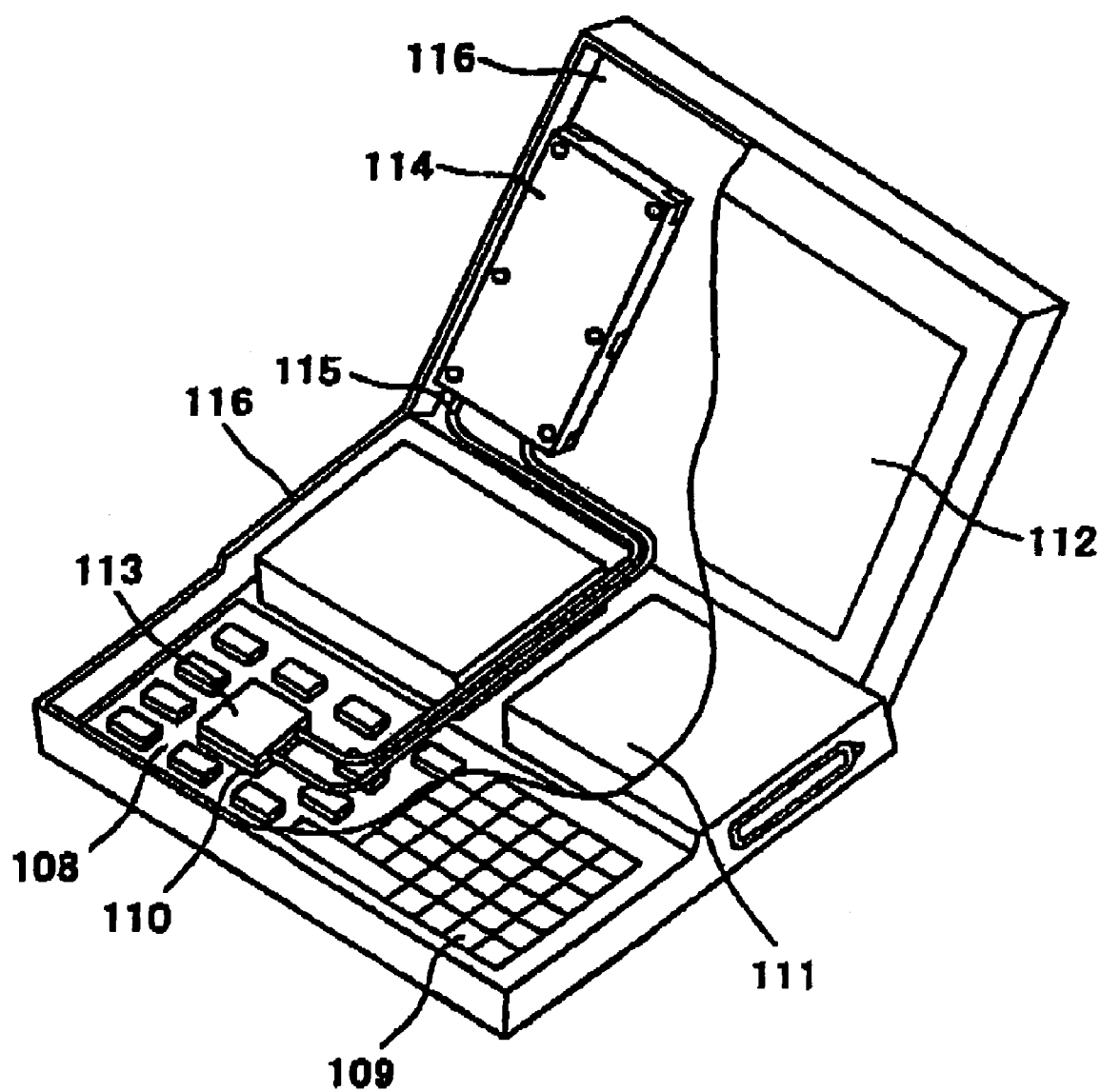
FIG. 11 is a diagram showing a construction of a second conventional cooling device for electronic apparatus.
Figure 12:
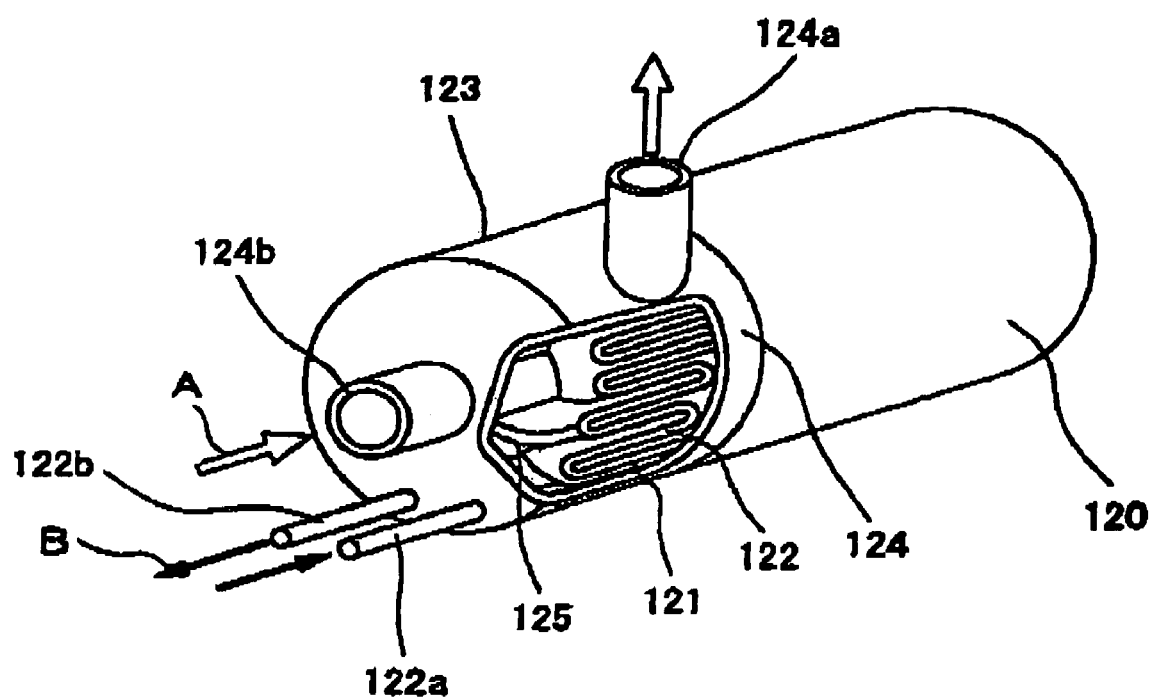
FIG. 12 is a partially cut-away perspective view showing a conventional pump with heat exchange function.

A cooling device according to a second embodiment of the invention and an electronic apparatus including the same is designed to interconnect a pump of contact heat exchanger type and a radiator by means of a pipe and a pivotal member permitting the second housing to rotate relative to the first housing. The electronic apparatus is a foldable apparatus such as a notebook computer. The pump of contact heat exchanger type is constructed the same way as in the first embodiment. FIG. 7 is a diagram showing a general construction of the electronic apparatus incorporating the cooling device according to the second embodiment of the invention. FIG. 8 is a sectional view showing the pivotal member according to the second embodiment of the invention. FIG. 9 is a sectional view showing the pivotal member of the second embodiment of the invention integrated with a removable snap-in type connector.

Referring to FIG. 7, the reference numeral 1 represents the first housing; the numeral 2 representing the key board; the numeral 3 representing the heat generating electronic component; the numeral 4 representing the substrate; the numeral 5 representing the second housing; the numeral 6 representing the display unit; the numeral 7 representing the pump of contact heat exchanger type; the numeral 8 representing the radiator; the numeral 8a representing the coolant passage; the numeral 8b representing the reserve tank; a numeral 9a representing a pipe from the pump of contact heat exchanger type; a numeral 9b representing a pipe from the radiator 8. A reference numeral 30 represents the pivotal member disposed in a connection portion between the first housing 1 and the second housing 5 and adapted to pivot in conjunction with the rotation of the second housing 5. The pivotal member 30 is connected with the pipe 9a from the pump of contact heat exchanger type 7 and with the pipe 9b from the radiator 8, respectively.

Next, the pivotal member 30 is described. Referring to FIG. 8, a reference numeral 31 represents a hollow outer cylinder having one end thereof connected with the pipe and the other end thereof connected with an inner cylinder 32 to be described herein later; a numeral 31a representing a notch for slip-off prevention; a numeral 32 representing the hollow inner cylinder inserted in the outer cylinder 31 to be connected therewith; a numeral 32b representing a projection inserted in the notch 31a for slip-off prevention. The hollow portion defines a passage for the coolant X. A reference numeral 32a represents a groove formed in an outer periphery of the inner cylinder 32 whereas a numeral 33 represents an O-ring shaped resilient member interposed between the outer cylinder 31 and the inner cylinder 32 and fitted in the groove 32a. The O-ring like resilient member 33 pivotally supports the outer cylinder 31 and the inner cylinder 32 and provides seal between the passages of the outer cylinder 31 and inner cylinder 32 and the outside portion thereby preventing the coolant X through the passages from leaking out. The O-ring like resilient members 33 are disposed in two rows thereby providing a long term prevention of the evaporation of the coolant X in the cooling device which will lead to the invasion of a large quantity of gas into the cooling device. For the purpose of preventing the slip-off of the outer cylinder 31 from the inner cylinder 32, the projection 32b is provided on the inner cylinder 32 whereas the notch 31a is formed at the outer cylinder 31.

Referring to FIG. 9, a reference numeral 31b represents a valve disposed in the outer cylinder 31 of the pivotal member 30; a numeral 31c representing a spring for biasing the valve 31b; a numeral 32c representing a valve disposed in the inner cylinder 32; a numeral 32d representing a spring for biasing the valve 32c. In a state where the outer cylinder 31 and the inner cylinder 32 are separated from each other, the valves 31b, 32b seal the respective internal passages of the cylinders. When the outer cylinder 31 and the inner cylinder 32 are connected with each other, the respective internal passages thereof are communicated with each other.

Since the construction and operations of the pump of contact heat exchanger type 7 are the same as in the first embodiment, the description thereof is omitted.

Next, description is made on the cooling device according to the second embodiment and the electronic apparatus including the same. The coolant X sucked by the pump of contact heat exchanger type 7 is agitated by the ring-like impeller 11 in the pump 7 and subjected to a violent turbulent heat exchange with the pump housing 15 and housing cover 16 which are raised in temperature by the heat transferred from the heat generating electronic component 3. As a result, the coolant is raised in temperature. The heated coolant X is transported to the radiator 8 via the pipe 9 and the passages through the pivotal member 30, and cooled by the radiator 8. After lowered in temperature, the coolant X is returned to the pump 7 via the pipe 9 and the passages through the pivotal member 30, repeating these movements in cycles. In this manner, the temperature of the heat generating electronic component 3 is maintained in an allowable range by cooling the heat generating component 3 through circulation of the coolant X.

When the user opens or closes the second housing 5 of the electronic apparatus such as a notebook computer, the second housing 5 rotates about a hinge of the first housing 1 as shown in FIG. 7. The rotation causes the outer cylinder 31 and inner cylinder 32 of the pivotal member 30 to pivot relative to each other, so that the second housing smoothly rotates. In addition, the pipe 9a from the pump 7 in the first housing 1 and the pipe 9b from the radiator 8 in the second housing 5 are connected by means of the pivotal member 30 so that the pipes are less susceptible to deformation. Accordingly, the pipes are prevented from obstructing the coolant flow therethrough.

In a case where the pivotal member is integrated with the connector as shown in FIG. 9, a pump side section and a radiator side section can be separately assembled. The sections may be individually incorporated in the first housing 1 and the second housing 5 to form sub-assemblies for the first housing 1 and second housing 5. Subsequently, the first and second housings 1, 5 may be connected with each other. This results in reduced fabrication costs.

According to the second embodiment as described above, the pivotal member provided at the pipe between the first and second housings 1, 5 provides the smooth rotation of the second housing 5 and also prevents the deformation of the pipe which will lead to the obstruction to the coolant flow through the pipe. The removable snap-in type connector provided at the pipe interconnecting the pump of contact heat exchanger type and the radiator permits the pump side section and the radiator side section to be separately assembled, resulting in the reduced fabrication costs. In addition, the unification of the pivotal member and the connector contributes to the further reduction of size and cost of the main body such as a notebook computer.

According to the cooling device of the embodiment described above, the pump of contact heat exchanger type also serves as the cooling device, thereby negating the need for the separate provisions of the pump and the cooling device and for the pipe interconnecting the pump and the cooling device. This results in the reduction of size and cost of the cooling device as well as in an easy assembly work.

Since the pump of contact heat exchanger type is a vortex pump, the impeller has a small thickness. On the other hand, a side surface extending along a pump flow defines the heat absorbing surface such that the heat transferred externally from the heat generating component may be subjected to the turbulent heat exchange by means of the fluid flow at the outer periphery of the impeller and hence, the component is effectively cooled. Thus, the cooling device can accomplish both the increase of cooling efficiency and the reduction of size and costs.

The pump of contact heat exchanger type is a vortex pump which includes the ring-like impeller with the rotor magnet disposed in its inside circumference, and the pump housing including the cylinder portion interposed between the motor stator and the rotor magnet, the cylinder portion rotatably supporting the impeller. Hence, the motor portion of the pump is free from a projection toward the heat absorbing surface, so that the pump can be formed as an ultra thin type. Furthermore, the transferred heat is subjected to the violent turbulent heat exchange with the coolant at the outer periphery of the impeller. Thus, the cooling device can accomplish both the increase of the cooling efficiency and the further reduction of thickness and costs thereof.

Since the heat absorbing surface is defined by the overall side surface of the pump housing, the heat absorbing surface can advantageously occupy the maximum available area of the pump housing. The flat heat absorbing surface permits the mounting of the pump on a substrate with a flat top surface. The motor stator may be molded of a molding material thereby promoting the heat transfer and making the motor stator watertight.

The electronic apparatus is constructed such that the second housing is rotatably attached to the first housing and is provided with the cooling device for cooling the heat generating electronic component including the CPU. Thus, the electronic apparatus including the first housing with the key board and the second housing with the display unit is adapted to for cooling, so that the main body of the electronic apparatus can be further downsized.

The pump of contact heat exchanger type is mounted on the top surface of the central processing unit with its heat absorbing surface contacting the top surface whereas the radiator is disposed on the back side of the display unit in the second housing. Thus, a further downsizing of the main body of the electronic apparatus is achieved by the arrangement wherein the first housing contains therein the pump of contact heat exchanger type and the second housing contains therein the radiator.

Next, a mounting structure of the heat generating electronic component 3 and pump of contact heat exchanger type 7 will be described with reference to FIGS. 13 to 37. In FIGS. 13 to 36, the arrow K represents the location of the key board 2, and the arrow B represents the location of the bottom of the first housing 1.

Figure 13:
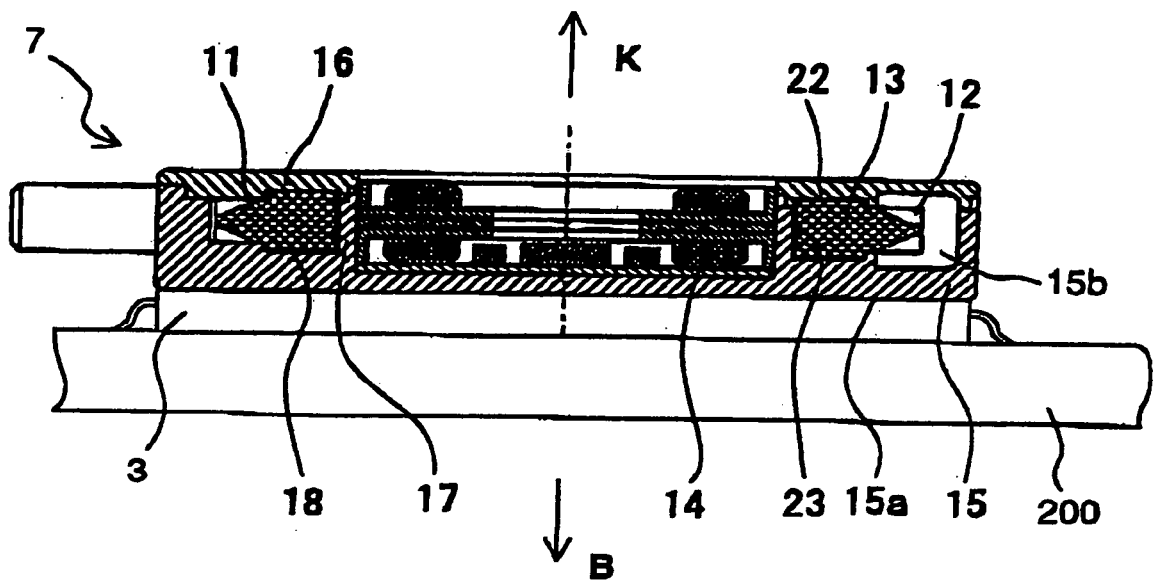
FIG. 13 is a diagram showing a mounting structure of the pump of contact heat exchanger type and the heat generating electronic component according to an embodiment of the invention.

In a case where the heat generating component 3 is disposed on a key-board 2 side surface of a circuit board 200 as shown in FIG. 13, the circuit board 200, heat electronic generating component 3 and pump of contact heat exchanger type 7 are stacked on top of each other in the named order from a bottom of the first housing 1 toward the key board 2. An embodiment of FIG. 13 illustrates a case where the heat generating component 3 and the pump 7 have substantially equal physical sizes. Therefore, the heat generating component 3 does not protrude from the pump 7 or vice versa. Such an arrangement ensures that the heat generating component 3 positively transfers the heat produced by the heat generating component 3 to the pump of contact heat exchanger type 7. Incidentally, the pump 7 and the heat generating component 3 are secured to each other by means of a fixing jig or adhesive normally used.

Figure 14:
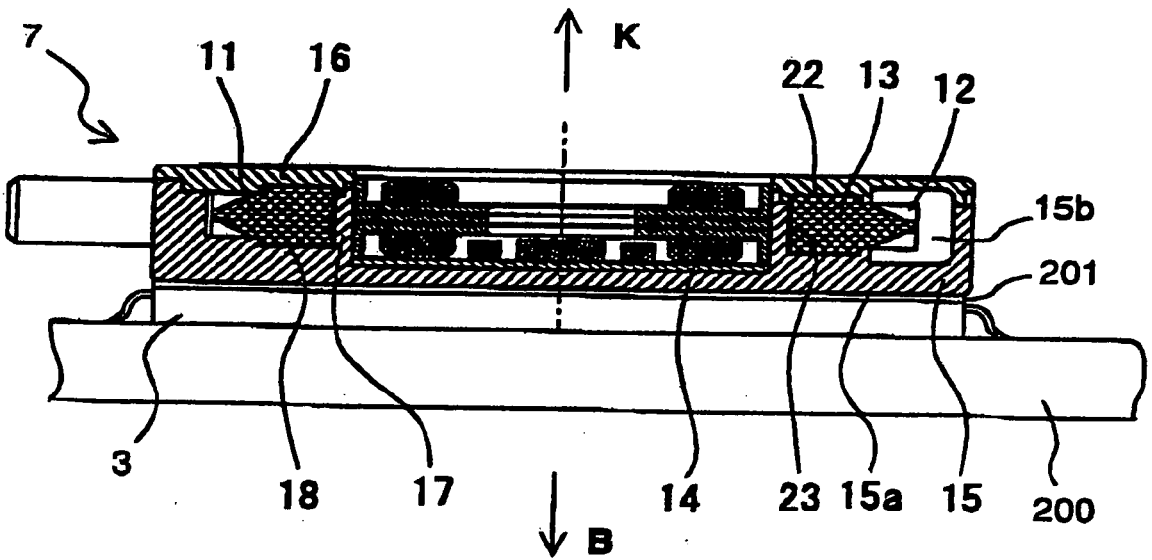
FIG. 14 is a diagram showing a mounting structure of the pump of contact heat exchanger type and the heat generating electronic component according to an embodiment of the invention.

A different embodiment from that of FIG. 13 is shown in FIG. 14, wherein an adhesion member 201, such as silicone grease, having fluidity and a good heat conductivity is applied between the heat generating component 3 and the pump 7, thereby further increasing a heat dissipating effect. If the pump 7 is directly placed on the heat generating component 3 as shown in FIG. 13, there is formed a minor air layer therebetween, which entails a problem such as interference of the heat transfer from the heat generating component 3 to the pump 7. However, as shown in FIG. 14, the provision of the adhesion member 201 prevents the formation of a low heat-conduction portion, such as the air layer, between the heat generating component 3 and the pump 7.

Figure 15:
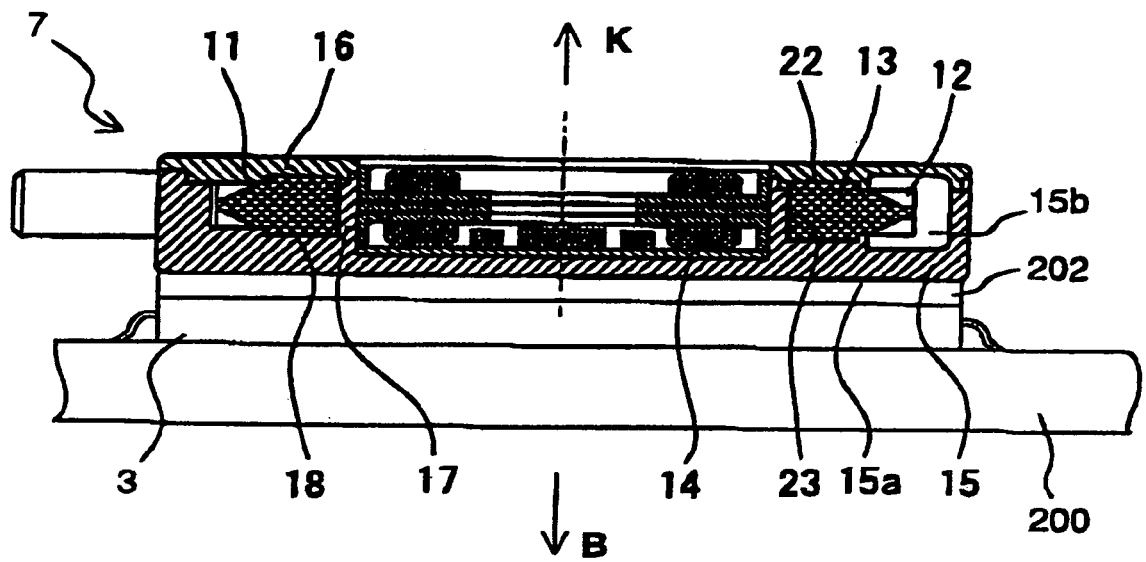
FIG. 15 is a diagram showing a mounting structure of the pump of contact heat exchanger type and the heat generating electronic component according to an embodiment of the invention.

Another different embodiment from that of FIG. 13 is shown in FIG. 15, wherein a conductive member 202 of a high heat conductivity is interposed between the heat generating component 3 and the pump 7, for smoothly transferring the heat produced by the heat generating component 3 to the overall area of the heat absorbing surface of the pump 7. This results in an increased cooling capability. In a case where the heat generating component 3 is a semiconductor device such as an IC, in particular, the semiconductor device is raised in temperature particularly at its center. The conductive member 202 expedites the transfer of a large quantity of heat produced at the center of the semiconductor device to the overall area of the heat absorbing surface of the pump 7. Specific examples of the conductive member 202 include a plate member and a sheet member such as formed of copper or copper alloy, and a thin film of copper or copper alloy which is formed on the heat absorbing surface of the pump 7 by sputtering, vapor deposition, plating or the like. Examples of the material for the conductive member include copper, copper alloy and other materials having good heat conductivities. Alternatively, a heat pipe or the like may be used as the conductive member 202.

Furthermore, the conductive member 202 serves to transfer the heat at least to place or its vicinity corresponding to an area of the pump 7, such as the pump chamber 15b, where the coolant flows, thereby dramatically increasing the cooling efficiency.

Figure 16:
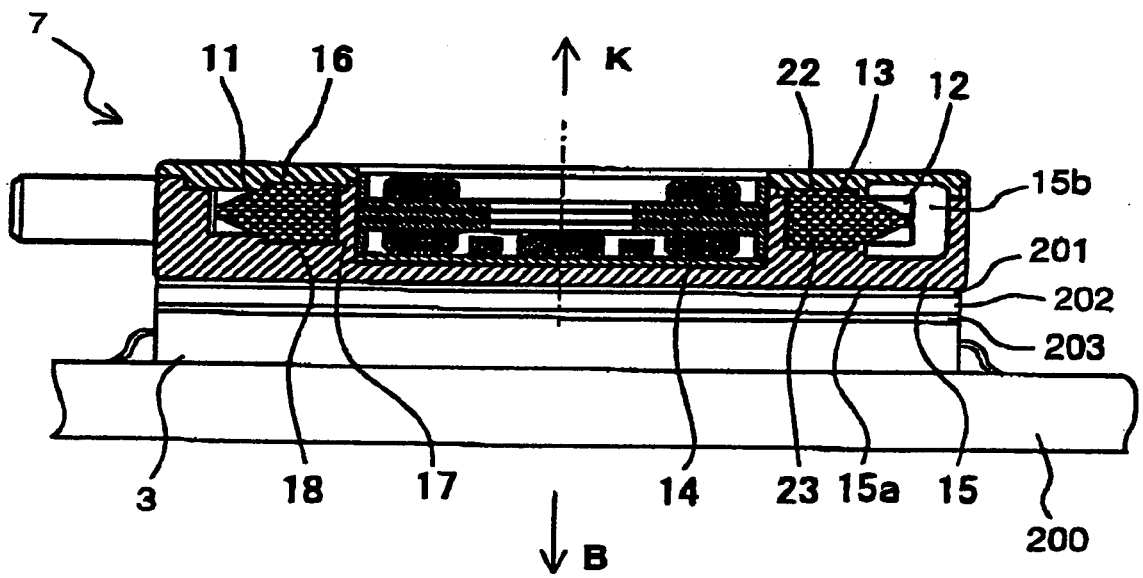
FIG. 16 is a diagram showing a mounting structure of the pump of contact heat exchanger type and the heat generating electronic component according to an embodiment of the invention.
Figure 17:
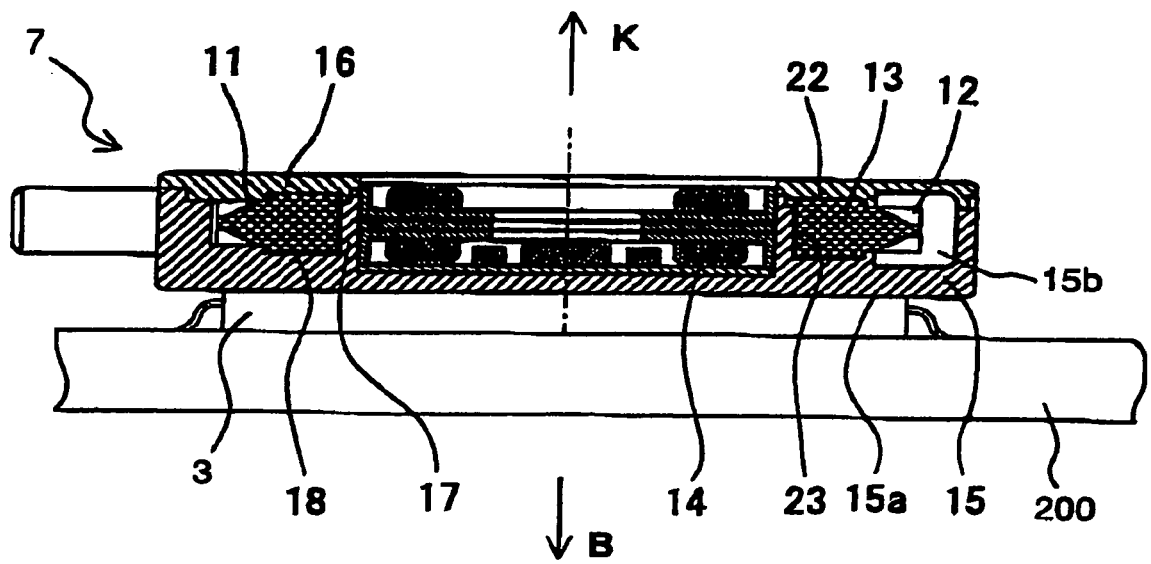
FIG. 17 is a diagram showing a mounting structure of the pump of contact heat exchanger type and the heat generating electronic component according to an embodiment of the invention.
Figure 18:
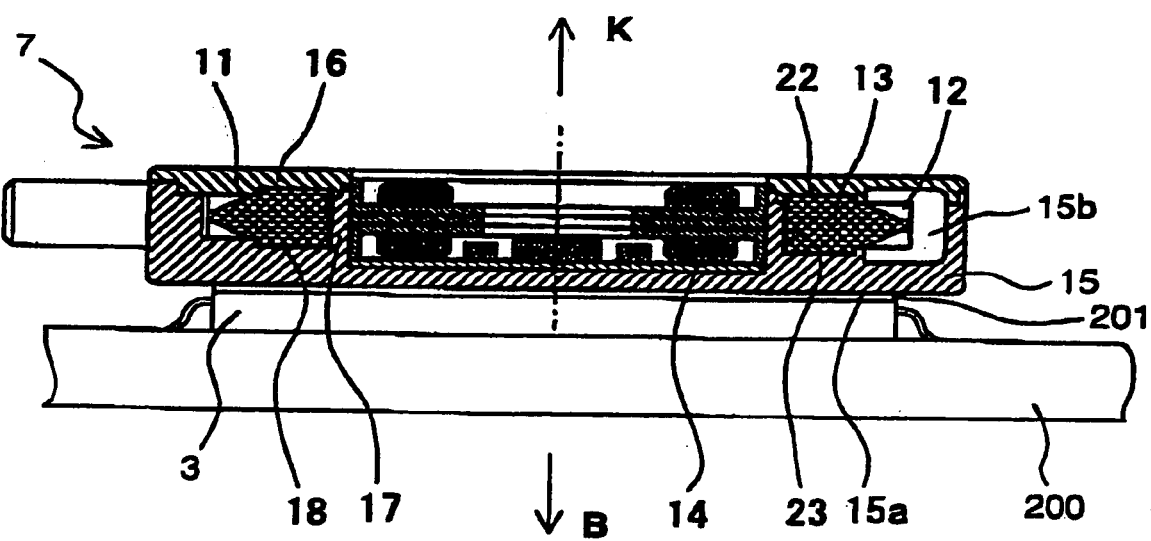
FIG. 18 is a diagram showing a mounting structure of the pump of contact heat exchanger type and the heat generating electronic component according to an embodiment of the invention.
Figure 19:
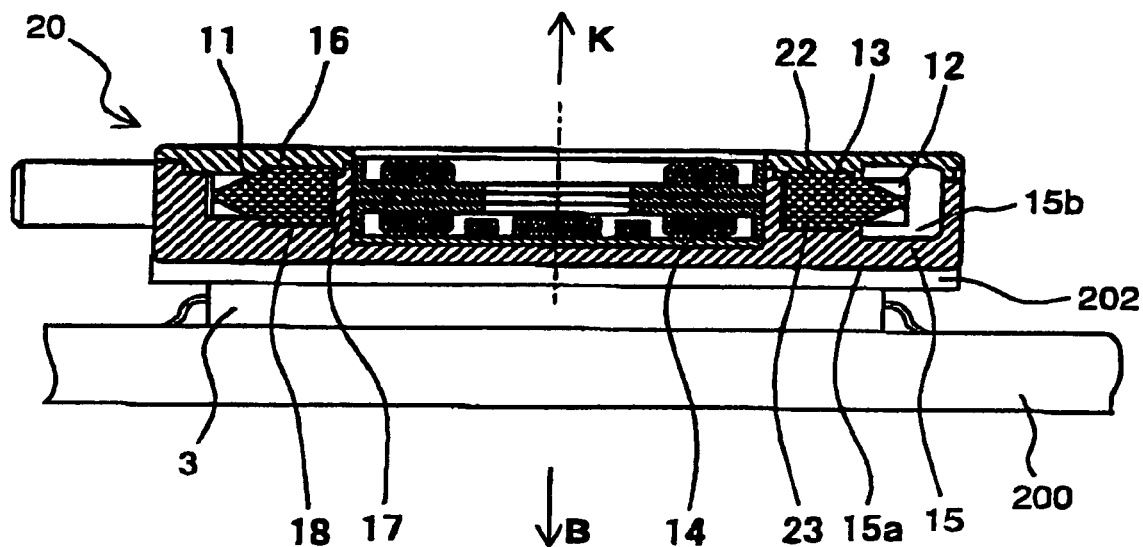
FIG. 19 is a diagram showing a mounting structure of the pump of contact heat exchanger type and the heat generating electronic component according to an embodiment of the invention.
Figure 20:
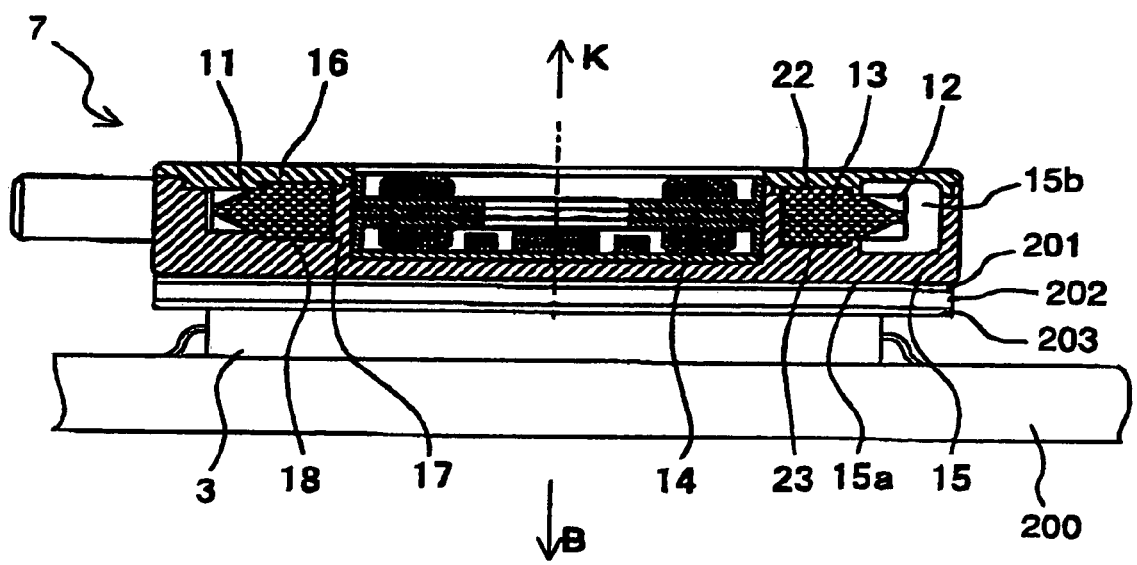
FIG. 20 is a diagram showing a mounting structure of the pump of contact heat exchanger type and the heat generating electronic component according to an embodiment of the invention.
Figure 21:
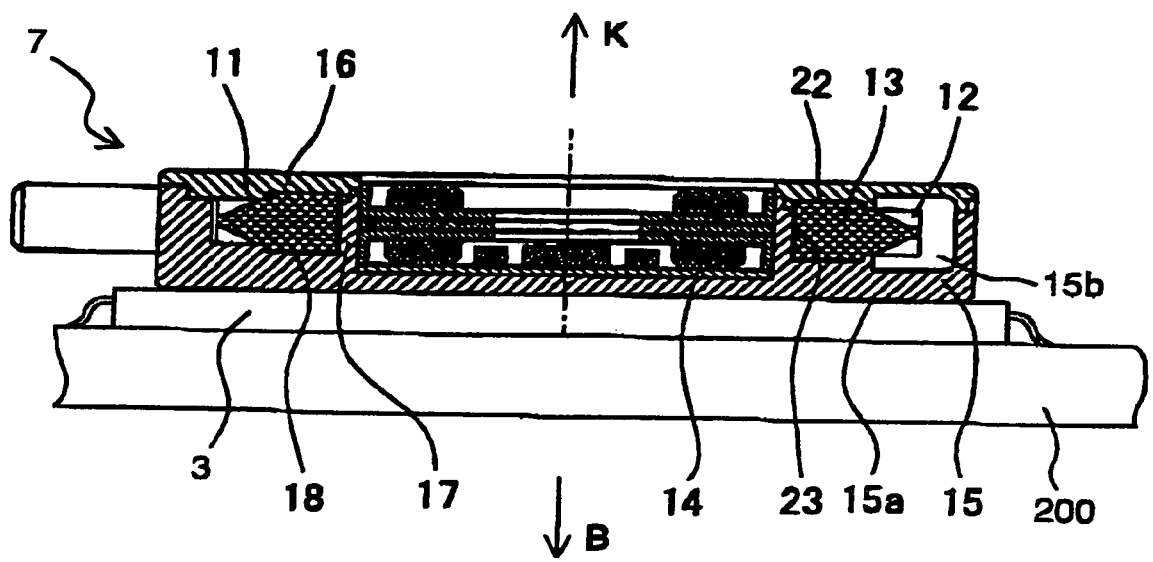
FIG. 21 is a diagram showing a mounting structure of the pump of contact heat exchanger type and the heat generating electronic component according to an embodiment of the invention.
Figure 22:
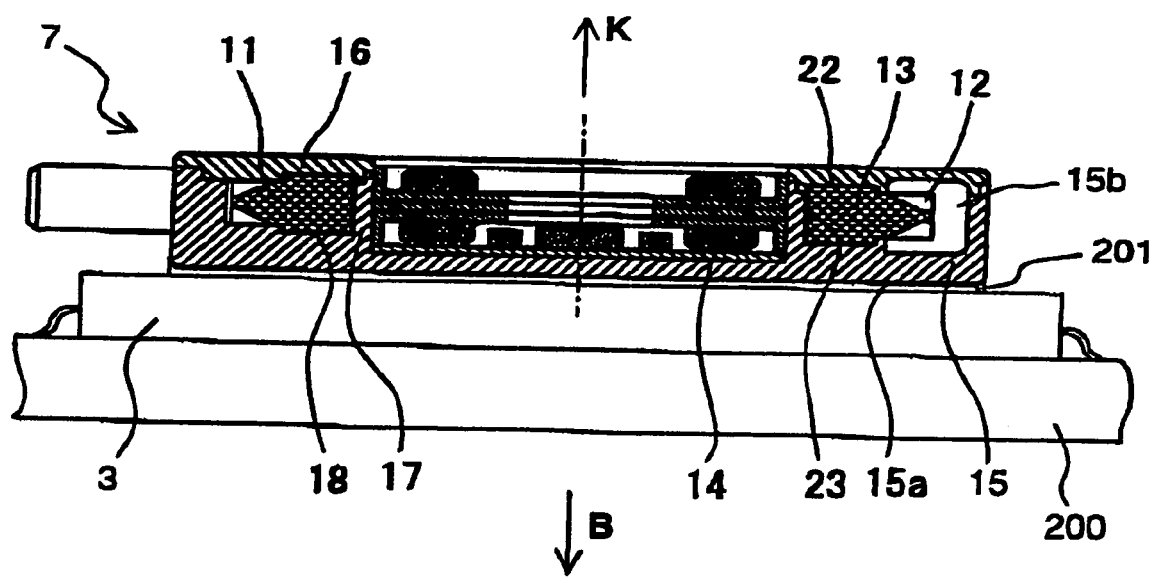
FIG. 22 is a diagram showing a mounting structure of the pump of contact heat exchanger type and the heat generating electronic component according to an embodiment of the invention.
Figure 23:
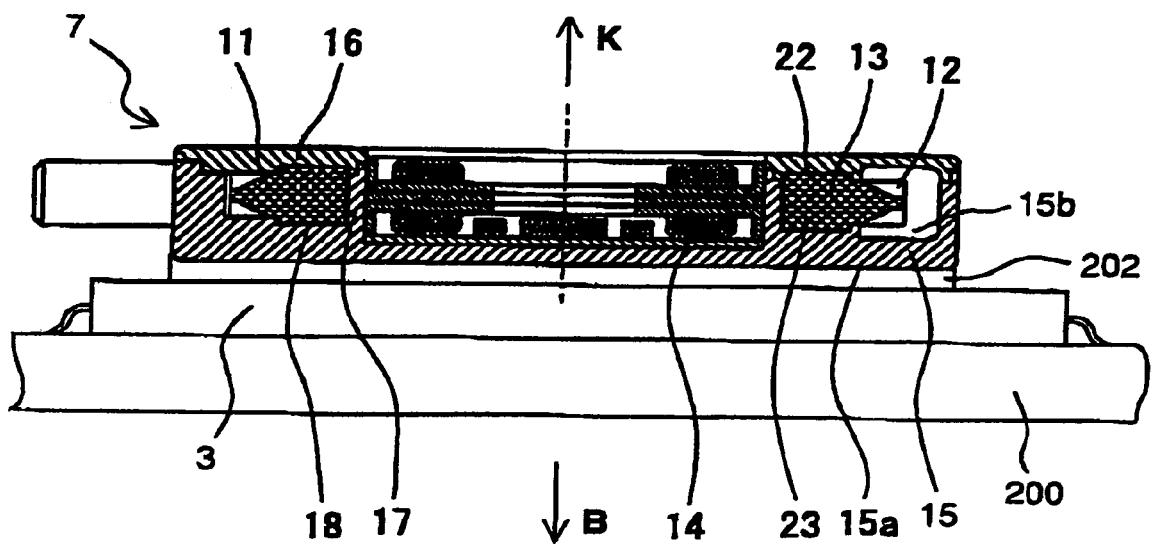
FIG. 23 is a diagram showing a mounting structure of the pump of contact heat exchanger type and the heat generating electronic component according to an embodiment of the invention.
Figure 24:
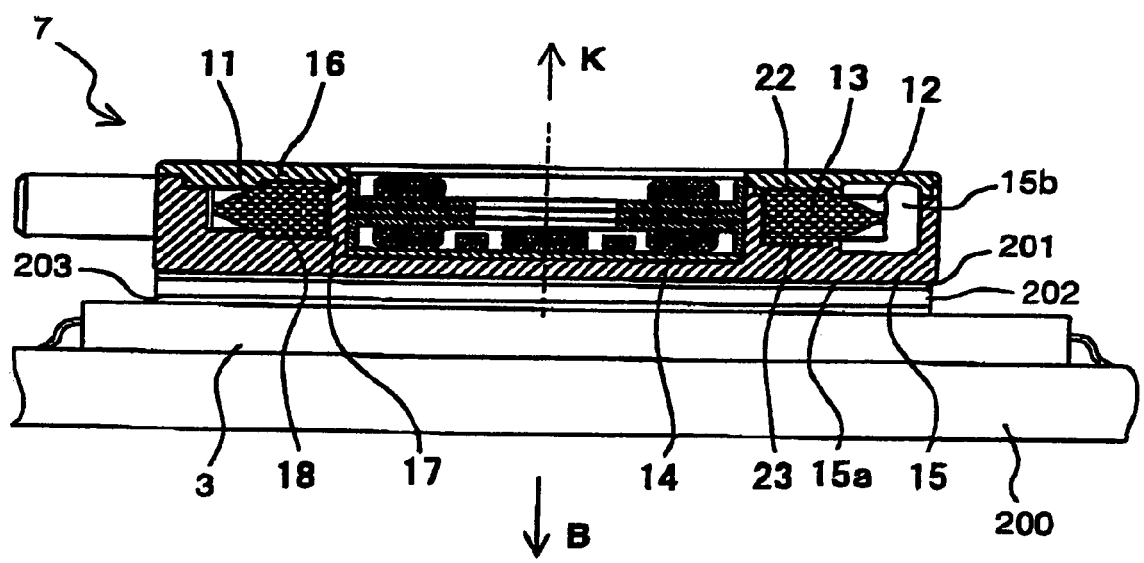
FIG. 24 is a diagram showing a mounting structure of the pump of contact heat exchanger type and the heat generating electronic component according to an embodiment of the invention.
Figure 25:
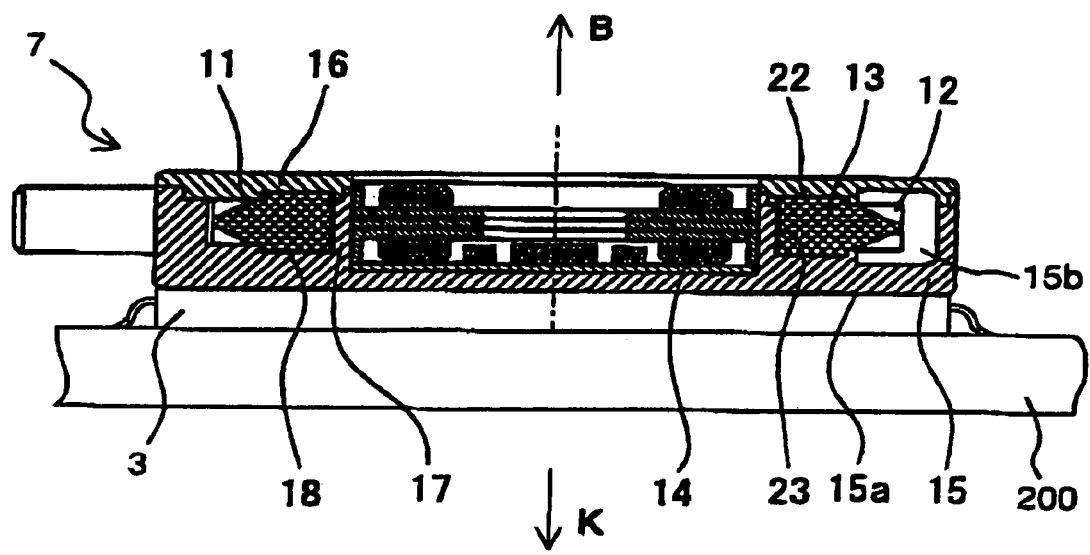
FIG. 25 is a diagram showing a mounting structure of the pump of contact heat exchanger type and the heat generating electronic component according to an embodiment of the invention.
Figure 26:
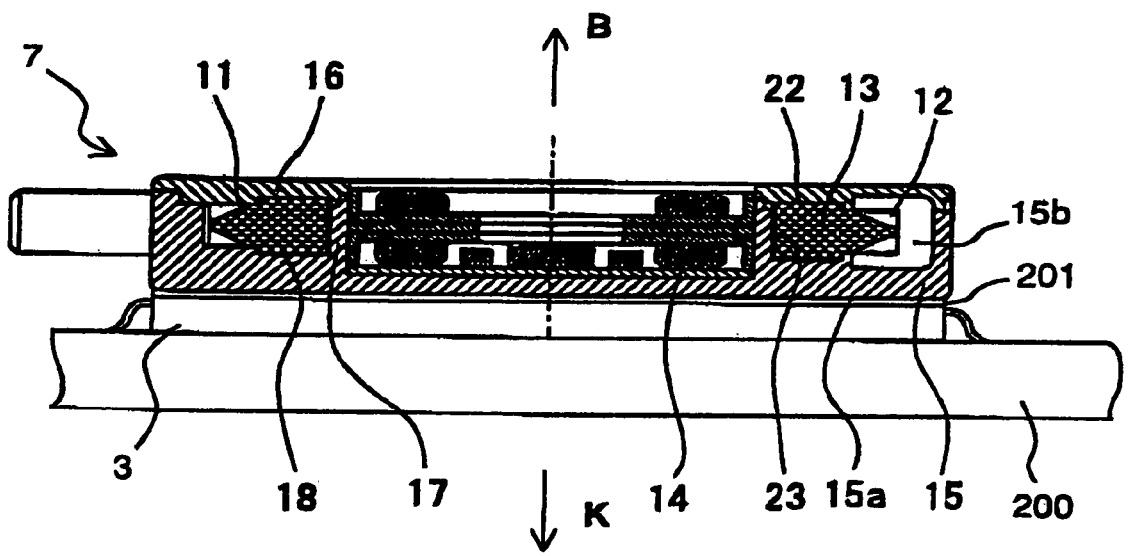
FIG. 26 is a diagram showing a mounting structure of the pump of contact heat exchanger type and the heat generating electronic component according to an embodiment of the invention.
Figure 27:
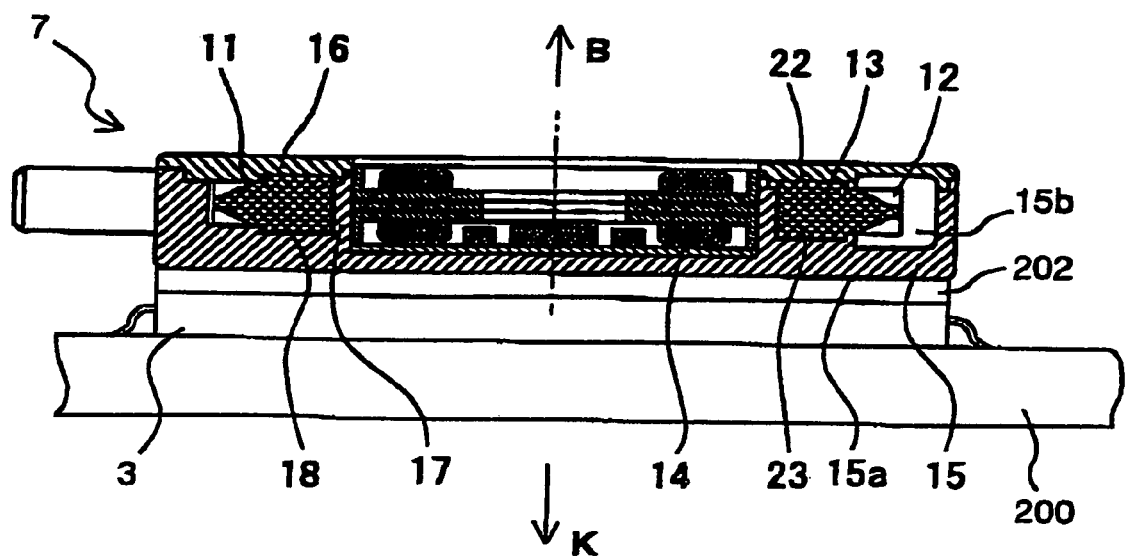
FIG. 27 is a diagram showing a mounting structure of the pump of contact heat exchanger type and the heat generating electronic component according to an embodiment of the invention.
Figure 28:
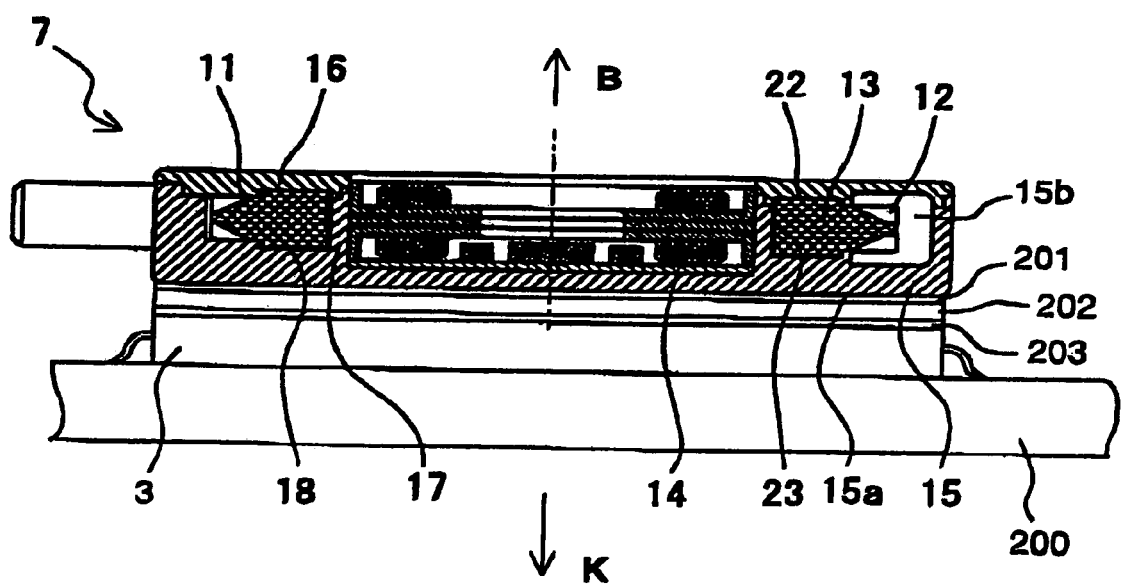
FIG. 28 is a diagram showing a mounting structure of the pump of contact heat exchanger type and the heat generating electronic component according to an embodiment of the invention.
Figure 29:
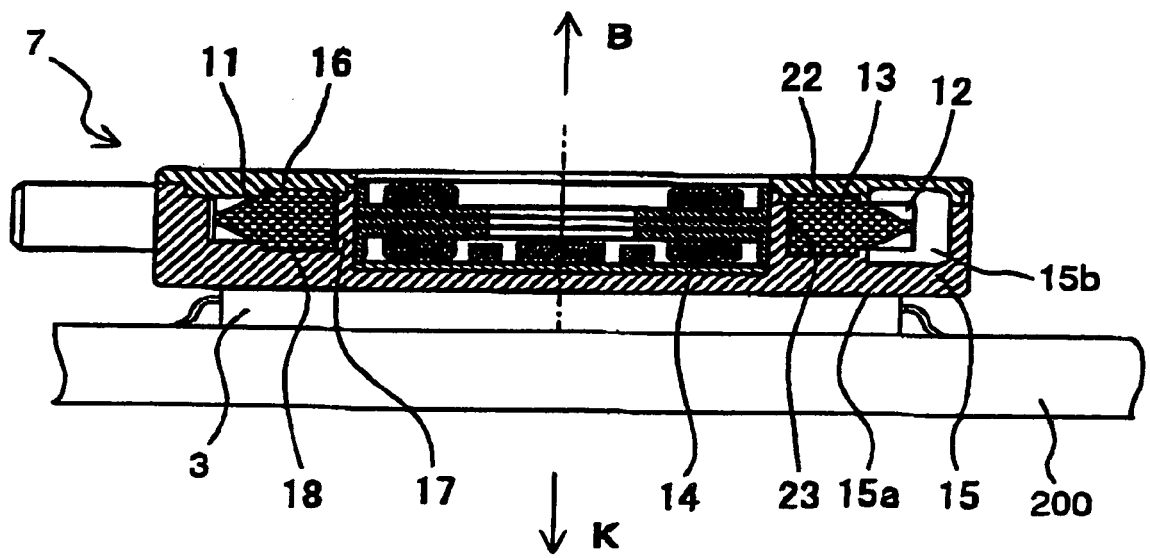
FIG. 29 is a diagram showing a mounting structure of the pump of contact heat exchanger type and the heat generating electronic component according to an embodiment of the invention.
Figure 30:
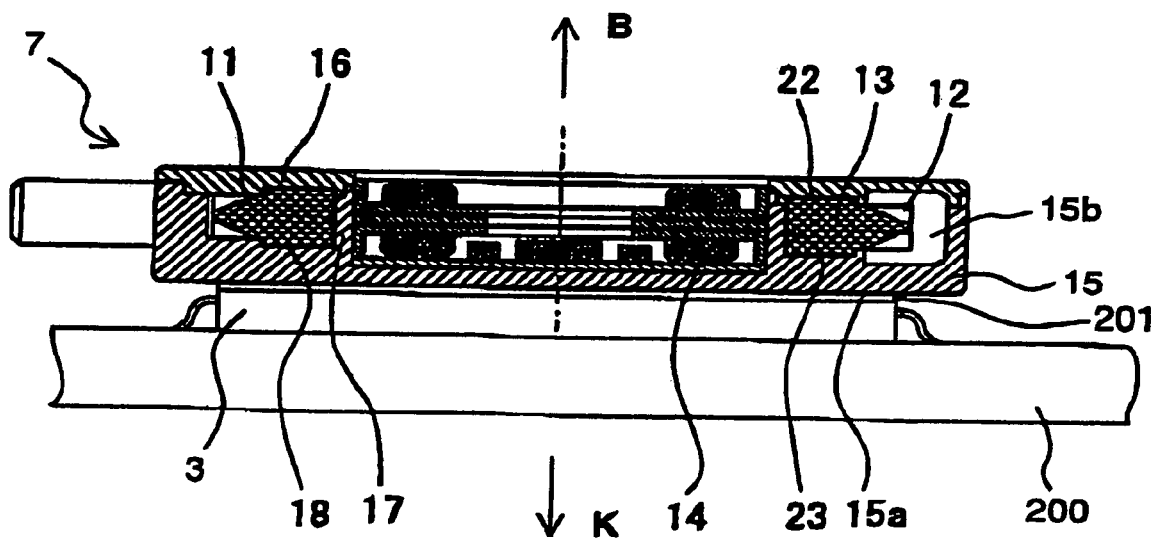
FIG. 30 is a diagram showing a mounting structure of the pump of contact heat exchanger type and the heat generating electronic component according to an embodiment of the invention.
Figure 31:
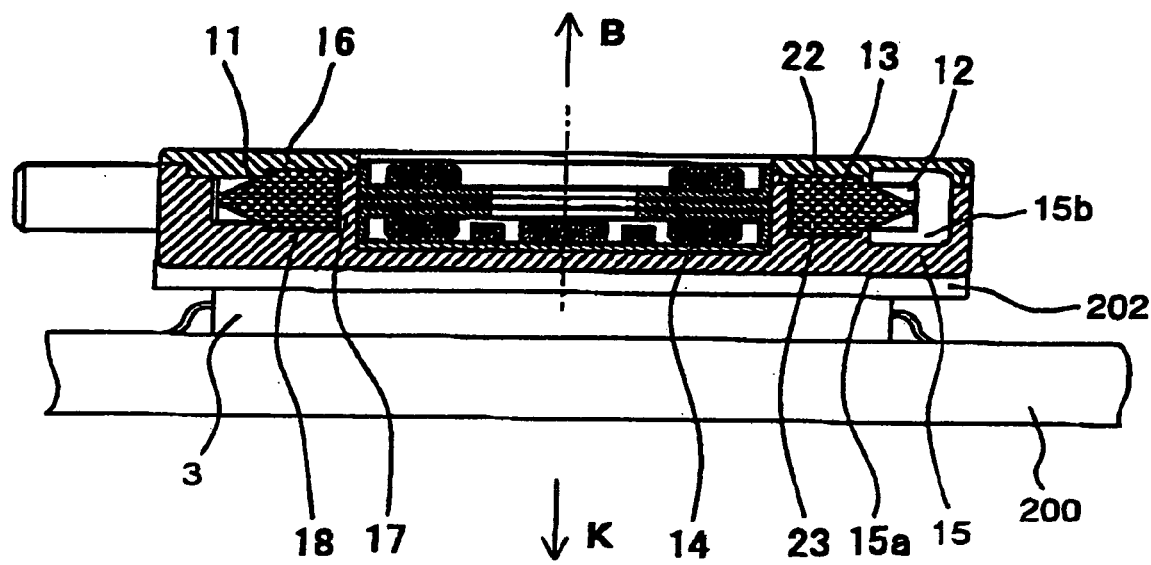
FIG. 31 is a diagram showing a mounting structure of the pump of contact heat exchanger type and the heat generating electronic component according to an embodiment of the invention.
Figure 32:
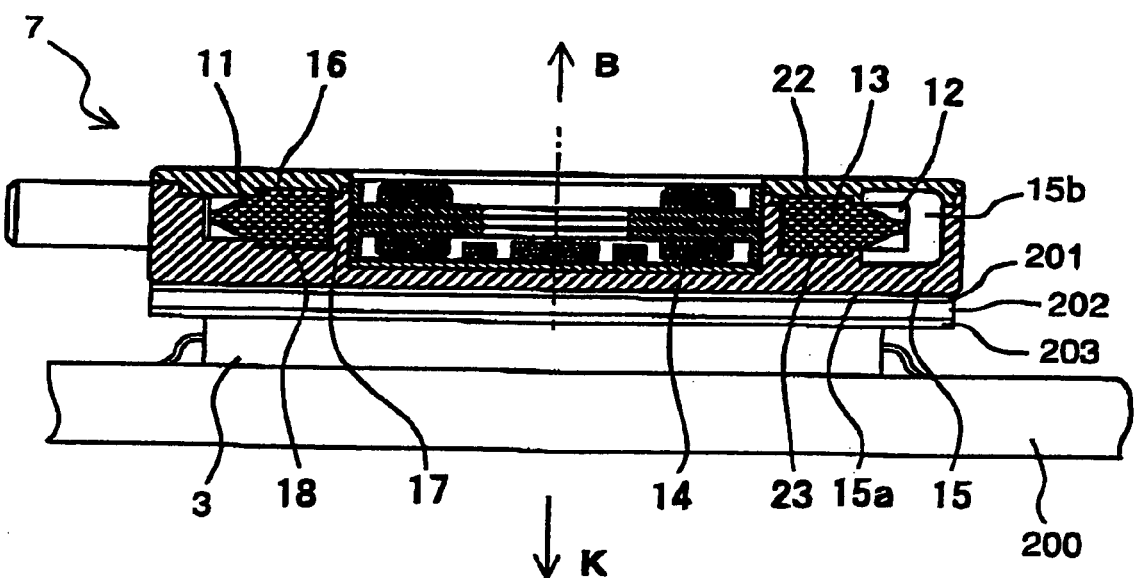
FIG. 32 is a diagram showing a mounting structure of the pump of contact heat exchanger type and the heat generating electronic component according to an embodiment of the invention.
Figure 33:
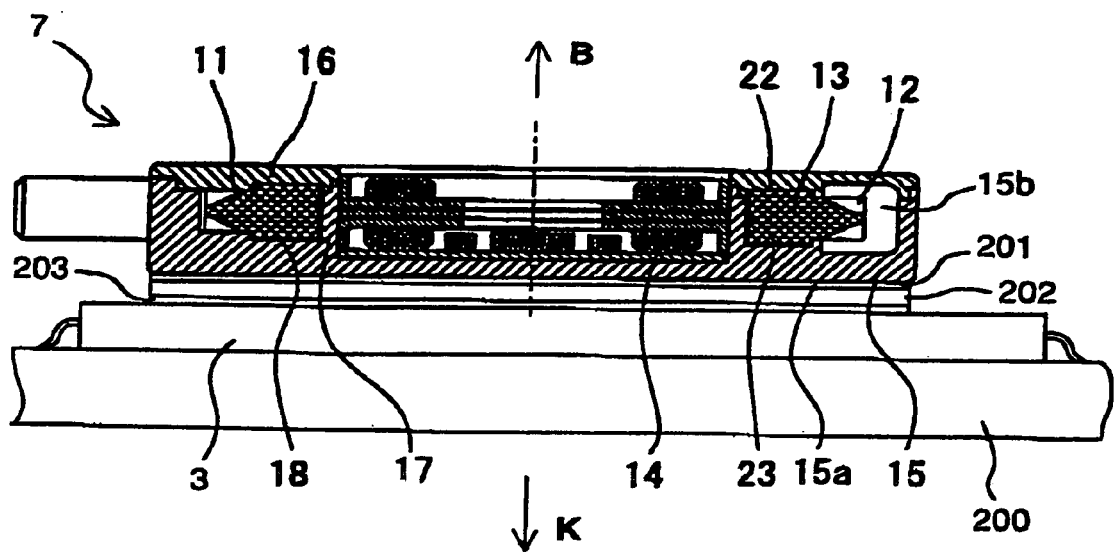
FIG. 33 is a diagram showing a mounting structure of the pump of contact heat exchanger type and the heat generating electronic component according to an embodiment of the invention.
Figure 34:
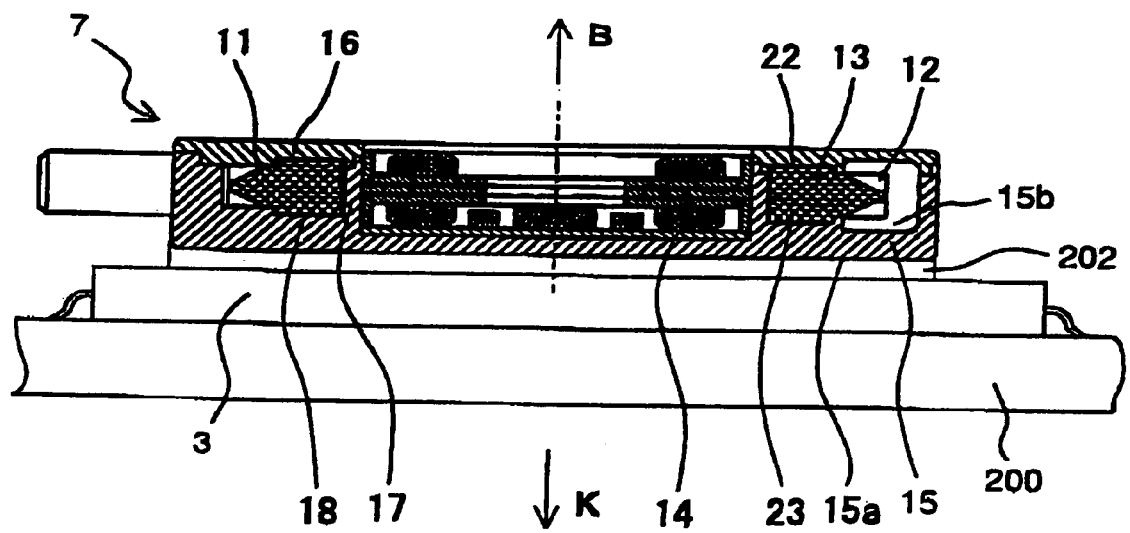
FIG. 34 is a diagram showing a mounting structure of the pump of contact heat exchanger type and the heat generating electronic component according to an embodiment of the invention.
Figure 35:
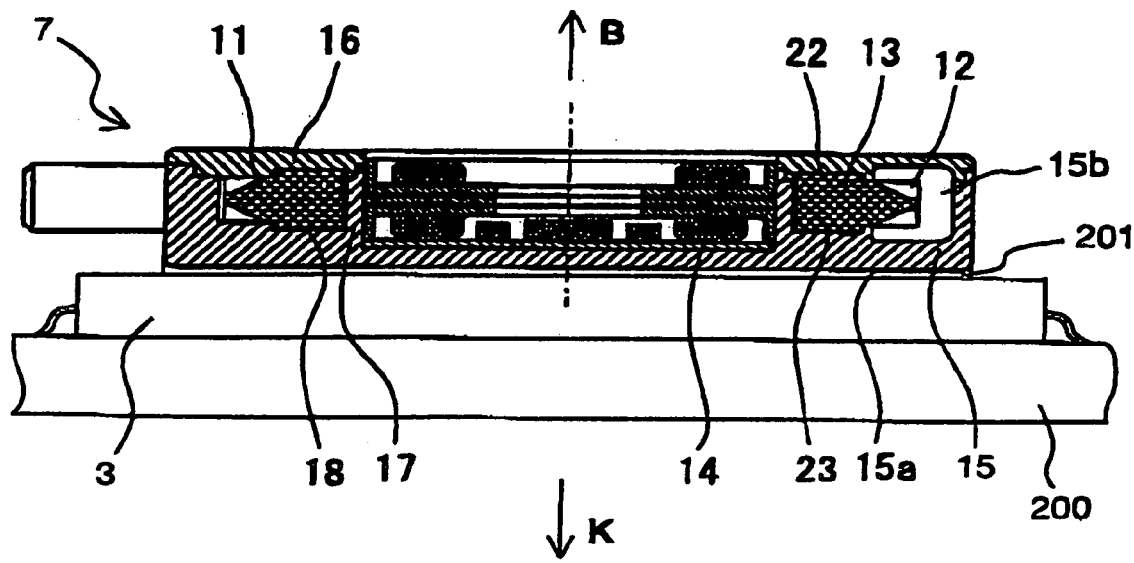
FIG. 35 is a diagram showing a mounting structure of the pump of contact heat exchanger type and the heat generating electronic component according to an embodiment of the invention.
Figure 36:
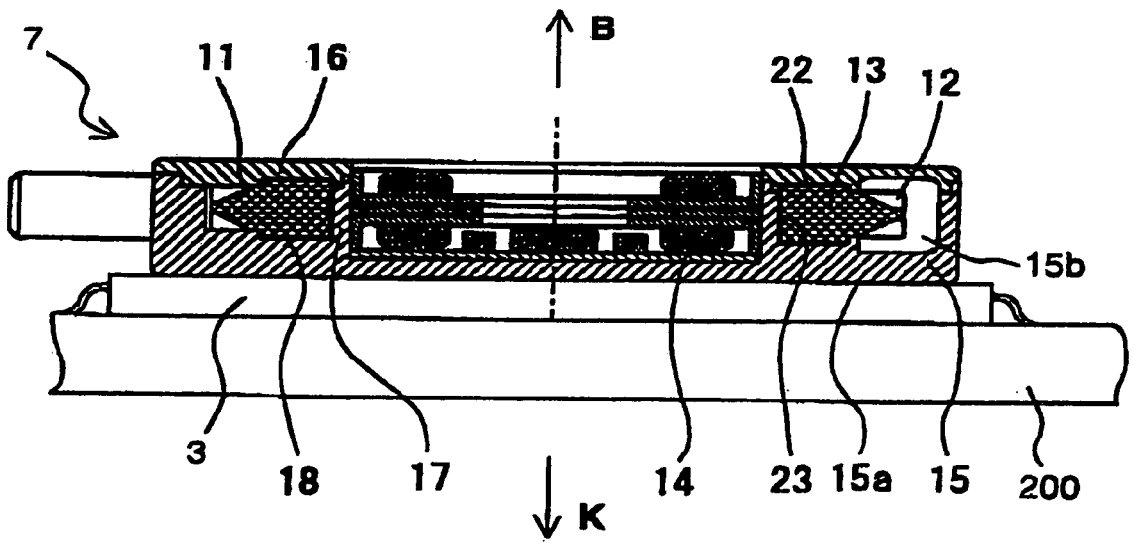
FIG. 36 is a diagram showing a mounting structure of the pump of contact heat exchanger type and the heat generating electronic component according to an embodiment of the invention.

Yet another different embodiment from that shown in FIG. 13 is shown in FIG. 16, wherein an adhesion member 203 (the same material as that of the adhesion member 201), the conductive member 202 and the adhesion member 201, in the named order from the heat generating component 3, are disposed between the heat generating component 3 and the pump of contact heat exchanger type 7. Such an arrangement can achieve an extremely high cooling efficiency because the conductive member 202 efficiently propagates the heat from the heat generating component 3 while the adhesion members 203, 201 between the respective pairs of the conductive member 202 and heat generating component 3 and of the conductive member 203 and pump 7 prevent the formation of the low heat-conduction portion such as the air layer. It is noted that a high cooling capability can be achieved if either one of the adhesion members 201, 203 is omitted.

FIGS. 17 to 20 show respective modifications of the embodiments of FIGS. 13 to 16. The embodiments of FIGS. 17 to 20 differ from those of FIGS. 13 to 16 in that the pump of contact heat exchanger type 7 protrudes from an outer edge of the heat generating component 3. According to the embodiments of FIGS. 17 to 20, the pump 7 can assuredly cover the substantially entire contact surface of the heat generating component 3 if the pump is more or less shifted from the mounting position. This negates the need for setting high mounting precisions for the pump 7 and hence, a decreased mounting time and an increased productivity result.

FIGS. 21 to 24 show respective modifications of the embodiments of FIGS. 13 to 16. The embodiments of FIGS. 21 to 24 differ from those of FIGS. 13 to 16 in that the electronic component 3 protrudes from an outer edge of the pump 7. These embodiments permit the pump 7 to be selectively mounted to a particular place of the heat generating component 3 that produces a particularly large quantity of heat. The embodiments have another advantage that the pump 7 can assuredly bring the substantially entire heat absorbing surface thereof into contact with the heat generating component 3 if the pump is more or less shifted from the mounting position. This negates the need for setting high mounting precisions for the pump 7 and hence, a decreased mounting time and an increased productivity result.

FIGS. 25 to 36 show respective modifications of the embodiments of FIGS. 13 to 24 and differ therefrom in that at least the heat generating component 3 and the pump 7 are disposed on a side of the circuit board 200 opposite from the key board 2. Since the embodiments of FIGS. 25 to 36 have the same constructions and effects as the embodiments of FIGS. 13 to 24 except for the mounting surface of the circuit board 200 and hence, the description thereof is omitted.

Figure 37:
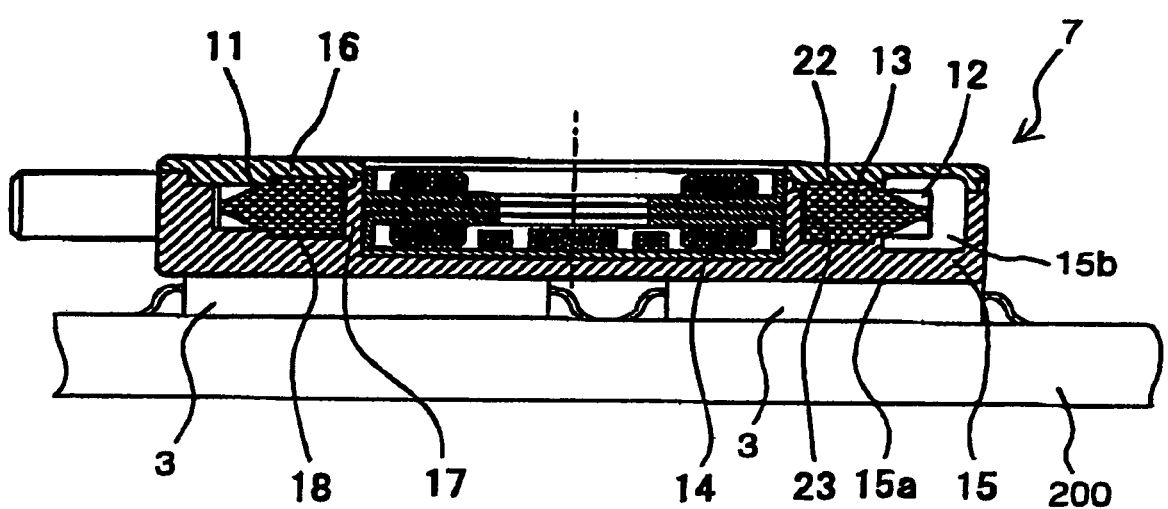
FIG. 37 is a diagram showing a mounting structure of the pump of contact heat exchanger type and the heat generating electronic component according to an embodiment of the invention.

FIG. 37 shows another embodiment. Although the embodiments of FIGS. 13 to 36 have the arrangement wherein the pump 7 is adapted to cool only one electronic component, the pump may be designed to cool a plurality of electronic components as shown in FIG. 37. In this case, the key board 2 may be located on either side.

As shown in FIG. 1, the coolant passage is extended in an area other than a space between the pump 7 and the heat generating component 3, thereby negating the need for providing a wide space between the pump 7 and the heat generating component 3. This permits the slim design of the apparatus. Where the coolant passage is extended between the pump 7 and the heat generating component 3, the reduction of flow resistance dictates the need for the wide space between the pump 7 and the heat generating component 3 and hence, the realization of the slim design is impracticable.

Third Embodiment

The internal configuration of a centrifugal pump 300 of the third exemplary embodiment is now described with reference to FIGS. 38 through 42B. An open-type impeller 301 of the centrifugal pump has a through-hole 301a formed therein and open vanes 302. A magnet rotor 303 is provided along an outer periphery of the impeller 301. A stator 304 is provided inside of the magnet rotor 303. A housing 305 of the pump accommodates the impeller 301, and restores a pressure of kinetic energy given by the impeller 301 to fluid, thus guiding the fluid to an outlet port linked to an outlet passage 310. The housing 305 has a heat-generating electronic component 400 attached thereto, such as an IC, an LSI, or an MPU.

A pump chamber 305a restores a pressure of kinetic energy given by the vanes 302, thus guiding the fluid to the outlet port. A heat-absorbing surface 305b is provided on a side face of the housing 305 along the pump chamber 305a. The heat-absorbing surface deprives the heat-generating electronic component 400 of heat through direct or indirect contact. The pump chamber 305a has a inner surface 305c. The housing 305 accommodates the impeller 301, and a housing cover 306 seals the pump chamber 305a. A fixed shaft 307 provided in the housing 305 rotatably supports the impeller 301. A bearing 308 is provided at the center of the impeller 301 installed over the fixed shaft 307. The bearing 308, when embodied as a fluid bearing, has dynamic pressure generating grooves 308a (see, FIG. 40). The pump 300 includes a water inlet 309a through which coolant is put in the pump chamber 305a, and an inlet passage 309 for introducing the coolant to the inlet port 305a. Plural recesses 311 are formed on the inner surface 305c of the pump chamber. Elastic strip-like brushes 312 scrape a boundary area of laminar flow on the inner surface 305c of the pump chamber. Similarly, elastic strip-like blades 313 scrape a boundary area of laminar flow on the inner surface 305c of the pump chamber.

The housing cover 306 and the housing 305 form a pump housing of the centrifugal pump 300. The housing 305 is made of highly heat-conductive and heat-dissipating material, i.e., at least one of copper, copper alloys, aluminum, aluminum alloys. The housing cover 306 may be made of the same material. Alternatively, the housing 305 may have a hybrid structure in which its central portion is made of copper or copper alloys, and the other portion is made of other materials, such as aluminum of aluminum alloys. The centrifugal pump of the third embodiment has a thickness of 8 to 12 mm in a direction of a rotary axis, a characteristic radial length of 25 to 60 mm, a speed of rotation of 2,000 to 3,500 rpm, a flow rate of 0.1 to 0.5 L/min, and a head of 0.2 to 0.8 m. The pump is specified as a thickness of 5 to 20 mm in thickness, a characteristic radial length of 10 to 70 mm in, a flow rate of 0.05 to 1 L/min; a head of 0.1 to 2 m. Thus the pump has a specific rate of 40 to 100 (m, m$^3$/min., rpm) and is much smaller than a conventional pump.

In the centrifugal pump 300, the impeller 301 and vanes 302 face a heat-generating electronic component 400. The heat-absorbing surface 305b has a shape corresponding to a shape of the top surface of the heat-generating electronic component 400. This construction allows the pump chamber 305a to directly receive heat via the heat-absorbing surface 305b. The stator 304 is mounted by press-fitting to the housing cover 306. The inner surface of the magnet rotor faces the outer peripheral portion of the stator 304.

The housing cover 306 is disposed between the stator 304 and the magnet rotor 303 as a separator for separating the stator and the rotor. Thus, the stator 304 is completely separated from a flow of coolant in the pump chamber 305a. According to the third embodiment, the impeller 301 and the magnet rotor 303 are unitarily formed by magnetizing a cylinder portion of the impeller forming the magnet rotor 303, however, the impeller may be separated from the magnet rotor. The rotating magnetic field generated by the stator 304 rotates the magnet rotor 303, thereby rotating the impeller 301. The rotation of the impeller 301 generates a negative pressure near the center of the impeller 301. The negative pressure causes the coolant to be sucked through the inlet passage 309 communicating with the impeller. The impeller 301 gives a kinetic momentum to the coolant for discharging it to the outside. The coolant is discharged into a coolant circuit provided at the outside of the pump 300 through the outlet port (not shown) provided in the outer peripheral portion of the impeller 301 through the outlet passage 310.

Figure 38:
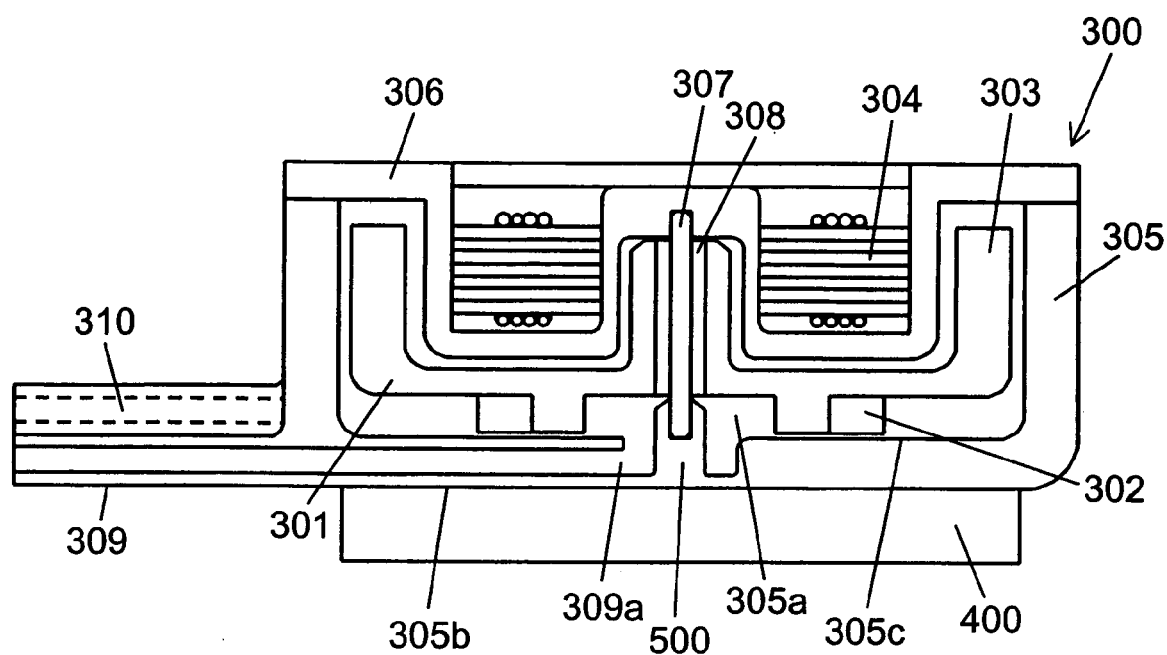
FIG. 38 is a schematic diagram of an exemplary heat-exchange-type centrifugal pump of a cooling device in accordance with a third embodiment of the invention.
Figure 39:
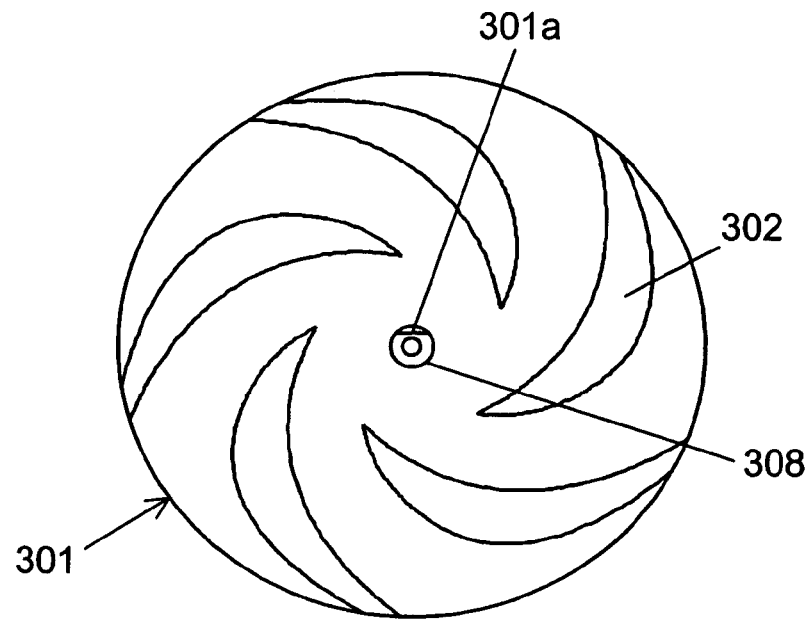
FIG. 39 is a front view of an impeller of the centrifugal pump in accordance with the third embodiment.

A bearing 308 made of low-frictional and wear-resistant ceramics is press-fitted to the center of the impeller 301. In the bearing 308, a fixed shaft 307 made of ceramics has one end fixed to the housing 305 and the other end fixed to the housing cover 306. As shown in FIG. 38, a portion of the peripheral surface of the bearing 308 is cut to provide a gap between the shaft and a hole in which the bearing of the impeller 301 is press-fitted. The gap serves as the through-hole 301a displaced from the center of the shaft, and links one side of the impeller 301 at which vanes 302 are provided to another side of the impeller oppose to the one side. The through-hole 301a causes a portion of the coolant subjected to the centrifugal force given by the impeller 301 to enter into the back side of the impeller 301. The coolant at the back side of the impeller flows into the inlet 309a in the impeller under negative pressure through the through-hole 301a. In other words, a portion of the coolant is circulated in the centrifugal pump 300. The circulated coolant is mixed at the inlet 309a and is interchanged.

The centrifugal force caused by the impeller 301 provides a negative pressure in the vicinity of the center of the impeller 301, and thus, cavitation is likely to occur there in which a bubble is generated. However, the centrifugal pump 300 of the third embodiment has a specific rate of approximately 40 to 100 (m, m$^3$/min., rpm), thus hardly generating a bubble. Even if being generated, the bubble is discharged since the coolant is mixed by the circulation. The bubble does not stay near the center of the impeller 301 since circulating coolant is interchanged between another side of the impeller 301 and a side to the inlet 309a. Even when air is mixed in the cooling device and is sucked into the centrifugal pump 300, the circulating coolant prevents air near the center of the impeller 301 and discharges the bubbles gradually. As a result, in the pump of the third embodiment, the cavitation causes little noise, and no air layers are formed. Moreover, because of the formation of turbulent flow, the coolant transfers a large amount of heat.

Figure 40:
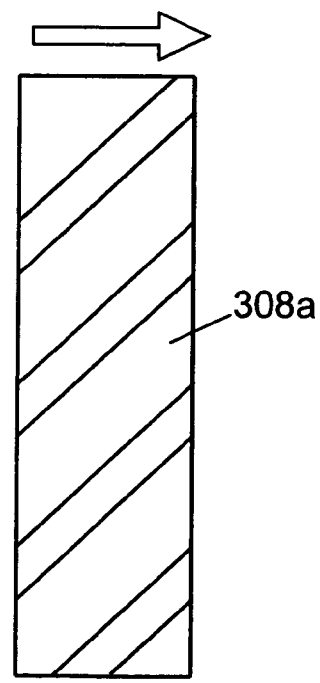
FIG. 40 shows an exemplary fluid bearing that can be utilized in the centrifugal pump in accordance with the third embodiment.

It is noted that instead of the bearing 308, a fluid bearing as shown in FIG. 40 may be used. The fluid bearing may have dynamic-pressure-generating grooves 308a formed spirally thereon for promoting the circulation, and the grooves improve the performance of discharging a bubble. The dynamic-pressure-generating grooves 308a may have a herringbone or other shapes. The impeller may have grooves formed on the back face thereof for adjusting the circulation quantity and the pressure from the back face. These grooves create a thrust in the axial direction of the impeller 301.

Figure 41:
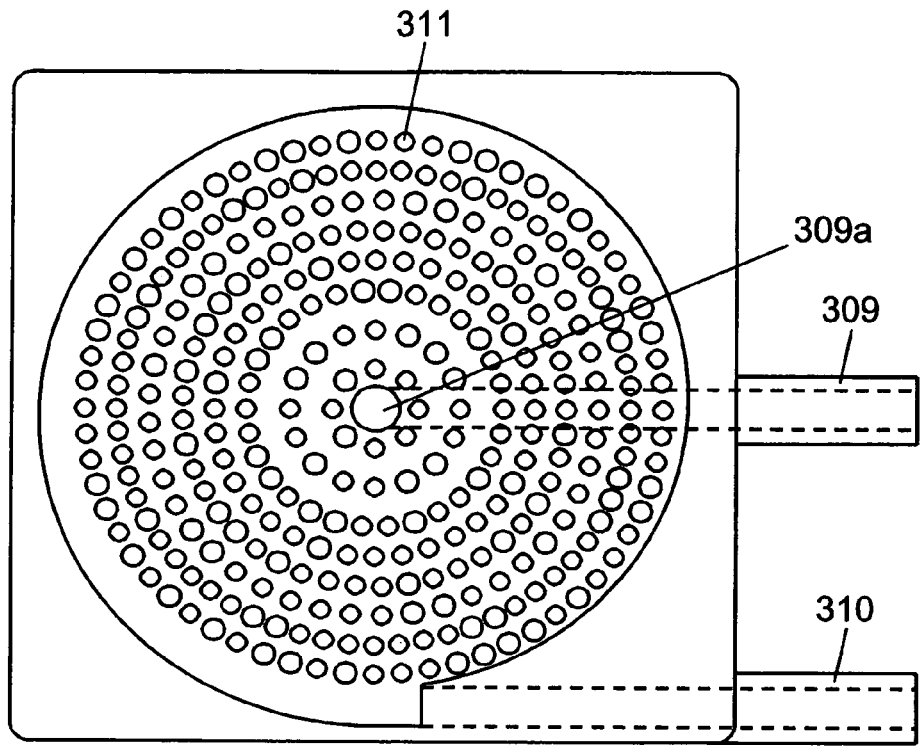
FIG. 41 is a perspective view of an inner surface of a pump chamber of the centrifugal pump in accordance with the third embodiment.
Figure 42A:
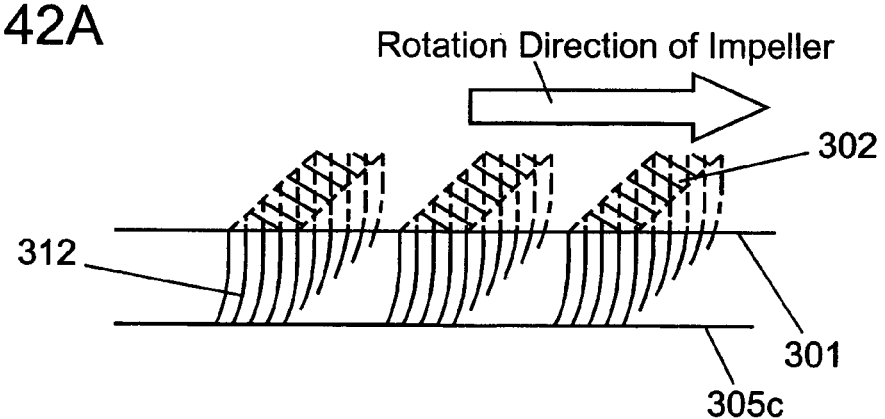
FIG. 42A illustrates brushes attached to the impeller of the centrifugal pump in accordance with the third embodiment.
Figure 42B:
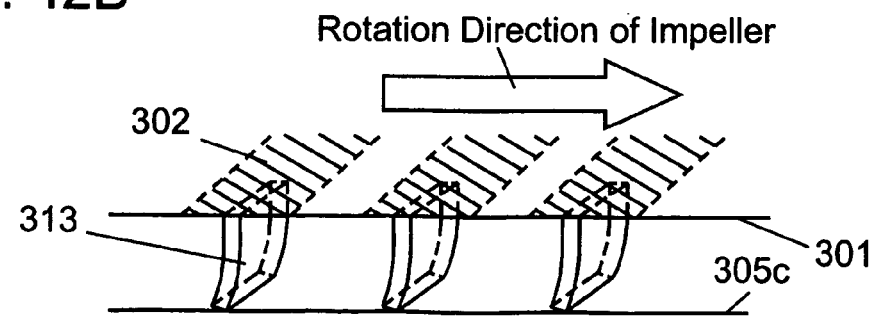
FIG. 42B illustrates blades attached to the impeller of the centrifugal pump in accordance with the third embodiment.

Additionally, as shown in FIG. 41, plural recesses 311 are formed in at least a portion of the pump chamber inner wall 305c on the back face of the heat-absorbing surface 305b where impeller 301 slide. The recesses separate the boundary layer of flow where the coolant moved by the rotation of the impeller 301 forms along the pump chamber inner wall 305c, thus making the coolant turbulent. This turbulent flow increases the amount of heat transferred from the heat-absorbing surface 305b to the coolant. Similarly, the pump chamber inner wall 305c may have asperities or roughing at its surface formed by shot peening, sand blasting, or other method can improve heat-absorbing efficiency according to a similar principle. Further, as shown in FIG. 42, brushes 312 or thin plate-like blades 313 attached not only to vanes 302 but also to the impeller in sliding contact with the pump chamber inner wall 305c break the boundary layer of flow with a rotating force of the impeller 301, thus improving the heat-absorbing efficiency. Although not shown, spiral grooves formed on the pump chamber inner wall 305c makes the coolant form turbulent flow and increases the amount of heat transferred.

Figure 43:
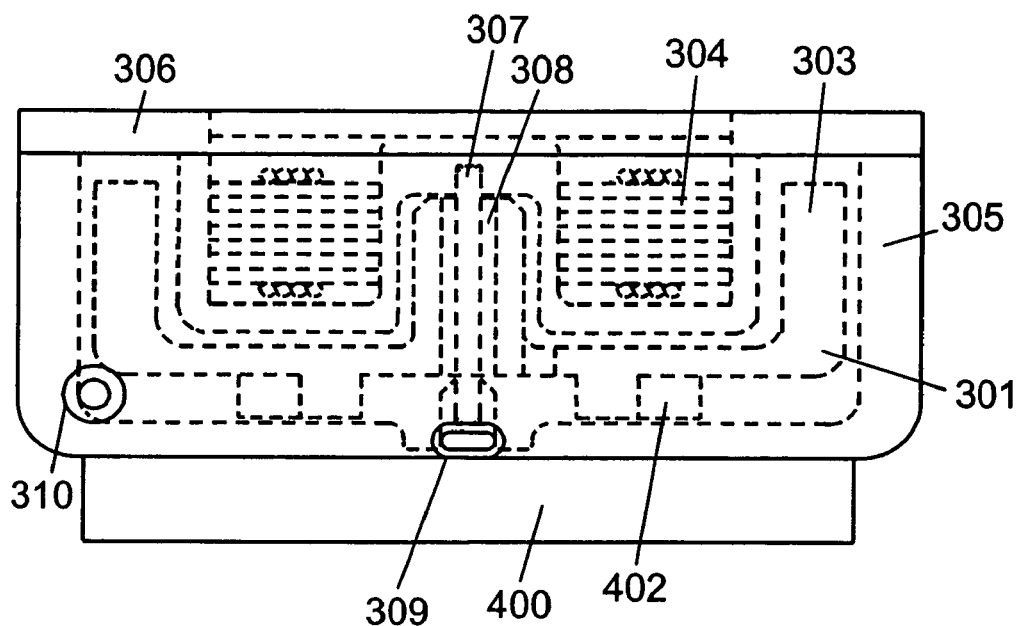
FIG. 43 is a side view of the centrifugal pump taken at line 43—43 of FIG. 38.

In cases that a heat transfer factor from the housing to the coolant is sufficiently large in comparison with heat generated, and that a large amount of heat can be transferred, the heat does not have to be spread along the pump chamber 305a. In such cases, the thickness of the heat-absorbing surface 305b of the housing 305 may be reduced for improve the heat-absorbing efficiency, and thus the pump can be thinner. For this purpose, the inlet passage 309 preferably has a section shaped like an ellipse having a minor axis in the direction of the thickness of the housing, as shown in FIG. 43. In order to increase a heat transferring area and to not prevent the impeller 301 from rotating, the pump chamber inner wall 305c may be provided with protrusions, such as protruding small columns and ribs, in at least a portion of the wall 305c where the side faces of the impeller 301 slide. The protrusions increase the heat transferring area, and allows the coolant to form more turbulent flow, thus increasing the amount of absorbed heat. The protrusions formed near the center of a heat-generating electronic component 400 increase the heat-absorbing efficiency. If the center of the heat-generating electronic component is disposed at the center of the shaft of the impeller 301, the protrusions may be provided near the center of the shaft of the impeller 301.

According to the third embodiment, coolant having a relatively low temperature that has been cooled in the coolant circuit at the outside of the pump 300 is supplied substantially to the central portion of the centrifugal pump 300 through the inlet passage 309. This arrangement provides the pump chamber 305a with a large area of the heat-absorbing surface 305b. Further, since the coolant is supplied to the pump chamber 305a as described above, the heat absorbed through the large area of the heat-absorbing surface 305b is transferred to the coolant. Thus, the resulting cooling efficiency is extremely high.

Further, the inlet passage 309 communicates substantially to the central portion of the centrifugal pump 300. The cooled coolant is first supplied substantially to the central portion of the centrifugal pump 300. Therefore, the centrifugal pump 300, upon being mounted on a heat-generating electronic component 400, the central portion of the centrifugal pump 300 to which the coolant is supplied is opposed substantially to the central portion of the heat-generating electronic component 400 having a temperature relatively higher than other portions. This arrangement improves the efficiency of cooling the heat-generating electronic component 400.

As described above, according to the third embodiment, the inlet passage 309 is provided between the pump chamber 305a and the heat-absorbing surface 305b. This construction allows the coolant to absorb the heat received by the heat-absorbing surface 305 even when the coolant flows through the inlet passage 309, thus further improving the cooling efficiency.

As described above, the centrifugal pump 300 of a cooling device of the third embodiment includes a housing 305 made of highly-heat-conductive material, and an open type impeller 301 having open vanes 302 formed thereon. Respective shapes of a heat-absorbing surface 305b and the top surface of a heat-generating electronic component 400 are three-dimensionally complementary to each other. Disposed between the heat-absorbing surface 305b and a pump chamber inner wall 305c (thick portion of the housing 305) is an inlet passage 309 having a section of an ellipse having a minor axis in the direction of the thickness. This configuration reduces the thickness of the housing near the passage, thus decreasing the temperature at the heat-absorbing surface 305b near the inlet passage 309. The inlet passage 309 does not protrude towards the heat-generating electronic component 400, and thus the shape of the heat-absorbing surface 305b is not influenced by the shape of the centrifugal pump 300. Intimate contact between the heat-absorbing surface 305b and the top surface of the heat-generating electronic component 400 enables the heat-absorbing surface 305b to effectively absorb heat.

Fourth Embodiment

A centrifugal pump according to a fourth exemplary embodiment is characterized in that a water inlet thereof is disposed on a back face of an impeller. Elements similar to those in the third embodiment are denoted by the same reference numerals, and the detailed descriptions of these elements are omitted.

Figure 44:
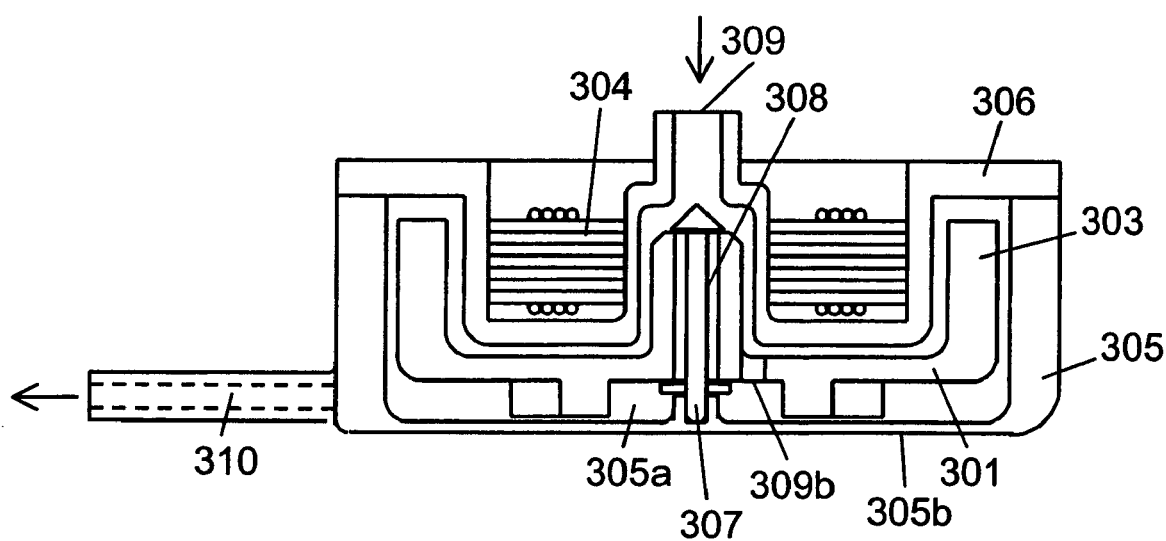
FIG. 44 is a schematic diagram of an exemplary heat-exchange-type centrifugal pump of a cooling device in accordance with a fourth embodiment of the invention.
Figure 45:
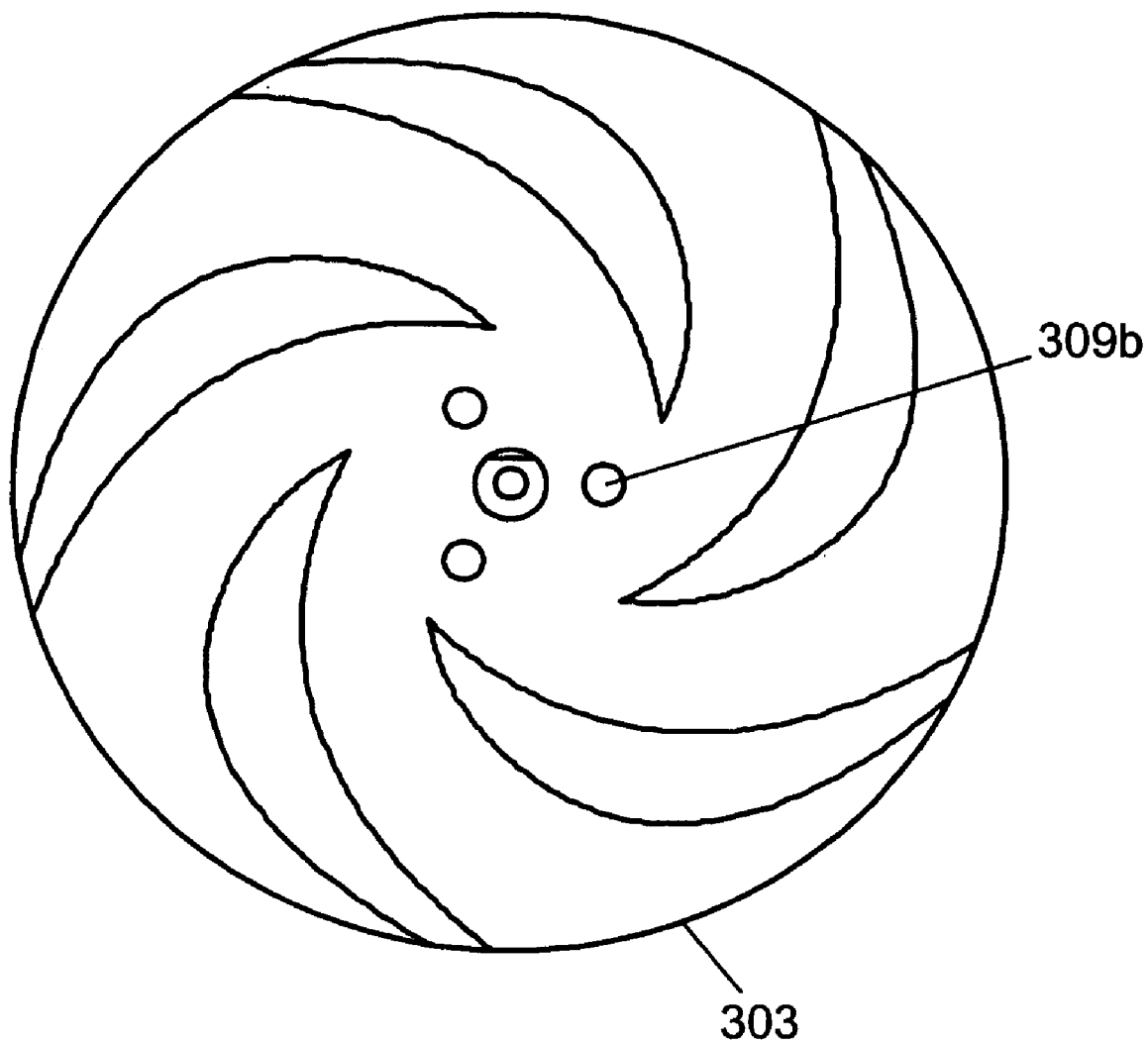
FIG. 45 is a front view of an impeller of the centrifugal pump in accordance with the fourth embodiment.

With reference to FIG. 44, a water inlet 309b in communication with an inlet passage 309 is provided near the center of an impeller 301 for providing communication between the back face and the side of a pump chamber 305a. The water inlet 309b consists of three through-holes located at the same radial from the center of the impeller by an equal interval, as shown in FIG. 45. The inlet passage 309 is provided at the center of a stator 304 in the housing cover 306 and in communication with water inlet 309b. A fixed shaft 307 and a bearing 308 are provided in a manner of the third embodiment.

The water inlet 309b of this embodiment consists of the three through-holes having circular cross-sections disposed at regular intervals. However, the number of the holes is not limited to three, and each of the holes may have a circular or square cross-section or can be shaped like a slot having an arc cross-section. The number of the through-holes is preferably thirty or less in consideration of production of the impeller. Too many through-holes or large slots weakens the impeller itself. For this reason, the number of the through-holes are preferable thirty or less. The holes, upon having slot shapes, is preferably placed around the shaft at an angle of 180° or less.

Since the inlet passage 309 is placed on the side opposite to a heat-absorbing surface 305$b$, the thickness of a pump housing 305 at the side of the heat-absorbing surface 305$b$ can be reduced. Thus, the heat transfer factor from the housing 305 to the coolant is sufficiently large in comparison with an amount of the heat generated. If a large amount of heat can be transferred, the heat is not necessarily transferred along the pump chamber 305$a$, and thus, the heat-absorbing efficiency can be increased. Additionally, the water inlet 309$b$ provided near the center of the impeller 301 allows the coolant to be sucked from the back face of the impeller 301.

Figure 46A:
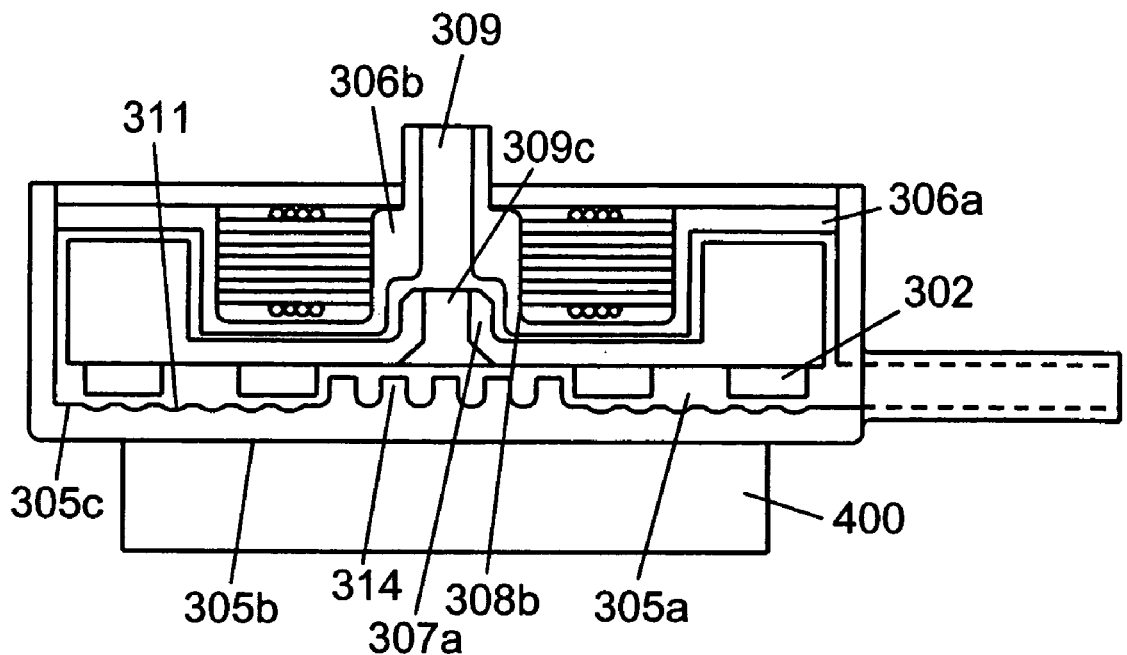
FIG. 46A shows the centrifugal pump including an impeller having a short rotating shaft in accordance with the fourth embodiment.
Figure 46B:
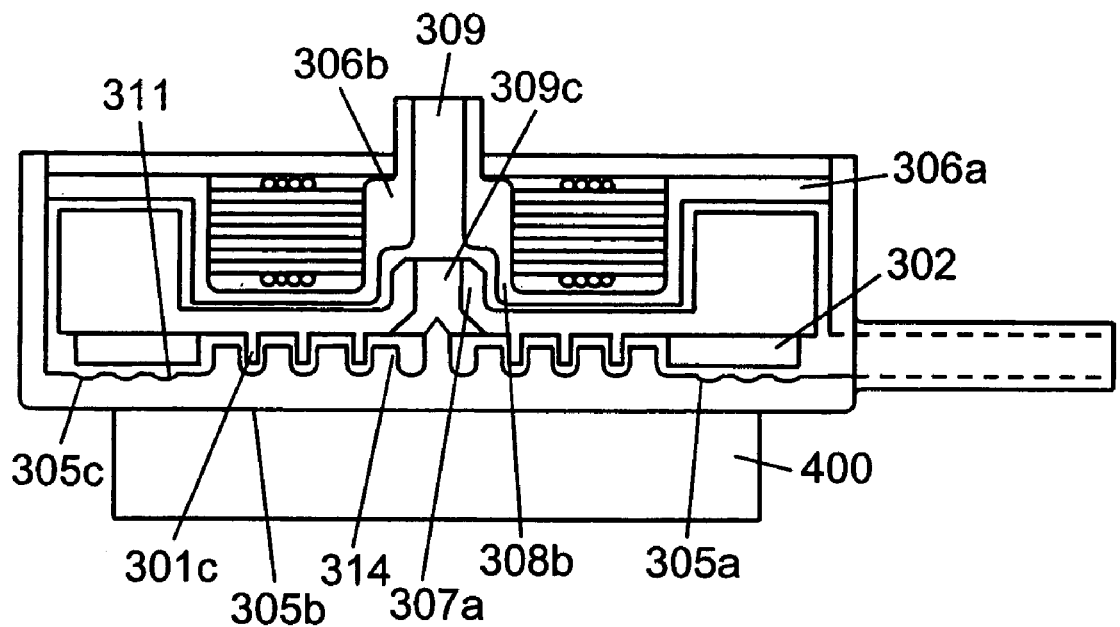
FIG. 46B shows another centrifugal pump including an impeller having a short rotating shaft in accordance with the fourth embodiment.
Figure 47:
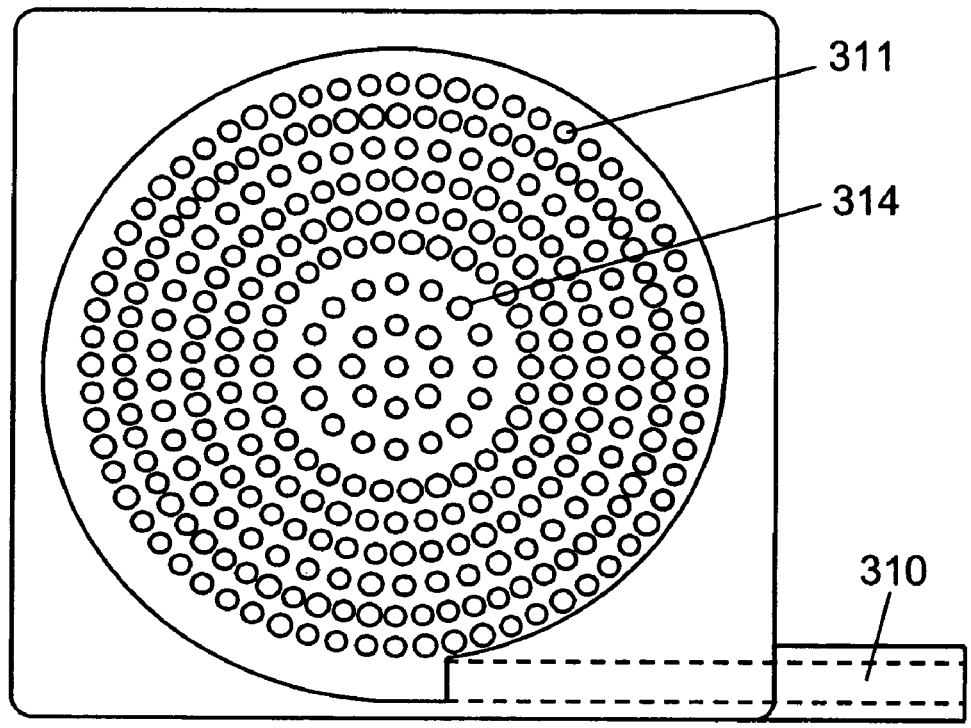
FIG. 47 is a front view of an inner wall of a pump chamber of the centrifugal pump in accordance with the fourth embodiment.

As shown in FIGS. 46A and 46B, the pump may include no fixed shaft and suck coolant from the back face of an impeller 301. In FIG. 46A, a cylinder portion 306$b$ is provided at the center of a housing cover 306$a$, and an inlet passage 309 is provided in this portion. A short rotating shaft 307$a$ is provided at the center of the impeller 301. A bearing 308$b$ is provided in the cylinder portion 306$b$. The short rotating shaft 307$b$ is inserted into the bearing for supporting the shaft. An inlet 309$c$ consists of a through-hole formed around the center of the shaft of the impeller 301. Protrusions 314, such as columns and ribs, are provided on the center of a pump chamber inner wall 305$c$ opposed to the inlet 309$c$ (see FIG. 47).

According to the fourth embodiment, the protrusions 314 are shaped like columns. However, the shapes of the protrusions are not limited to the column, and may be shaped in a prism, cone, pyramid, truncated cone or pyramid, hemisphere, and semi-ellipse. In FIG. 46B, protrusions 301$c$ are provided on the inlet side of vanes 302 or between the vanes 302.

As described above, the inlet 309$c$ provides communication between an inlet passage 309 on the back face and a pump chamber 305$a$. This arrangement allows the coolant to be sucked from the back face of the impeller 301. In addition to the suction of the coolant from the side opposite to a heat-generating electronic component 400, a jet effect of directly jetting the coolant onto a pump chamber inner wall 305$c$ provides high-efficient heat absorption.

Additionally, the protrusions 314 provided on the pump chamber inner wall 305$c$ increase the heat-absorbing area, thus drastically increasing the amount of absorbed heat. The protrusions 314 can generate turbulent flow at the pump chamber inner wall 305$c$, thus further increasing the heat-absorbing efficiency. Since the vanes 302 do not exist in the central portion of the impeller 301, the protrusions 314 can be provided easily in this portion. The center of a heat-generating electronic component 400 is often placed at the center of the impeller 301 in consideration of balance. For this reason, the protrusions 314 provided in this portion locally improve the heat-absorbing efficiency. In other words, a portion of the heat-generating electronic component 400 near the center of the impeller 301 for sucking the coolant has the highest temperature, and a difference between respective temperatures of the component and the coolant is largest; and thus, the amount of heat transfer can be increased. Additionally, the protrusions 314 provided in this portion increases the heat transfer area and reduces the heat resistance, thus transferring the heat. Further, the jet effect of the coolant improves the heat-absorbing efficiency.

The protrusions 314 allow the coolant to generate turbulent flow, thereby further improving the heat-absorbing efficiency. Instead of the protrusions 314, grooves formed in the same portion provides the similar effects.

Further, as shown in FIG. 46B, the protrusions 314 are preferably provided at the inlet side of the vanes 302 in the pump chamber 305$a$, and the protrusions 301$c$ may preferably be provided on the impeller 301 in positions that allows radial engagement of the protrusions 314 and 301$c$. It is desirable to dispose the protrusions 301$c$ spirally. In order to avoid actual contact between the protrusions 314 and 301$c$, the protrusions 314 must be radially displaced from the protrusions 301$c$ so that they are opposed but are not placed on the same concentric circles. An agitation action caused by the protrusions 301$c$ on the impeller 301 and the protrusions 314 generates the turbulent flow of the coolant on the inlet side of the vanes 302. Further, the heat dissipation area increased by the protrusions 314 remarkably improves the heat-absorption efficiency. According to experiments, a heat transfer coefficient obtained at a speed of rotation of 3,000 rpm is approx. 6,000 W/m$^2$K, at which the largest amount of heat can be dissipated from the heat-absorbing surface 305$b$ to the coolant.

Figure 48:
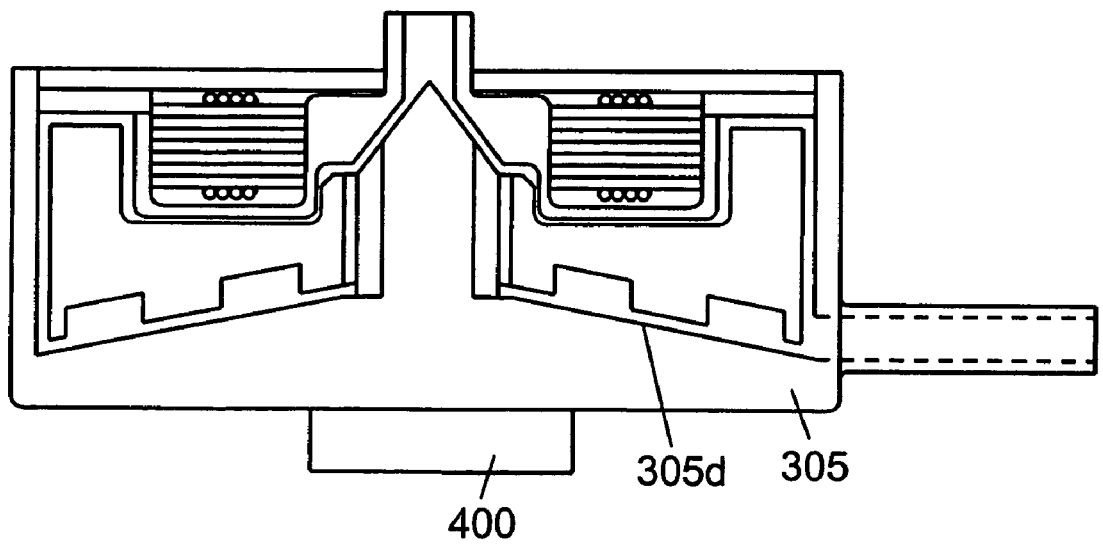
FIG. 48 is a schematic diagram of a housing of a further centrifugal pump in accordance with the fourth embodiment.

If an area where the heat-generating electronic component 400 contacts the pump housing is smaller than the area where the vanes 302 rotate and the received heat must be spread throughout the side face along the pump chamber 305$a$, a pump chamber inner wall 305$c$ having a raised central portion shown FIG. 48 contributes to improvement in the heat-absorbing efficiency more than a thin housing. In FIG. 48, as for a pump chamber inner wall 305$d$, the thickness of the housing 305 radially decreases from the center of the shaft of an impeller 301. Heat flux is likely to flow in portions having a smaller heat resistance. For example, such portions have a large sectional area through which the heat flux passes, or larger heat conductivity. Therefore, on the pump chamber inner wall 305$d$ having a radially decreasing thickness, heat can be spread to the side face along the pump chamber 305$a$.

In each pump shown in FIGS. 46A and 46B, the grooves of herringbone or other shapes formed on the inner and outer peripheral surfaces of the magnet rotor 303, and the surface of the impeller 301, allow the dynamic pressure of the fluid to hold the impeller 301. Further, the impeller 301 is rotatably supported between the bearing 308$b$ of the cylinder portion 306$b$ in the housing cover 306$a$ and the short rotating shaft 307$a$ provided at the center of the impeller 301. Therefore, such simple construction can ensure smooth and stable rotation of the impeller 301 and promote heat transfer.

Fifth Embodiment

Figure 49:
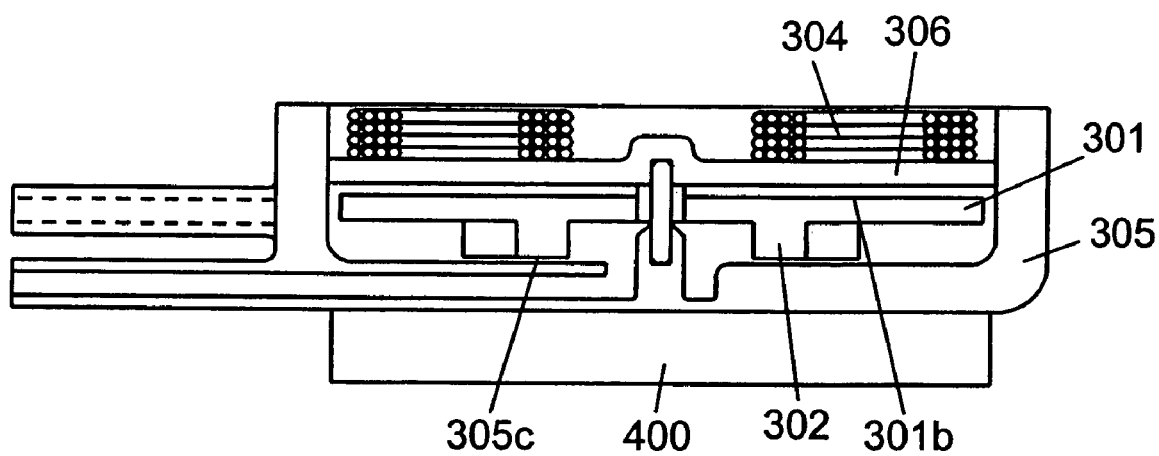
FIG. 49 is a schematic diagram of an exemplary heat-exchange-type centrifugal pump of a cooling device in accordance with a fifth embodiment of the invention.

A centrifugal pump of a fifth exemplary embodiment includes a disk-like impeller 301, and the impeller 301 is magnetized. Specifically, with reference to FIG. 49, the back face of the impeller 301 is magnetized to provide a magnet 301$b$. The magnet 301$b$ may be independent of the impeller 301 and formed by attaching a plate-like magnet to the impeller. Further, similarly to the third and fourth embodiments, in order to improve heat-absorbing efficiency, recesses and columns are formed at a pump chamber wall 305$c$. Additionally, brushes and blades can be provided on the impeller 301, or the thickness of the central portion of the housing can be increased.

As described above, the centrifugal pump 300 of the fifth embodiment is thin in the axial direction. Thus, the centrifugal pump can be mounted in small portable electronic equipment, such as a notebook computer, so as to allow a heat-generating electronic component 400 to be effectively cooled.

According to the third through fifth embodiments, the centrifugal pump 300 is preferably used. However, an axial flow type impeller can be used. As long as the above effects can be obtained, an impeller of another shape can be used.

The pumps according to the third through fifth embodiments are installed as shown in FIGS. 13 through 37. In other words, the pumps shown in FIGS. 13 through 37 can be replaced with those shown in the third through fifth embodiments.

According to the third through fifth embodiments, the area of the bearing portion, for example, a bearing portion 500 of FIG. 38, i.e. the center of rotation of the impeller 301 is preferably no more than 100 mm$^2$. If the area of the bearing portion 500 exceeds 100 mm$^2$, the pump chamber 305a is not placed in the central portion of the centrifugal pump 300, at which absorption of the heat is most desirable. This deteriorates cooling efficiency. Further, the pump does not need to include the bearing portion 500 most preferably. However, if the pump needs the bearing portion 500, the area of the bearing portion 500 is preferably at least 0.5 mm$^2$ because of the strength thereof. In this case, the pump chamber 305a exists around the bearing portion 500.

Sixth Embodiment

Figure 50:
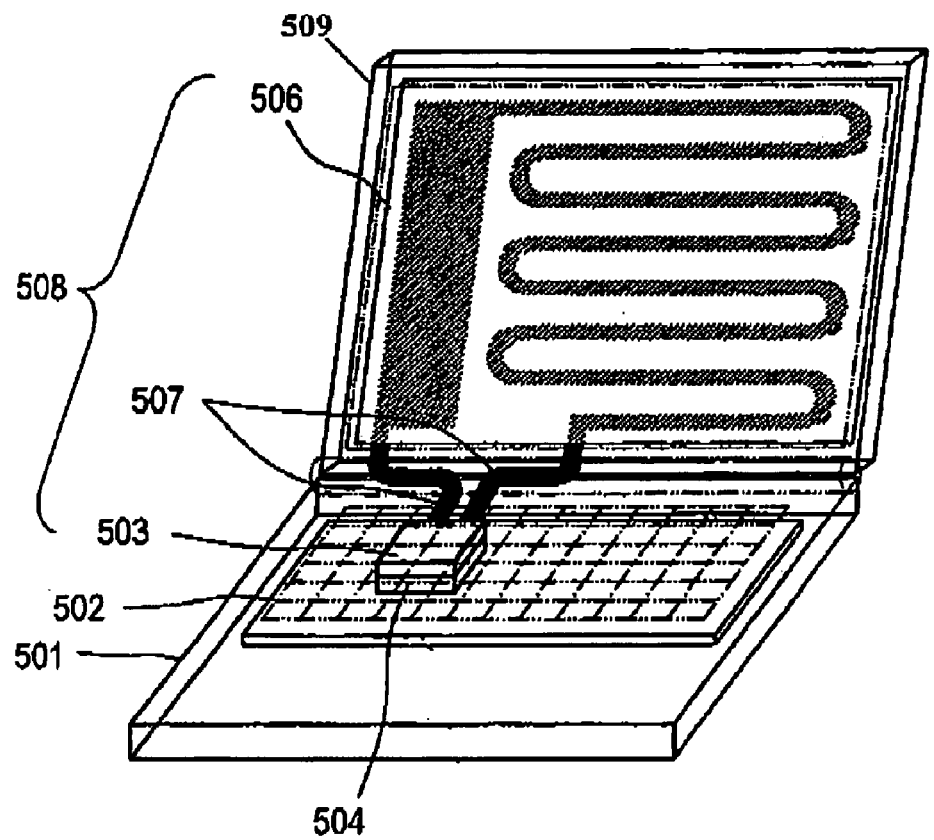
FIG. 50 is a perspective view of an electronic apparatus including a cooling device according to a sixth embodiment of the present invention.
Figure 51:
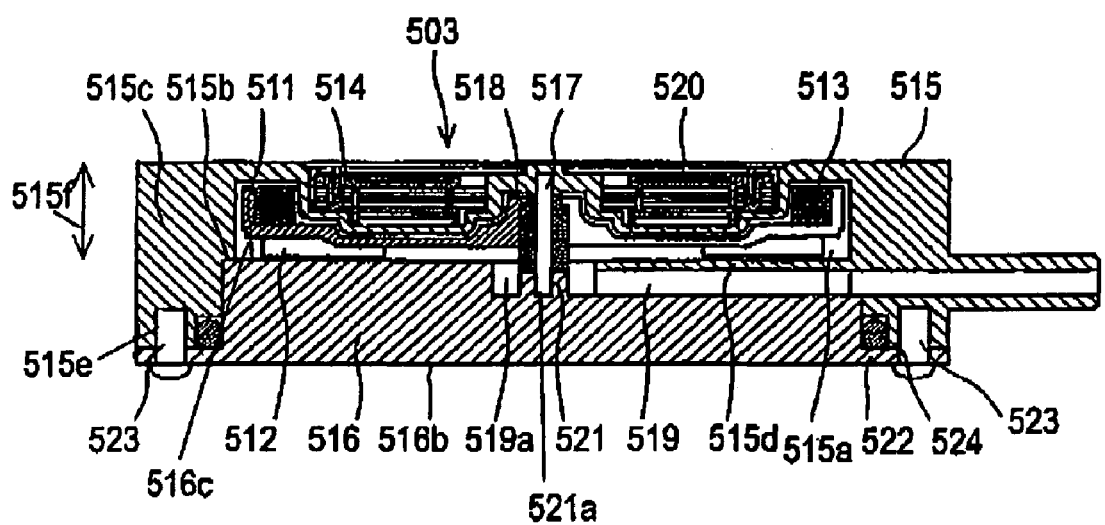
FIG. 51 is a cross sectional view of a centrifugal pump of the cooling device of the sixth embodiment.
Figure 52A:
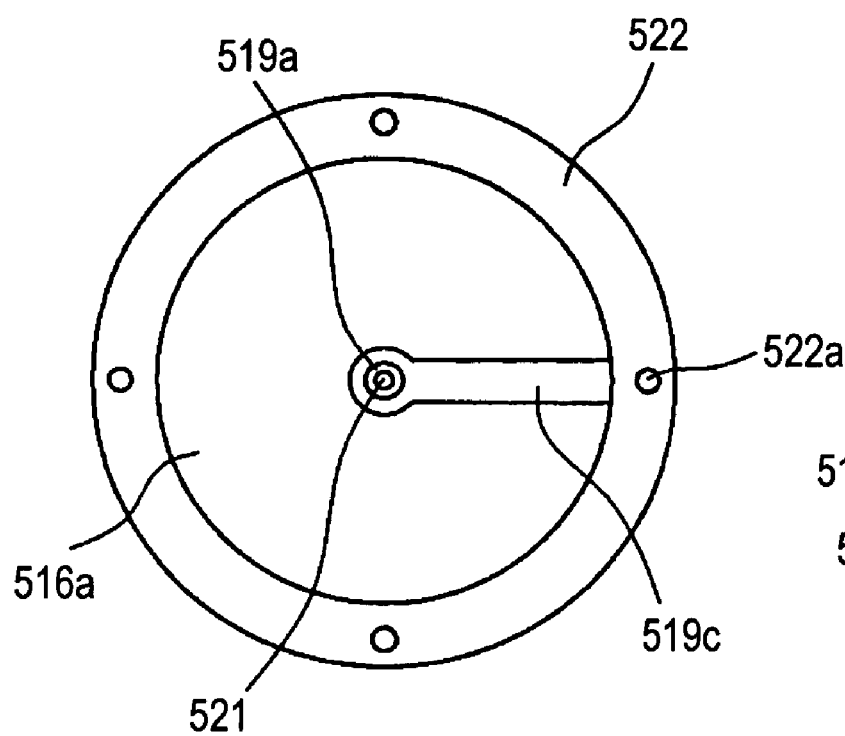
FIG. 52A is a front view of a lower case of the centrifugal pump according to the sixth embodiment.
Figure 52C:
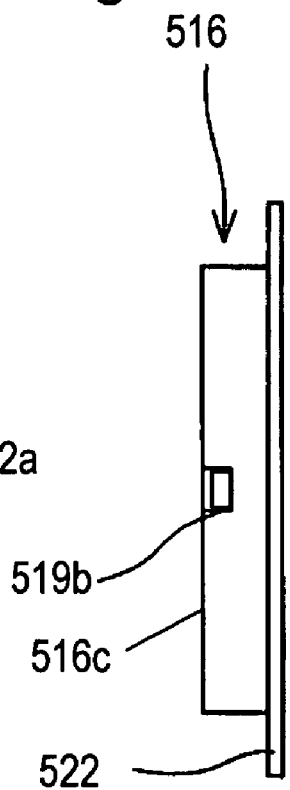
FIG. 52C is a side view of the lower case shown in FIG. 52A.
Figure 52B:
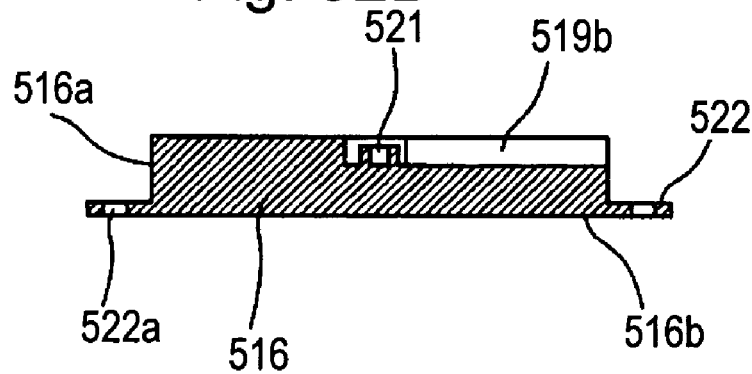
FIG. 52B is a cross sectional view of the lower case shown in FIG. 52A.

FIG. 50 is a perspective view of an electronic apparatus including a cooling device according to a sixth embodiment of the present invention. FIG. 51 is a cross sectional view of a centrifugal pump of the cooling device of the embodiment. FIG. 52A is a front view of a lower case of the centrifugal pump. FIG. 52B is a cross sectional view of the lower case shown in FIG. 52A. FIG. 52C is a side view of the lower case shown in FIG. 52A.

A notebook computer, the electronic apparatus, includes a case 501, a keyboard 502, a heat-generating electronic component 504, such as a CPU, which is a chip component having a flat upper side, a cooling device 508, and a display 509. The cooling device 508 includes a centrifugal pump 503 of contact-heat-exchanging type for exchanging heat while contacting the heat-generating electronic component 504, a radiator 506 mounted beyond the display 509 for radiating the heat received through coolant from the heat-generating electronic component 504, and a circulating passage 507 for circulating the coolant between the centrifugal pump 503 and the radiator 506. The coolant may be propylene glycol water solution and preferably doped with anti-corrosion agent since material of cases contains copper as will be described later.

The radiator 506 is made of thin sheet of highly-radiative, thermally-conductive material, such as copper or aluminum, and includes a reservoir tank and a passage provided therein for the coolant. The cooling device 508 may include a fan for forcibly air-cooling the radiator 506. The circulating passage 507 is made of flexible, less gas-permeable rubber tube, such as butyl rubber tube, for being arranged flexibly.

Internal arrangement of the centrifugal pump 503 will be described, referring to FIG. 51. The centrifugal pump 503 includes an open-type impeller 511 having vanes 512 thereon and a magnet rotor 513 provided at an inner surface along the circumference of the impeller 511. The impeller 511 may be separated from the magnet rotor 513, and arranged integral with the magnet rotor 513 to have a portion of the impeller 511 magnetized. The centrifugal pump according to the sixth embodiment has an overall thickness ranging from 3 mm to 20 mm, a typical radial width raging from 10 mm to 70 mm, a number of revolutions ranging from 600 rpm to 4000 rpm, a flow ranging from 0.01 L/min to 1.5 L/min, a pressure head of 0.1 m to 2 m, and a specific velocity of 12 to 200 (m, m$^3$/min, rpm).

A stator 514 is provided at an inner side of the magnetic rotor 513. The impeller 511 is accommodated in an upper case 515 which has an outlet port provided therein for discharging the coolant which has a pressure recovered and kinetically energized by the impeller 511. More particularly, the coolant kinetically energized, i.e., pressurized by the vanes 512 of the impeller 511 in a pump chamber 515a is discharged from the outlet port. The upper case 515 has a step portion 515b thereof engaging and positioning the upper and side surfaces at a cylindrical portion 516a of the lower case 516 (See FIGS. 52A–52C). An annular fitting portion 515c is engaged to a side surface of the cylindrical thick portion 516a and has its lower end contacting an upper surface of a flange 522. The upper case 515 has a sealing portion 515d thereof for covering a groove 519b provided in the lower case 516 from above to define an inlet passage 519. The upper case 515 of the pump chamber 515a having the impeller 511 accommodated therein seals the lower case 516. A lower surface 516b of the lower case 516 opposite to the pump chamber 515a contacts the heat-generating electronic component 504. The impeller 511 is pivotably mounted to the upper case 515 with a stationary shaft 517. More specifically, the impeller 511 is fitted at the center by a bearing 518 to the stationary shaft 517. This arrangement allows the coolant introduced from an inlet port 519a to flow to the pump chamber 515a from the inlet passage 519 extending in a radial direction of the impeller 511. An outlet passage for discharging the coolant from the pump chamber 151a extends from the pump chamber 515a in parallel with the inlet passage 519 and in the radial direction of the impeller 511. According to the sixth embodiment, the outlet passage is provided in parallel with the inlet passage 519 for reducing the overall size of the cooling device and allowing the characteristics of the pump to remain not declined. The location and arrangement of the outlet passage is not limited to that of the sixth embodiment. The lower surface (contact surface) 516a of the lower case 516 preferably has a shape matching with a shape of the upper surface of the heat-generating electronic component 4 so as to assure that the surfaces contact each other sufficiently. A CPU, the heat-generating electronic component 4, often has a flat upper surface which contacts the flat lower contact surface 516a according to the sixth embodiment.

A control circuit board 520 drives the magnetic rotor 513 in relation to the stator 514 which both compose a DC brushless motor. The lower case 516 has a shaft supporter 521 thereof provided upright in the inlet port 519a and has a pit 521a for accepting the stationary shaft 517. The flange portion 522 is provided at an annular shape along the circumference of the lower case 516 and has a uniform thickness. The upper case 515 and the lower case 516 may be joined and tightened to each other by tightening members 523, such as screws. A sealing member 524 seals between the upper case 515 and the lower case 516.

FIGS. 52A to 52C illustrate details of the lower case 516. The pump chamber 515b is defined by the cylindrical thick portion 516a of the lower case 516 together with the flange 522 and the inner surfaces of the upper case 515. The lower case 516 has a diameter slightly greater than that of the impeller 511 and is fitted into the fitting portion 515c of the upper case 515. The groove 519b provided in the lower case 516 is covered with the sealing portion 515b of the upper case 515 to define the inlet passage 519. The tightening members 523 are inserted into holes 522a provided in the flange 522 for tightening. The sealing portion 515d of the upper case 515 shuts a portion of the groove 519b so as to serve as a partition between the pump chamber 515a and the inlet passage 519.

According to the sixth embodiment, the upper surface 516c of the cylindrical thick portion 516a engages directly with the step portion 515b of the upper case 515 to determine a depth at which the lower case 516 is inserted and positioned. The positioning of the lower case 516 is not limited to this. The position of the lower case 516 may be determined by the flange 522 engaging directly the lower surface 515e of the fitting portion 515c of the upper case 515 which does not have the step portion 515b. The lower case 516 is made entirely of metallic material according to the sixth embodiment, however may have partly a metallic portion located and sized to match the heat-generating electronic component 4 for optimum transfer of heat.

A method for assembling the centrifugal pump 503 according to the sixth embodiment will be described. The stator 514 and the stationary shaft 517 are mounted to the upper case 515. The bearing 518 is mounted to the stationary shaft 517, and then, the impeller 511 having the magnet rotor 513 mounted thereon is fitted into the bearing 518. The cylindrical thick portion 516a of the lower case 516 is fitted to the upper case 515 so that the sealing portion 515d covers the groove 519b at a predetermined position to define the inlet passage 519. The upper case 515 and the lower case 516 are then joined and tightened to each other with the tightening members 523.

The centrifugal pump 503 is mounted so that the contact surface 516b of the lower case 516 contacts the heat-generating electronic component 4. Heat from the heat-generating electronic component 4 is transferred to the lower case 516 and is transferred to the coolant in the pump chamber 515a. Coolant having temperature raised with the heat is discharged from the centrifugal pump 503 by the impeller 511 rotating, and the heat is released from the radiator 6 to air. The coolant cooled down returns back along the inlet passage 519 to the pump 503.

According to the sixth embodiment, the lower case 516 is made of highly radiative, thermally conductive metallic material while the upper pump case 515 is made of resin material, such as poly-phenylene sulfide (PPS) or poly-phenylene ether (PPE), as a single piece. The metallic material of the lower case 516 may preferably be copper. The resin material of the upper case 515 may preferably be poly-phenylene sulfide because of its physical strength and its resistance to heat. Upon the lower case 516 being made of copper, the coolant may preferably be doped with anti-corrosive agent. Both the upper case 515 and the lower case 516 may be made of metallic material to have simply large transfer and radiation of heat. However, the metallic material allows an eddy current to be generated across both the cases 515 and 516 due to an operation of the magnet rotor 513, and decreases an operating efficiency of the motor. For avoiding the above drawback, the upper case 515 of the pump 503 according to the sixth embodiment, not affecting the transfer of heat, is made of resin material. More particularly, a rotation of the magnet rotor 513 across a magnetic field of the stator 514 generates a magnetic flux passing through the cases 515 and 516 and changing with time. The eddy current is thus developed in a direction to interrupt the change in the magnetic flux throughout the cases 515 and 516, thus creating a resultant eddy current loss. The upper case 515 of the pump 503 according to the sixth embodiment is made of resin material in order to suppress declination of the operating efficiency of the motor even when the eddy cunent is generated in the lower ease 516 made of copper to provide an inevitable resultant loss. The resin material prevents heat from being radiated and prevents drop of operating efficiency of the motor.

The upper case 515 and the lower case 516 of the pump 503 are made of the resin material and the metallic material, respectively, and produce a difference between thermal expansion coefficients of the cases during the transfer of heat. Metallic material generally has a thermal expansion coefficient greater than that of resin material. If the upper case 515 does not have the fitting portion 515c, stresses caused by the difference of thermal expansion is applied intensively to the tightening members 523 and loosens the members 523. This reduces effect of the sealing between the cases 515 and 516. The upper case 515 according to the sixth embodiment has the fitting portion 515c thereof located at a side of the cylindrical thick portion 516a of the lower case 516. This arrangement allows the fitting portion 515c to be close to the cylindrical thick portion 516a while being urged by the cylindrical thick portion 516a which thermally expands when a temperature increases. Accordingly, the tightening members 523 remain free from any unwanted stress, hence permitting no leakage of the coolant. The fitting portion 515c has an inner surface receiving a thermal expansion stress substantially uniformly along a height direction from the cylindrical thick portion 516a. This prevents the tightening members 523 from being loosened to develop an air gap, and thus reduce an area where the contact surface 516b contact the heat-generating electronic component 4, hence ensuring the transfer of heat.

The upper case 515 has an intricate shape, providing the pump chamber 515a and the sealing portion 515d provided in its interior, and it is difficult to process the metallic material to provide the case 515. The upper case 515 according to the sixth embodiment is made of the resin material and can thus be processed easily. Since the centrifugal pump 503 intakes the coolant from below the pump chamber 515a, the inlet passage 519 is provided towards the lower case 516. Further, connection ports are necessary for connecting with external conduits, its difficult to process the upper case 515. According to the sixth embodiment, the inlet passage 519 is defined by the groove 519b in the lower case 516 and the sealing portion 515b of the upper case 515. This structure allows the upper case 515 and the lower case 516 to be fabricated separately as two pieces. In order to reduce a size or a thickness of the pump 503, the inlet passage 519 and the pump chamber 515a are processed precisely. The upper case 515 is made of resin material and can be processed easily and accurately by a known molding technique. Including a case is formed of a combination of the upper case 515 and the lower case 516, the pump 503 has a simple structure and can be assembled easily.

Figure 53A:
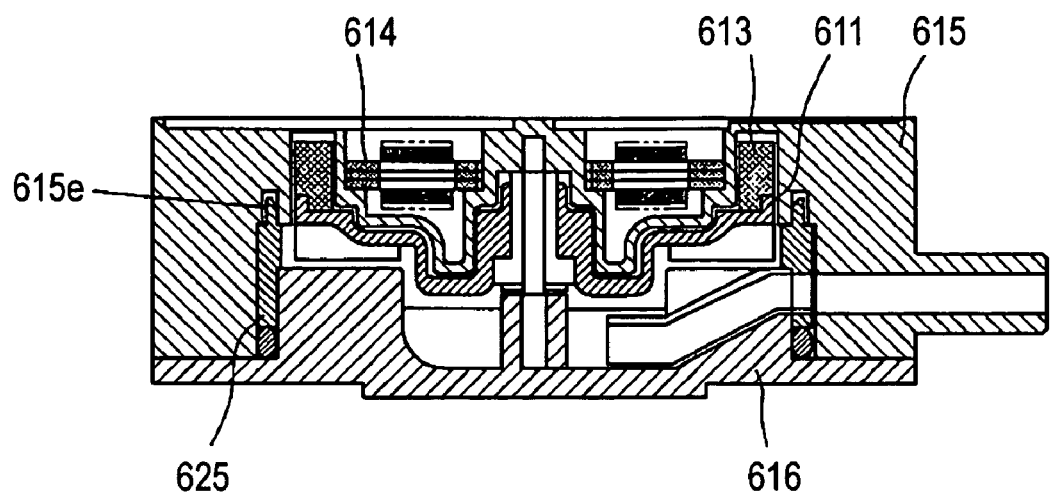
FIG. 53A is a cross sectional view of another centrifugal pump including a sealing member according to the sixth embodiment.
Figure 53B:
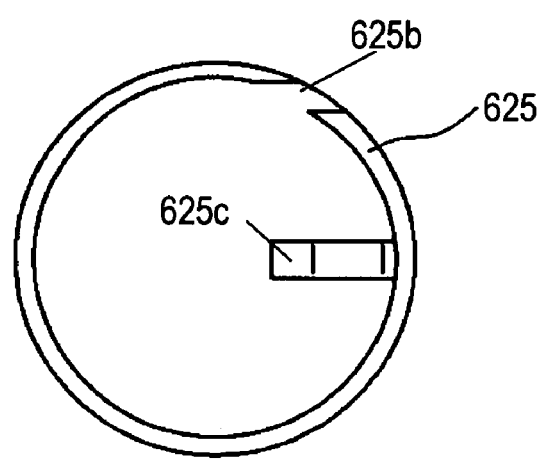
FIG. 53B is a front view of the sealing member shown in FIG. 53A.

According to the sixth embodiment, the sealing portion 515d of the upper case 515 constructs a sealing arrangement together with the groove 519b for sealing between the pump chamber 515a and the inlet passage 519 to allow no leakage of the coolant. The sealing arrangement is not limited to the above construction. FIG. 53A is a cross sectional view of another centrifugal pump according to the sixth embodiment. FIG. 53B is a front view of a sealing member used in the centrifugal pump shown in FIG. 53A. The upper case 615 has a holder portion 615e thereof. The sealing member, a cylindrical member 625, has a sealing strip 625c thereof for covering a groove 619b. The cylindrical member 625 has a notch 625b provided in an upper end thereof for providing as an opening communicating between the pump chamber 615a and the discharge passage. The cylindrical member 625 for sealing is fitted on the holder portion 615e and the fitting portion 615c of the upper case 615 and the side surface of cylindrical thick portion 616a of the lower case 615. The groove 619b is sealed with the sealing strip 625c of the cylindrical member 625 to form inlet passage 619. This allows the upper case 615 to have the holding portion 615e but not the sealing portion 515d shown in FIG. 51 which is replaced by the sealing strip 625c of the cylindrical member 625 for developing the inlet passage 619. The sealing member 625 functions as a partition to define the inlet passage 619.

Figure 54:
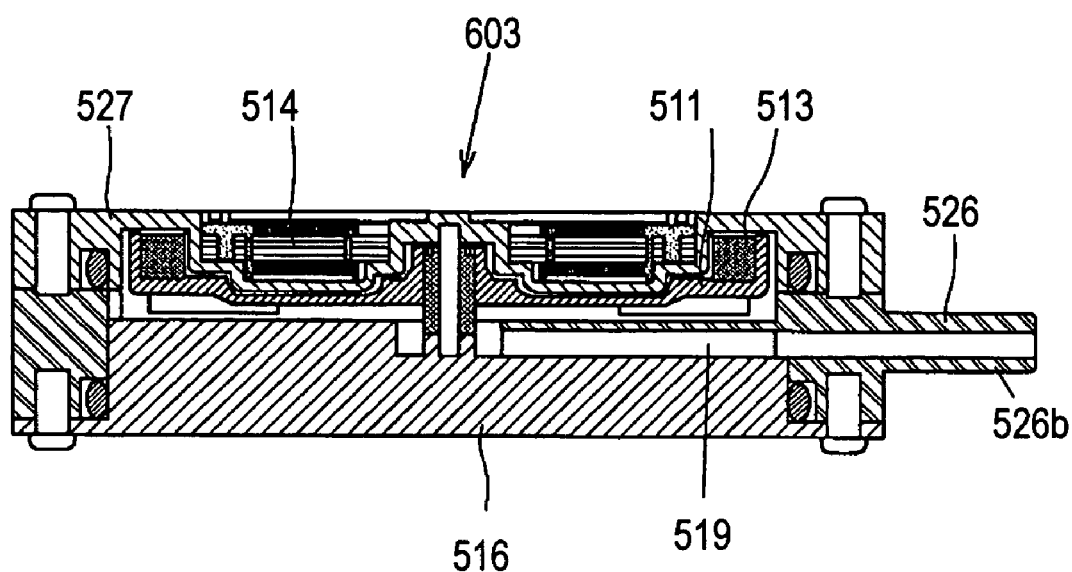
FIG. 54 is a cross sectional view of a further centrifugal pump according the sixth embodiment.

According to the sixth embodiment 6, the upper case 515 and the lower case 516 are fabricated separately as two pieces for being assembled easily for the transfer of heat. However, the upper case 515 and/or the lower case 516 is composed of plural segments. This can particularly increase the freedom of designing. In particular, the upper case 515 may be composed of two separate segments since including connecting ports having intricate shapes. FIG. 54 is a cross sectional view of a centrifugal pump 603 composed of three separated segments.

As shown in FIG. 54, a connection case 526 is coupled with the lower case 516 and has connecting ports 526a to communicate circulating passage with an external inlet tube and an external outlet tube (not shown). An upper case 527 is coupled with the connection case 526 for covering the back side of the impeller 511 at the opposite end of the inlet port 519a. The upper case 527, the lower case 516, and the connection case 526 are assembled to construct the case of the centrifugal pump 603. The connection case 526 may be made of resin material for forming the inlet passage 519 and the connecting ports 526a. The upper case 527 is made of resin material and can thus be shaped and assembled more easily than the single-piece upper case 515 shown in FIG. 51.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A cooling device for cooling a heat-generating component, said cooling device comprising:
   a circulating passage arranged to have coolant circulate therein;
   a centrifugal pump, which connects to said circulating passage, for absorbing heat from said heat-generating component and for causing said coolant to move in said circulating passage; and
   a radiator, which is disposed on the circulating passage, for radiating heat from the coolant, wherein
   said centrifugal pump comprises a first case made of metallic material, a second case made of resin material, and a motor,
   a first face of said first case and a second face of said second case forms a pressure chamber therebetween,
   a third face of said first case has a portion to contact said heat-generating component, and
   said motor is arranged on a fourth surface of said second case.

2. The cooling device according to claim 1,
   wherein the first case made of the metallic material is formed integrally with a portion of an inlet passage arranged to introduce the coolant into the pump chamber, and
   wherein the second case made of the resin material is shaped integrally with another portion of the inlet passage and an outlet port, the outlet port being arranged to discharge the coolant from the pump chamber.

3. The cooling device according to claim 2,
   wherein the portion of the inlet passage comprises a side of the inlet passage, and the first case has a groove provided therein to define the side, and
   wherein the another portion of the inlet passage shuts the groove and seals between the pump chamber and the inlet passage.

4. The cooling device according to claim 3, wherein the another portion of the inlet passage is included in the second case.

5. The cooling device according to claim 3, further comprising a sealing member provided separately from the second case and shutting the groove, wherein the second case has a holding portion for holding the sealing member.

6. The cooling device according to claim 1, further comprising a tightening member,
   wherein the first case has a cylindrical thick portion defining an inner wall of the pump chamber and has a flange portion provided along a circumference of the cylindrical thick portion,
   wherein the second case has a fitting portion engaging with the cylindrical thick portion of the first case, and
   wherein the tightening member tightens the flange portion to the fitting portion.

7. The cooling device according to claim 6, wherein the second case has a step portion provided at the fitting portion, the step portion engaging with the cylindrical thick portion of the first case and positioning the cylindrical thick portion.

8. The cooling device according to claim 1, wherein the first case is composed of a plurality of segments separate from each other.

9. The cooling device according to claim 1, wherein the second case is composed of a plurality of segments separate from each other.

10. A cooling device for cooling a heat-generating component said cooling device comprising:
    a circulating passage arranged to circulate coolant therein; and
    a centrifugal pump, which connects to said circulating passage, for absorbing heat from said heat-generating component and for causing said coolant to move in said circulating passage,
    wherein said centrifugal pump comprises a first case made of metallic material, a second case made of resin material, and a motor,
    said first case and said second case cooperate to form a pressure chamber therebetween, and
    said first case has a portion to contact said heat-generating component and said second case holds said motor.

* * * * *